(12) United States Patent
Gundel et al.

(10) Patent No.: US 12,111,345 B2
(45) Date of Patent: *Oct. 8, 2024

(54) ELECTRICAL POWER CABLE MONITORING DEVICE INCLUDING PARTIAL DISCHARGE SENSOR

(71) Applicants: 3M Innovative Properties Company, St. Paul, MN (US); Connected Intelligence Systems Ltd., Netanya (IL)

(72) Inventors: Douglas B. Gundel, Cedar Park, TX (US); Eyal Doron, Caesarea (IL); Lior Embon, Binyamina (IL); Udi Blich, Ichud (IL)

(73) Assignees: 3M Innovative Properties Company, St. Paul, MN (US); Connected Intelligence Systems Ltd., Netanya (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/161,744

(22) Filed: Jan. 30, 2023

(65) Prior Publication Data

US 2023/0176106 A1 Jun. 8, 2023

Related U.S. Application Data

(63) Continuation of application No. 17/273,936, filed as application No. PCT/US2019/049805 on Sep. 5, 2019, now Pat. No. 11,604,218.

(Continued)

(51) Int. Cl.
| | | |
|---|---|---|
| *G01R 31/12* | (2020.01) | |
| *G01R 31/58* | (2020.01) | |
| *H02G 1/14* | (2006.01) | |

(52) U.S. Cl.
CPC ........ *G01R 31/1272* (2013.01); *G01R 31/58* (2020.01); *H02G 1/14* (2013.01)

(58) Field of Classification Search
CPC ............... G01R 31/12; G01R 31/1272; G01R 31/1245; G01R 31/58; G01R 23/09;
(Continued)

(56) References Cited

U.S. PATENT DOCUMENTS

| | | |
|---|---|---|
| 4,301,399 A | 11/1981 | Miller et al. |
| 4,321,643 A | 3/1982 | Vernier |

(Continued)

FOREIGN PATENT DOCUMENTS

| | | |
|---|---|---|
| CH | 641278 A5 | 2/1984 |
| CN | 1111754 A | 11/1995 |

(Continued)

OTHER PUBLICATIONS

First Office Action and Search Report, and translation thereof, from counterpart Chinese Application No. 201980059173.1, dated Jan. 28, 2022, 19 pp.

(Continued)

*Primary Examiner* — Son T Le
(74) *Attorney, Agent, or Firm* — Shumaker & Sieffert, P.A.

(57) ABSTRACT

Techniques, systems and articles are described for monitoring electrical equipment of a power grid and predicting likelihood failure events of such electrical equipment. In one example, a cable accessory is configured to couple to an electrical power cable and includes a partial discharge sensor and a communications unit. The partial discharge sensor is configured to detect partial discharge events and output data indicative of the partial discharge events. The communications unit is configured to output event data based at least in part on the partial discharge data.

19 Claims, 25 Drawing Sheets

Related U.S. Application Data

(60) Provisional application No. 62/729,363, filed on Sep. 10, 2018.

(58) Field of Classification Search
CPC ........ G01R 31/52; G01R 31/66; G01R 15/06; G01R 15/16; H02G 1/14; H02G 15/08
See application file for complete search history.

(56) References Cited

U.S. PATENT DOCUMENTS

| | | |
|---|---|---|
| 4,424,480 A | 1/1984 | Stefan |
| 5,323,117 A | 6/1994 | Endoh et al. |
| 5,502,374 A | 3/1996 | Cota |
| 5,617,859 A | 4/1997 | Souza et al. |
| 5,756,972 A | 5/1998 | Vranicar et al. |
| 5,892,430 A | 4/1999 | Wiesman et al. |
| 6,617,859 B1 | 9/2003 | Orton |
| 6,734,662 B1 | 5/2004 | Fenske |
| 6,810,496 B1* | 10/2004 | Vittal ............... H04L 41/0681 709/224 |
| 7,166,804 B2 | 1/2007 | Yumura et al. |
| 8,643,380 B1 | 2/2014 | Herbert |
| 9,917,434 B2 | 3/2018 | George et al. |
| 10,192,678 B2 | 1/2019 | Koo et al. |
| 10,338,103 B2 | 7/2019 | Gravermann et al. |
| 2003/0214307 A1* | 11/2003 | Kang ............... G01R 31/1272 324/536 |
| 2008/0048710 A1* | 2/2008 | Cern ............... G01R 31/1272 324/536 |
| 2010/0308797 A1 | 12/2010 | Zimmermann |
| 2011/0218790 A1 | 9/2011 | Algaonkar et al. |
| 2012/0199392 A1 | 8/2012 | Samuelson et al. |
| 2012/0203493 A1* | 8/2012 | Dobson ............... H01B 7/0009 174/126.1 |
| 2012/0268106 A1 | 10/2012 | Blake, Jr. et al. |
| 2012/0306510 A1 | 12/2012 | White et al. |
| 2014/0368215 A1 | 12/2014 | Hoffman et al. |
| 2015/0120218 A1 | 4/2015 | Garnacho Vecino et al. |
| 2015/0229115 A1 | 8/2015 | George et al. |
| 2016/0091533 A1 | 3/2016 | Soleillant et al. |
| 2016/0139181 A1 | 5/2016 | Gravermann et al. |
| 2017/0222420 A1 | 8/2017 | Dhlamini |
| 2017/0234908 A1 | 8/2017 | Gravermann et al. |
| 2018/0017611 A1 | 1/2018 | Radun et al. |
| 2018/0062370 A1 | 3/2018 | Heidmann et al. |
| 2018/0238955 A1 | 8/2018 | Bango et al. |
| 2018/0252760 A1 | 9/2018 | Andle et al. |
| 2019/0128927 A1 | 5/2019 | Shaw et al. |
| 2019/0293706 A1 | 9/2019 | Sohn et al. |
| 2019/0369152 A1 | 12/2019 | Fallet et al. |
| 2021/0190850 A1 | 6/2021 | Gundel et al. |
| 2021/0311131 A1 | 10/2021 | Gundel et al. |
| 2021/0344184 A1 | 11/2021 | Gundel et al. |

FOREIGN PATENT DOCUMENTS

| | | |
|---|---|---|
| CN | 1161763 A | 10/1997 |
| CN | 1601659 A | 3/2005 |
| CN | 101666849 A | 3/2010 |
| CN | 102116824 A | 7/2011 |
| CN | 102313861 A | 1/2012 |
| CN | 102944777 A | 2/2013 |
| CN | 202978201 U | 6/2013 |
| CN | 103339813 A | 10/2013 |
| CN | 104407270 A | 3/2015 |
| CN | 204256093 U | 4/2015 |
| CN | 104849628 A | 8/2015 |
| CN | 105043457 A | 11/2015 |
| CN | 105277856 A | 1/2016 |
| CN | 204988364 U | 1/2016 |
| CN | 205175574 U | 4/2016 |
| CN | 205263241 U | 5/2016 |
| CN | 105629136 A | 6/2016 |
| CN | 105699860 A | 6/2016 |
| CN | 205509462 U | 8/2016 |
| CN | 106124948 A | 11/2016 |
| CN | 205719288 U | 11/2016 |
| CN | 106353648 A | 1/2017 |
| CN | 206038828 U | 3/2017 |
| CN | 106646156 A | 5/2017 |
| CN | 106771933 A | 5/2017 |
| CN | 206147041 U | 5/2017 |
| CN | 106855443 A | 6/2017 |
| CN | 106855605 A | 6/2017 |
| CN | 106950477 A | 7/2017 |
| CN | 106980075 A | 7/2017 |
| CN | 108376884 A | 8/2018 |
| DE | 2928727 A1 | 2/1981 |
| DE | 3025819 A1 | 2/1982 |
| DE | 3702735 A1 | 8/1988 |
| DE | 102011079935 A1 | 1/2013 |
| EP | 2472688 A2 | 7/2012 |
| EP | 2579055 A1 | 4/2013 |
| EP | 2806277 A1 | 11/2014 |
| EP | 2818881 A1 | 12/2014 |
| EP | 3002594 A1 | 4/2016 |
| EP | 3109958 A1 | 12/2016 |
| EP | 3182428 A1 | 6/2017 |
| FR | 2928740 A1 | 9/2009 |
| GB | 2288696 A | 10/1995 |
| JP | S60256068 A | 12/1985 |
| JP | H03273809 A | 12/1991 |
| JP | H04215076 A | 8/1992 |
| JP | 10201070 A | 7/1998 |
| JP | H10201070 A | 7/1998 |
| KR | 101317476 B1 | 10/2013 |
| KR | 101847456 B1 | 4/2018 |
| KR | 101874286 B1 | 8/2018 |
| WO | 9840756 | 9/1998 |
| WO | 0042444 | 7/2000 |
| WO | 2012130816 A1 | 10/2012 |
| WO | 2014129817 A1 | 8/2014 |
| WO | 2015179102 A1 | 11/2015 |
| WO | 2016058721 A1 | 4/2016 |
| WO | 2016088174 A1 | 6/2016 |
| WO | 2016088175 A1 | 6/2016 |
| WO | 2016137424 A1 | 9/2016 |
| WO | 2016187090 A1 | 11/2016 |

OTHER PUBLICATIONS

International Preliminary Report on Patentability from counterpart PCT Application No. PCT/US2019/049805 dated Mar. 9, 2021, 13 pgs.

International Search Report and the Written Opinion from counterpart PCT Application No. PCT/US2019/049801 dated Jan. 28, 2020, 21 pgs.

International Search Report and the Written Opinion from counterpart PCT Application No. PCT/US2019/049805 dated Mar. 24, 2020, 24 pgs.

Prosecution History from U.S. Appl. No. 17/273,936, dated Mar. 5, 2021 through Nov. 7, 2022, 55 pp.

U.S. Appl. No. 17/273,922, filed Mar. 5, 2021 by Douglas B. Gundel et al.

U.S. Appl. No. 17/273,936, filed Mar. 5, 2021 by Douglas B. Gundel et al.

U.S. Appl. No. 17/274,032, filed Mar. 5, 2021 by Douglas B. Gundel et al.

First Office Action and Search Report, and translation thereof, from counterpart Chinese Application No. 201980059277.2 dated Mar. 29, 2024, 15 pp.

* cited by examiner

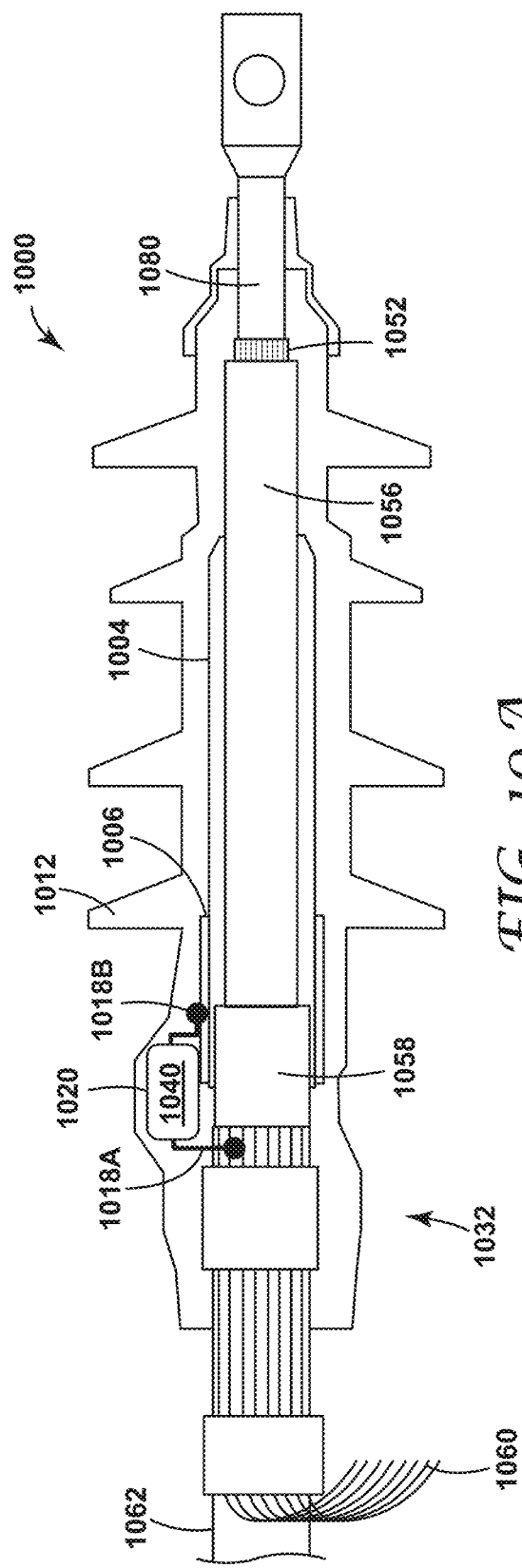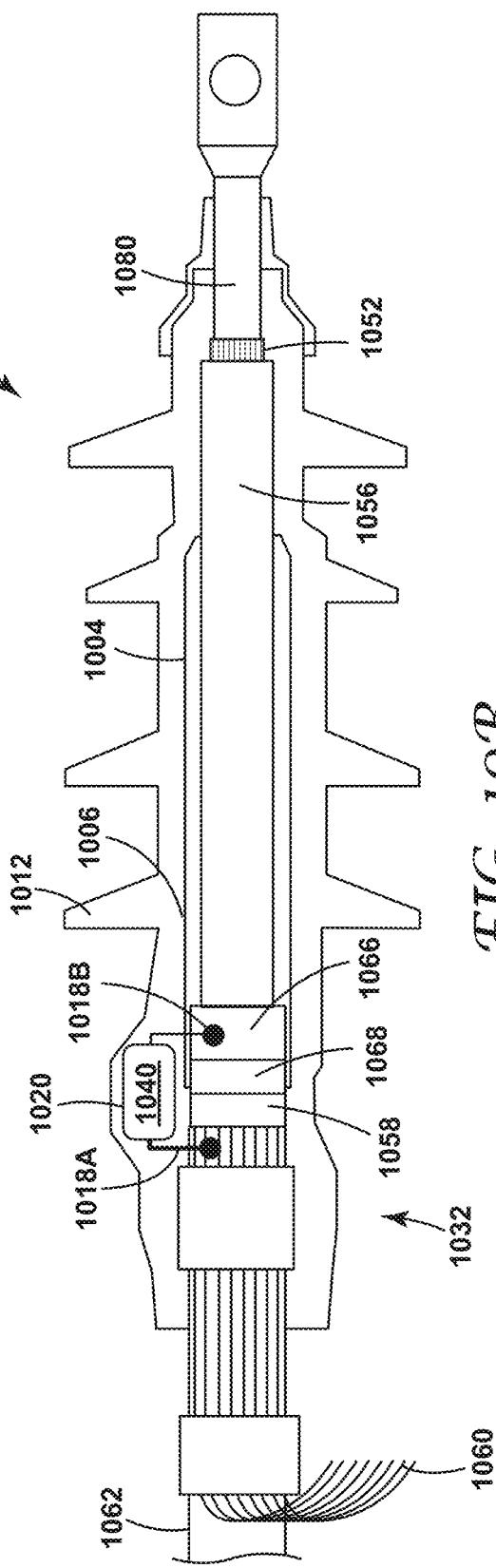

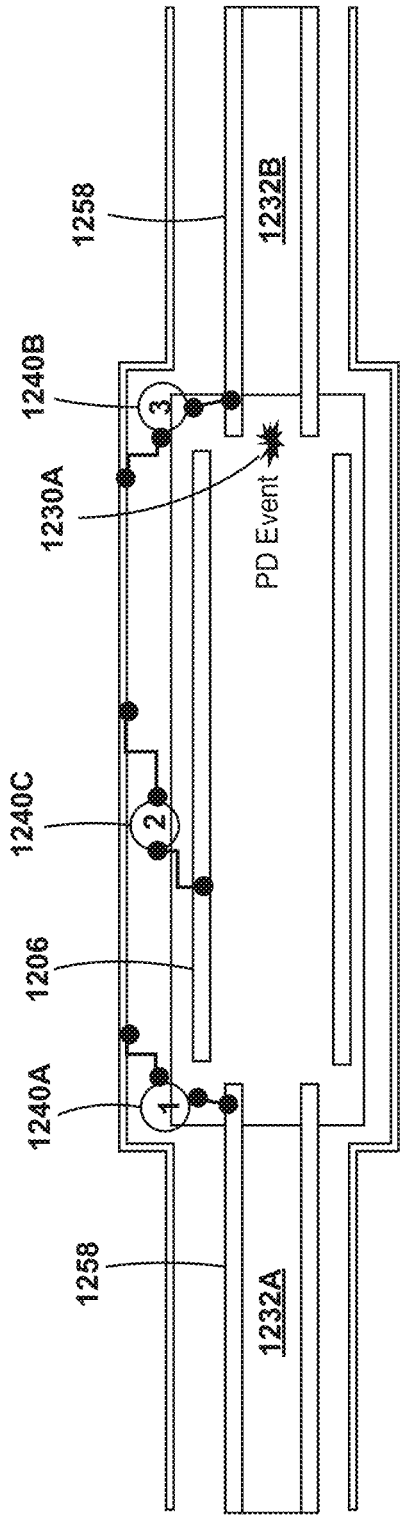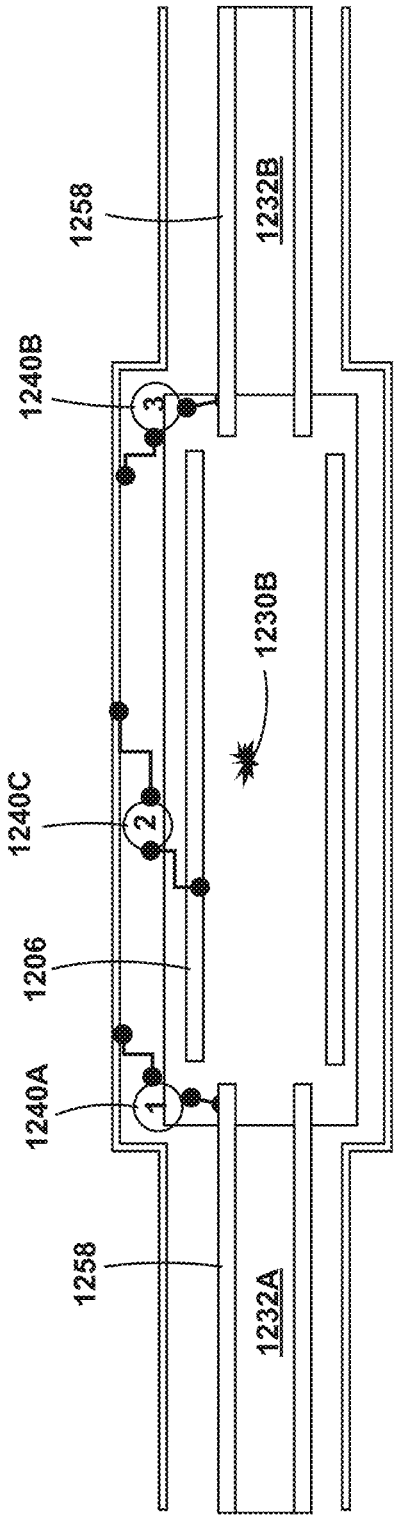

ELECTRICAL POWER CABLE MONITORING DEVICE INCLUDING PARTIAL DISCHARGE SENSOR

This application is a continuation of U.S. application Ser. No. 17/273,936, filed Mar. 5, 2021, which is a national stage application claiming priority to WO International Patent Application No. PCT/US2019/049805, filed Sep. 5, 2019, which claims the benefit of U.S. Provisional Application No. 62/729,363, filed Sep. 10, 2018. The entire content of U.S. application Ser. No. 17/273,936, WO International Patent Application No. PCT/US2019/049805, and U.S. Provisional Application No. 62/729,363 is incorporated herein by reference.

TECHNICAL FIELD

The present disclosure relates to the field of electrical equipment, including power cables and accessories, for power utilities.

BACKGROUND

Electrical power grids include numerous components that operate in diverse locations and conditions, such as above ground, underground, cold weather climates, hot weather climates, etc. When a power grid suffers a failure, it can be difficult to determine the cause of the failure. For example, a power grid may include hundreds or thousands of discrete components, such as transformers, cables, cable splices, etc., and a failure in the power grid may be caused by a failure in any single component or a collection of the components. The root cause of such failures may include human error in installation, manufacturing defects, or wear and tear on the component, among other causes. While replacement of the electrical components can be costly, simply finding the fault can be time consuming and costly. If a component fails in service, the cost can include downtime for customer operations, liability, safety, or regulatory scrutiny, in addition to the costs to locate and replace faulty components. Further, faulty components may pose a safety risk to utility workers, civilians, homes, buildings, or other infrastructure.

SUMMARY

The present disclosure provides techniques for detecting partial discharge events in electrical power cables of a power grid. According to aspects of this disclosure, cable accessories, such as cable splice bodies or cable termination bodies include one or more partial discharge sensors. As used herein, a partial discharge event generally refers to an event where a discharge only partially bridges a gap between electrodes or conductors of an electrical power cable, accessories, and equipment. A common example occurs when a gas in a void in the insulation of an electric power cable breaks down under an applied voltage. Partial discharge events within an electric power cable, for example, may cause damage accumulation in the insulation of the cable which can lead to failure. In some examples, the partial discharge sensors described herein detect such partial discharge events and outputs data indicative of the partial discharge events for reporting, analytical processing and/or monitoring.

In various examples, a monitoring system may receive output from the sensors described herein and apply one or more models to the partial discharge data generated by one or more partial discharge sensors, e.g., in real-time, to predict a failure event of an article of electrical equipment (e.g., electrical cables, cable accessories, etc.) and/or to determine a health of the article of electrical equipment, such as predicting a remaining life-span of the article of electrical equipment. In some examples, the computing system applies the one or more models to the partial discharge data and other data (e.g., sensor data, equipment data, installation data, etc.) to determine a health of an article of electrical equipment. Examples of such sensors include temperature sensors, partial discharge sensors, smoke sensors, gas sensors, acoustic sensors, among others.

According to aspects of this disclosure, the monitoring system may implement one or more machine learning techniques, e.g., supervised training, to train the model(s) with a set of training instances, where each training instance includes partial discharge data associated with known (i.e., previously identified/labelled) respective failure events. Moreover, in operation, the computing system model may update the one or more models based on newly received partial discharge data and event data to provide closed-loop training of the model(s), thereby achieving, in some examples, more accurate prediction the health status of an article of equipment when applying the model to subsequent partial discharge data.

In this way, as the system receives partial discharge data from partial discharge sensors included in or attached to articles of electrical equipment operating in a work environment, the system may more quickly and accurately identify potential failure events that may affect the distribution of power throughout the power grid, or worker and/or civilian safety, to name only a few examples. By determining a health status of electrical equipment and predicting failure events before they occur, a computing system may proactively and preemptively generate notifications and/or alter the operation of a power grid before a failure event occurs.

In some examples, a cable accessory includes a partial discharge sensor and a communications unit. The partial discharge sensor is configured to detect partial discharge events and output partial discharge data indicative of the partial discharge events. The communications unit is configured to output event data based at least in part on the partial discharge data.

In some examples, a method includes receiving, by at least one processor, from a partial discharge sensor of a cable accessory coupled to an electrical cable, partial discharge data indicative of one or more partial discharge events. The method also includes outputting, by the at least one processor, event data that is based at least in part on the partial discharge data indicative of the partial discharge events.

The details of one or more examples of the disclosure are set forth in the accompanying drawings and the description below. Other features, objects, and advantages of the disclosure will be apparent from the description and drawings, and from the claims.

BRIEF DESCRIPTION OF THE DRAWINGS

FIGS. 10A-10C are conceptual diagrams illustrating an example cable accessory coupling an electrical cable to a cable termination lug, in accordance with one or more aspects of this disclosure.

FIGS. 13A-13C are conceptual diagrams illustrating an example cable accessory coupling a plurality of electrical cables, in accordance with one or more aspects of this disclosure.

It is to be understood that the embodiments may be utilized and structural changes may be made without departing from the scope of the invention. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
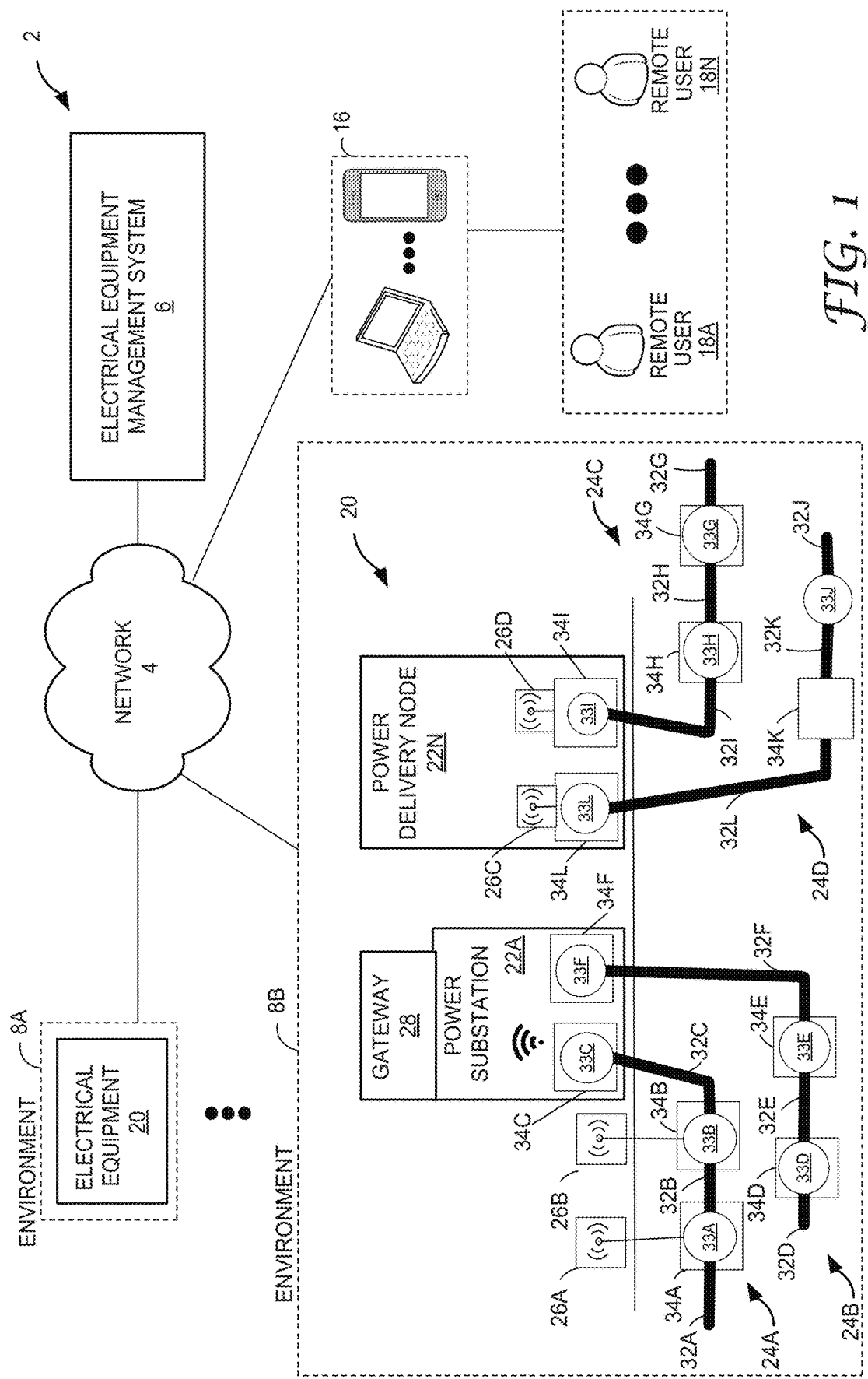
FIG. 1 is a block diagram illustrating an example system in which electrical utility equipment, such as electrical power lines, having embedded sensors and communication capabilities are utilized within a number of work environments and are managed by an electrical equipment management system (EEMS), in accordance with various techniques of this disclosure.

FIG. 1 is a block diagram illustrating an example computing system 2 that includes an electrical equipment management system (EEMS) 6 for monitoring electrical power cables of an electrical power grid. As described herein, EEMS 6 may allow authorized users to manage inspections, maintenance, and replacement of electrical equipment for a power grid and to adjust operation of the power grid.

In general, EEMS 6 provides data acquisition, monitoring, activity logging, data storage, reporting, predictive analytics, and alert generation. For example, EEMS 6 may include an underlying analytics engine for predicting failure events of articles of electrical equipment and an alerting system, in accordance with various examples described herein. In general, a failure event may refer to interruption of electrical power delivery between an electrical power source and an electrical power consumer, for example, caused by deterioration or breakage of an article of electrical equipment (e.g., a cable splice).

As further described below, EEMS 6 provides an integrated suite of electrical equipment management tools and implements various techniques of this disclosure. That is, EEMS 6 provides a system for managing electrical equipment (e.g., electrical cables, splices, transformers, etc.) within one or more physical environments 8, which may be cities, neighborhoods, buildings, construction sites, or any physical environment. The techniques of this disclosure may be realized within various parts of system 2.

As shown in the example of FIG. 1, system 2 represents a computing environment in which a computing device within of a plurality of physical environments 8A, 8B (collectively, environments 8) electronically communicate with EEMS 6 via one or more computer networks 4. Each of physical environment 8 represents a physical environment in which one or more electrical power lines 24A-24D (collectively, power lines 24) provide power from a power source (e.g., power plant) to one or more consumers (e.g., businesses, homes, government facilities, etc.).

In this example, environment 8A is shown as generally as having electrical equipment 20, while environment 8B is shown in expanded form to provide a more detailed example. In the example of FIG. 1, includes a plurality of articles of electrical equipment 20, such as one or more power delivery nodes 22A-22N (collectively, power delivery nodes 22), one or more power lines 24, one or more communication hubs 26A-26D (collectively, communication hubs 26), and one or more gateways 28.

In the example of FIG. 1, environment 8B includes wireless communication hubs 26 and/or one or more gateways 28. In general, communication hubs 26 and gateways 28 operate as communication devices for relaying communications between EEMS 6 and monitoring devices 33 monitoring respective articles of electrical equipment 20 (e.g., cable accessories 34). Communication hubs 26 and gateways 28 may each be communicatively coupled to EEMS 6 via wired and/or wireless communication. For example, wireless communication hubs 26 and/or gateway 28 may include a cellular radio (e.g., GSM, CDMA, LTE, etc.), Bluetooth® radio, WiFi® radio, low power wide area network (LPWAN), etc. As another example, wireless communication hubs 26 and/or gateway 28 may include a wired connection, such as a network interface card (e.g. such as an Ethernet card), an optical transceiver, or any other type of device that can send and/or receive data. According to some examples, communication hubs 26 and/or gateways 28 may communicate with other devices using power line communication techniques. In other words, in some examples, gateways 28 may communicate with monitoring devices 33 over power lines 24. In some examples, wireless communication hubs 26 and gateways 28 may be capable of buffering data in case communication is lost with EEMS 6. Moreover, communication hubs 26 and gateway 28 may be programmable via EEMS 6 so that local alert rules may be installed and executed without requiring a connection to the cloud. As such, communication hubs 26 and gateways 28 may provide a relay of streams of event data from monitoring devices 33, and provides a local computing environment for localized alerting based on streams of events.

Power delivery nodes 22 may include one or more input lines to receive power (e.g., directly from a power source or indirectly via another power delivery node 22) and one or more output lines to directly or indirectly (e.g., via another power delivery node 22) distribute power to consumers (e.g., homes, businesses, etc.). Power delivery nodes 22 may include a transformer to step voltages up or down. In some examples, power delivery node 22A may be a relatively small node to distribute power to homes in a neighborhood, such as an electrical cabinet, pole-mount transformer, or pad-mount transformer. As another example, power delivery node 22N may be a relatively large node (e.g., a transmission substation) that distributes power to other power delivery nodes (e.g., distribution substations), such that the other power delivery nodes further distribute power to consumers (e.g., homes, businesses, etc.).

Power lines 24 may transmit electrical power from a power source (e.g., a power plant) to a power consumer, such as a business or home. Power lines 24 may be underground, underwater, or suspended overhead (e.g., from wooden poles, metal structures, etc.). Power lines 24 may be used for electrical power transmission at relatively high voltages (e.g., compared to electrical cables utilized within a home, which may transmit electrical power between approximately 12 volts and approximately 240 volts depending on application and geographic region). For example, power lines 24 may transmit electrical power above approximately 600 volts (e.g., between approximately 600 volts and approximately 1,000 volts). However, it should be understood that power lines 24 may transmit electrical power over any voltage and/or frequency range. For example, lines 24 may transmit electrical power within different voltage ranges. In some examples, a first type of lines 24 may transmit voltages of more than approximately 1,000 volts, such as for distributing power between a residential or small commercial customer and a power source (e.g., power utility). As another example, a second type of lines 24 may transmit voltages between approximately 1 kV and approximately 69 kV, such as for distributing power to urban and rural communities. A third type of lines 24 may transmit voltages greater than approximately 69 kV, such as for sub-transmission and transmission of bulk quantities of electric power and connection to very large consumers.

Power lines 24 include electrical cables 32 and one or more electrical cable accessories 34A-34J. Each cable 32 includes a conductor which may be radially surrounded by one or more layers of insulation. In some examples, cables 32 include a plurality of stranded conductors (e.g., a three-phase or multi-conductor cable). Example cable accessories 34 may include splices, separable connectors, terminations, and connectors, among others. In some examples, cable accessories 34 may include cable splices configured to couple (e.g., electrically and physically) two or more cables 32. For example, as shown FIG. 1, cable accessory 34A electrically and physically couples cable 32A to cable 32B, cable accessory 34B electrically and physically couples cable 32B to cable 32C, and so forth. In some examples, terminations may be configured to couple (e.g., electrically and physically) a cable 32 to additional electrical equipment, such as a transformer, switch gear, power substation, business, home, or other structure. For example, as shown FIG. 1, cable accessory 34C electrically and physically couples cable 32C to power delivery node 22A (e.g., to a transformer of the power delivery node 22A).

System 2 includes one or more electrical cable monitoring devices 33A-33L (collectively, monitoring devices 33) configured to monitor one or more conditions of an article of electrical equipment 20. For example, monitoring devices 33 may be configured to monitor conditions of power delivery nodes 22, electrical cables 32, cable accessories 34, or other type of electrical equipment 20. Monitoring devices 33 may be configured to attach or otherwise couple to electrical cables 32 and/or cable accessories 34. In some examples, monitoring devices 33 may be integrated within another device, such as cable accessories 34, or may be a separate (e.g., stand-alone) device. In the example of FIG. 1, cable accessories 34A, 34B, 34C, 34D, 34E, 34F, 34G, 34H, and 34I include monitoring devices 33A, 33B, 33C, 33D, 33E, 33F, 33G, 33H, and 33I, respectively, while monitoring device 33J is a stand-alone monitoring device monitoring power line 24D. Further, in the example of FIG. 1, cable accessory 34K does not include a monitoring device.

Monitoring devices 33 include sensors that generate sensor data indicative of the operating characteristics of one or more electrical cables 32 and/or cable accessories 34 or the condition of electrical equipment. Sensors of monitoring devices 33 may include temperature sensors (e.g., internal and/or external to the cable accessory), partial discharge sensors, voltage and/or current sensors, among others. In some examples, monitoring device 33A includes one or more temperature sensors. For example, monitoring device 33A may include an internal temperature sensor to monitor temperatures inside an electrical cable 32 or cable accessory 34 and/or an external temperature monitor to monitor the temperature outside or on the surface of an electrical cable 32 or cable No. 1004-951USP1, U.S. Patent Application 62/729,325, entitled "ELECTRICAL POWER CABLE MONITORING DEVICE USING LOW SIDE ELECTRODE AND EARTH GROUND SEPARATION," filed Sep. 10, 2018, which is hereby incorporated by reference in its entirety. Additional example details of monitoring devices and electrical equipment management systems are described in U.S. Patent Application 62/729,367, entitled "ELECTRICAL POWER CABLE MANAGEMENT SYSTEM HAVING ANALYTICS ENGINE WITH INTEGRATED MONITORING, ALERTING, AND PRE-FAULT EVENT PREDICTION," filed Sep. 10, 2018, which is hereby incorporated by reference in its entirety.

Monitoring device 33 may include a partial discharge sensor to detect partial discharge events (e.g., within cable accessory 34A). As used herein, a partial discharge event refers to a current discharge that only partially bridges the gap between electrodes of an electrical cable (e.g., which may be caused by a gas discharge in a void of the electrical cable). Monitoring device 33 may include a voltage and/or current sensor configured to measure the phase and/or magnitude of the voltage or current in an electrical cable 32 or cable accessory 34.

Monitoring devices 33 each include a power source or receives power from a power source. For example, monitoring device 33A may include a battery. As another example, monitoring device 33A may be coupled to a solar cell, wind turbine, or other renewable or non-renewable power source. Example details of monitoring devices 33 having a protective shell are described in U.S. Patent Application 62/729,320, entitled "SUPPORT STRUCTURE FOR CABLE AND CABLE ACCESSORY CONDITION MONITORING DEVICES,' filed Sep. 10, 2018, which is hereby incorporated by reference in its entirety.

In some examples, monitoring devices 33A may include a power harvesting device configured to harvest power from power line 24A. For example, the power harvesting device of monitoring device 33A may receive power via the electrical power carried by power line 24A, via a magnetic field produced by power line 24A, or via heat within power line 24A, cable accessory 34A, or other device that generates heat when coupled to power line 24A.

In general, monitoring devices 33 may be communicatively coupled to EEMS 6. In some examples, monitoring devices 33 may include a transceiver to communicate (e.g. via network 4) with EEMS 6. In some examples, monitoring devices 33 communicate with EEMS 6 via communication hubs 26 and/or gateways 28. For example, monitoring devices 33 may output data to gateways 28 and/or communication hubs 26 via power line communication. As another example, monitoring devices 33 may include wireless communication devices, such as WiFi®, Bluetooth®, or RFID devices, which may be read by a mobile device reader (e.g., a vehicle that includes a reader to communicate with monitoring device 33 as a vehicle drives around environment 8B). Monitoring devices 33 may communicate event data indicative of the health or status of electrical cables 32, cable accessories 34. Event data may include data indicative of the sensor data generated by sensors of the electrical equipment 20, device data for electrical equipment 20, analysis data, or a combination therein. For instance, data indicative of the sensor data may include at least a portion of the sensor data generated by one or more sensors of monitoring device 33A, a summary of the sensor data, conclusions or results of analyses performed on the sensor data, or a combination therein. Device data (also referred to as equipment data) may include identification data (e.g., a unique identifier corresponding to a particular article of electrical equipment 20), device type (e.g., transformer, joint, termination joint, etc.), an event timestamp, location data (e.g., GPS coordinates of the particular article of electrical equipment 20), manufacturing data (e.g., manufacturer, lot number, serial number, date of manufacture, etc.), installation data (e.g., date of installation, identity of an installer or installation team), consumer data (e.g., data identifying a quantity and/or type of consumers serviced by the line, addresses served by the line, and the like), power distribution data (e.g., a type of line, such as ultra-high voltage, high voltage, medium voltage, etc.), or a combination therein. In some examples, the event data includes analysis data, such as data indicating whether the electrical equipment is predicted to fail (e.g., whether a failure event is predicted to occur), a predicted or estimated remaining lifespan of the electrical equipment, confidence interval for the prediction, etc. In some examples, monitoring devices 33 may receive data from EEMS 6, communication hubs 26, gateways 28, and/or cable accessories 34. For example, EEMS 6 may transmit requests for sensor data, firmware updates, or other data to monitoring devices 33.

In some examples, monitoring devices 33 include a wireless transceiver configured to transmit data over a wireless network (e.g., WiFi Bluetooth Zigbee®, etc.). For example, as illustrated in FIG. 1, monitoring devices 33A and 33B may be communicatively coupled to wireless communication hubs 26A and 26B, respectively. In this way, monitoring devices 33A and 33B may communicate with EEMS 6 via wireless communication hubs 26A, 26B. In some examples, monitoring devices 33A-33C may communicate with EEMS 6 via gateway 28. For example, monitoring device 33A may transmit data to monitoring device 33B, and monitoring device 33B may transmit data to monitoring device 33C (e.g., some or all of monitoring devices 33 may form a mesh network). Monitoring device 33C may transmit data from monitoring devices 33A-33C to gateway 28, which may forward the data from monitoring devices 33A-33C to EEMS 6.

Monitoring devices 33 may include a wired transceiver. For example, monitoring devices 33 may be configured to communicate with one another, with cable accessories 34, communication hubs 26, gateways 28, and/or EEMS 6 via powerline communication, or over copper or fiber communication lines. In other words, in some examples, monitoring devices 33 may include a transceiver configured to communicate over power lines 24. In this way, power lines 24 may transmit electrical power from a power source to power consumers, as well as transmit data between EEMS 6 and monitoring devices 33. Additional details of monitoring devices 33 are describes with reference to FIG. 3.

One or more articles of electrical equipment 20 may be configured to perform analytics locally. In some examples, monitoring device 33A may analyze sensor data generated by the sensors of monitoring device 33A to determine a health of cable accessory 34A. Monitoring device 33A may determine a health of cable accessory 34A by determining whether cable accessory 34A is predicted to fail (e.g., experience a failure event) within a threshold amount of time, determine an estimated remaining lifespan, etc. Monitoring device 33A may output analysis data based on the results of the analysis. For example, the analysis data may include data indicative of a health of cable accessory 34A. Monitoring device 33A may output event data that includes the analysis data to EEMS 6 (e.g., via communication hub 26A, via monitoring device 33B and communication hub 26B, and/or via communication hubs 26B, 26C and gateway 28).

System 2 includes computing devices 16 by which users 18A-18N (collectively, users 18) may interact with EEMS 6 via network 4. For purposes of example, the end-user computing devices 16 may be laptops, desktop computers, mobile devices such as tablets, smart phones and the like.

Users 18 interact with EEMS 6 to control and actively manage many aspects of electrical equipment 20, such as accessing and viewing event records, analytics and reporting. For example, users 18 may review event data acquired and stored by EEMS 6. In addition, users 18 may interact with EEMS 6 to perform asset tracking and to schedule maintenance or replacement for individual pieces of electrical equipment 20, e.g., monitoring devices 33, cables 32 and/or cable accessories 34. EEMS 6 may allow users 18 to create and complete digital checklists with respect to the maintenance and/or replacement procedures and to synchronize any results of the procedures from computing devices 16 to EEMS 6.

Further, as described herein, EEMS 6 integrates an event processing platform configured to process hundreds, thousands, or even millions of concurrent streams of events from monitoring devices 33 that monitor respective articles of electrical equipment 20 (e.g., cable accessories 34). An underlying analytics engine of EEMS 6 applies historical data and models to the inbound streams to compute assertions, such as identified anomalies or predicted occurrences of failure events based on data from sensors of electrical equipment 20. Further, EEMS 6 provides real-time alerting and reporting to notify users 18 of any predicted events, anomalies, trends, and the like.

The analytics engine of EEMS 6 may, in some examples, apply analytics to identify relationships or correlations between sensor data, environmental conditions, geographic regions, or other factors and analyze the impact on failure events. In some examples, EEMS 6 may determine a health of one or more cables accessories 34 or other electrical equipment. For example, EEMS 6 may determine, based on the data acquired across populations of electrical equipment 20, circumstances that lead to, or are predicted to lead to, failure events.

In some examples, EEMS 6 may determine whether an article of electrical equipment 20 should be repaired or replaced, prioritize maintenance (e.g., repair or replacement) procedures, create work orders, assign individuals or crews to perform the maintenance procedures, etc. EEMS 6 may, according to some examples, recommend re-routing electrical power or automatically re-route electrical power based on the analysis results.

EEMS 6 may process data for one or more entities, such as power utilities. For example, EEMS 6 may receive event data from electrical equipment of a single power utility and may provide analytics and reporting for the single power utility. As another example, EEMS 6 may receive event data from multiple power utilities and provide analytics and reporting for each of the power utilities. By receiving data from multiple power utilities, EEMS 6 may provide more robust prediction capabilities, for example, by training machine learning models with a larger data set than individual power utilities each utilizing a separate EEMS 6.

In this way, EEMS 6 integrates comprehensive tools for managing electrical equipment 20 with an underlying analytics engine and communication system to provide data acquisition, monitoring, activity logging, reporting, and alert generation. Moreover, EEMS 6 provides a communication system for operation and utilization by and between the various elements of system 2. Users 18 may access EEMS 6 to view results on any analytics performed by EEMS 6 on data acquired from monitoring devices 33. In some examples, EEMS 6 may present a web-based interface via a web server (e.g., an HTTP server) or client-side applications may be deployed for computing devices 16 used by users 18.

In some examples, EEMS 6 may provide a database query engine for directly querying EEMS 6 to view acquired event (e.g., sensor) data and any results of the analytic engine, e.g., by the way of dashboards, alert notifications, reports and the like. That is, users 18, or software executing on computing devices 16, may submit queries to EEMS 6 and receive data corresponding to the queries for presentation in the form of one or more reports or dashboards. Such dashboards may provide various insights regarding system 2, such as baseline ("normal") operation across environments 8, identifications of any anomalous environments and/or electrical equipment 20, identifications of any geographic regions within environments 2 for which unusual activity (e.g., failure events) has occurred or is predicted to occur, and the like.

As illustrated in detail below, EEMS 6 may simplify workflows for individuals charged with monitoring electrical equipment 20 for an entity or environment. That is, the techniques of this disclosure may enable active electrical equipment management and allow an organization to take preventative or correction actions with respect to particular pieces of electrical equipment.

As one example, the underlying analytical engine of EEMS 6 may be configured to compute and present metrics for electrical equipment within a given environment 8 or across multiple environments for an organization. For example, EEMS 6 may be configured to acquire data and provide aggregated failure metrics and predicted failure analytics across one or more environments 8. Furthermore, users 18 may set benchmarks for occurrence of any failure events, and EEMS 6 may track actual failure events relative to the benchmarks.

As another example, EEMS 6 may further trigger an alert if certain combinations of conditions are present, e.g., to accelerate examination or service of one or more articles of electrical equipment 20, such as one of cable accessories 34. In this manner, EEMS 6 may identify an individual article of electrical equipment 20 predicted to fail and prompt users 18 to inspect and/or replace the article of electrical equipment prior to failure of the article.

While EEMS 6 is described as including the analytics engine, in some examples, communication units 26, gateways 28, and/or monitoring devices 33 may perform some or all of the functionality of EEMS 6. For example, monitoring device 33A may analyze sensor data generated by sensors of one or more monitoring devices 33 (e.g., from monitoring device 33A itself, other monitoring devices, or a combination therein). Monitoring devices 33 may output (e.g., via communication units 26) conclusions, assertions, or results of the analysis to EEMS 6. Similarly, gateways 28 may receive data from a plurality of monitoring devices 33, analyze the data, and send messages to EEMS 6 and/or one or more monitoring devices 33.

In this way, an EEMS may monitor event data from monitoring devices to determine the health of the articles of electrical equipment and/or predicting whether an article of electrical equipment will fail. By determining the health or predicting whether an article of electrical equipment will fail, the EEMS may enable power utilities to more effectively determine where failures have occurred or are likely to occur and manage or prioritize repair or replacement of electrical equipment, which may prevent or reduce failure events in the power grid.

Figure 2:
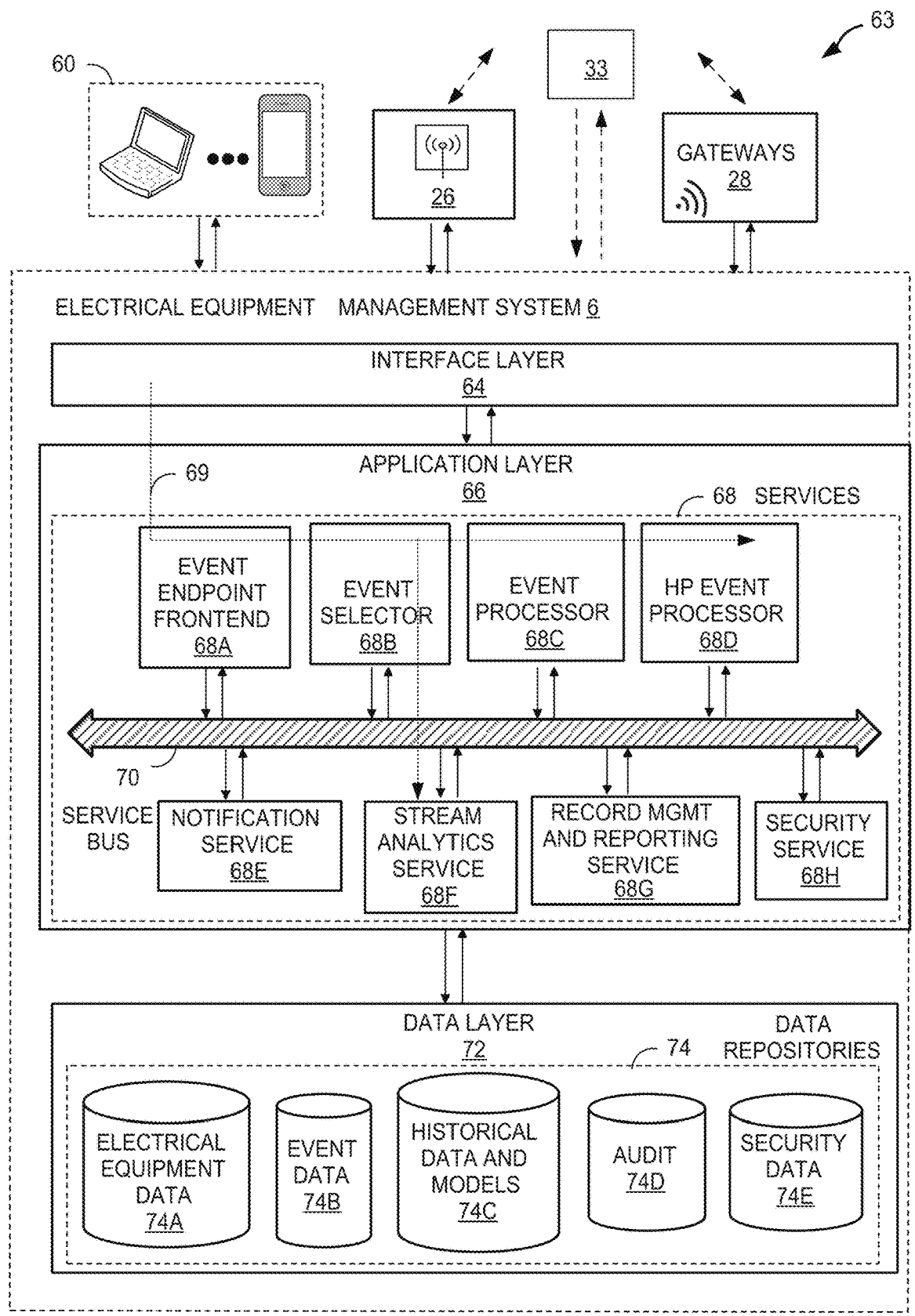
FIG. 2 is a block diagram illustrating an operating perspective of the electrical equipment management system shown in FIG. 1, in accordance with various techniques of this disclosure.

FIG. 2 is a block diagram providing an operating perspective of EEMS 6 when hosted as cloud-based platform capable of supporting multiple, distinct environments 8 each having a plurality of articles of electrical equipment 20. In the example of FIG. 2, the components of EEMS 6 are arranged according to multiple logical layers that implement the techniques of the disclosure. Each layer may be implemented by one or more modules comprised of hardware, software, or a combination of hardware and software.

In FIG. 2, monitoring devices 33, either directly or by way of communication hubs 26 and/or gateways 28, as well as computing devices 60, operate as clients 63 that communicate with EEMS 6 via interface layer 64. Computing devices 60 typically execute client software applications, such as desktop applications, mobile applications, and web applications. Computing devices 60 may represent any of computing devices 16 of FIG. 1. Examples of computing devices 60 may include, but are not limited to, a portable or mobile computing device (e.g., smartphone, wearable computing device, tablet), laptop computers, desktop computers, smart television platforms, and servers, to name only a few examples.

As further described in this disclosure, monitoring devices 33 communicate with EEMS 6 (directly or via communication hubs 26 and/or gateways 28) to provide streams of data acquired from embedded sensors and other monitoring circuitry and receive from EEMS 6 alerts, configuration data, and other communications. For example, the partial discharge sensors of FIGS. 7-15 may output event data that includes data indicative of partial discharge data generated by the partial discharge sensors. The data indicative of the partial discharge data may include all or a portion of the partial discharge data generated by partial discharge sensors of FIGS. 7-15, a summary of the partial discharge data, analysis data (e.g., data indicating conclusions or results of analyses performed on the partial discharge data), or a combination therein. Event data may include device data for cable accessories that include partial discharge sensors of FIGS. 7-15. Device data may include identification data, device type data, event timestamps, location data, installation data, manufacturing data, consumer data, power distribution data, among others. Client applications executing on computing devices 60 may communicate with EEMS 6 to send and receive data that is retrieved, stored, generated, and/or otherwise processed by services 68A-68H (collectively, services 68). For instance, the client applications may request and edit event data including analytical data stored at and/or managed by EEMS 6. In some examples, the client applications may request and display aggregate event data that summarizes or otherwise aggregates numerous individual instances of failure events and corresponding data acquired from monitoring devices 33 and/or generated by EEMS 6. The client applications may interact with EEMS 6 to query for analytics data about past and predicted failure events. In some examples, the client applications may output (e.g., for display) data received from EEMS 6 to visualize such data for users of clients 63. As further illustrated and described in below, EEMS 6 may provide data to the client applications, which the client applications output for display in user interfaces.

Clients applications executing on computing devices 60 may be implemented for different platforms but include similar or the same functionality. For instance, a client application may be a desktop application compiled to run on a desktop operating system, or may be a mobile application compiled to run on a mobile operating system. As another example, a client application may be a web application such as a web browser that displays web pages received from EEMS 6. In the example of a web application, EEMS 6 may receive requests from the web application (e.g., the web browser), process the requests, and send one or more responses back to the web application. In this way, the collection of web pages, the client-side processing web application, and the server-side processing performed by EEMS 6 collectively provides the functionality to perform techniques of this disclosure. In this way, client applications use various services of EEMS 6 in accordance with techniques of this disclosure, and the applications may operate within various different computing environment (e.g., embedded circuitry or processor of a monitoring device, a desktop operating system, mobile operating system, or web browser, to name only a few examples).

As shown in FIG. 2, EEMS 6 includes an interface layer 64 that represents a set of application programming interfaces (API) or protocol interface presented and supported by EEMS 6. Interface layer 64 initially receives messages from any of clients 63 for further processing at EEMS 6. Interface layer 64 may therefore provide one or more interfaces that are available to client applications executing on clients 63. In some examples, the interfaces may be application programming interfaces (APIs) that are accessible over a network. Interface layer 64 may be implemented with one or more web servers. The one or more web servers may receive incoming requests, process and/or forward data from the requests to services 68, and provide one or more responses, based on data received from services 68, to the client application that initially sent the request. In some examples, the one or more web servers that implement interface layer 64 may include a runtime environment to deploy program logic that provides the one or more interfaces. As further described below, each service may provide a group of one or more interfaces that are accessible via interface layer 64.

In some examples, interface layer 64 may provide Representational State Transfer (RESTful) interfaces that use HTTP methods to interact with services and manipulate resources of EEMS 6. In such examples, services 68 may generate JavaScript Object Notation (JSON) messages that interface layer 64 sends back to the client application that submitted the initial request. In some examples, interface layer 64 provides web services using Simple Object Access Protocol (SOAP) to process requests from client applications. In still other examples, interface layer 64 may use Remote Procedure Calls (RPC) to process requests from clients 63. Upon receiving a request from a client application to use one or more services 68, interface layer 64 sends the data to application layer 66, which includes services 68.

Data layer 72 of EEMS 6 represents a data repository that provides persistence for data in EEMS 6 using one or more data repositories 74. A data repository, generally, may be any data structure or software that stores and/or manages data. Examples of data repositories include but are not limited to relational databases, multi-dimensional databases, maps, and hash tables, to name only a few examples. Data layer 72 may be implemented using Relational Database Management System (RDBMS) software to manage data in data repositories 74. The RDBMS software may manage one or more data repositories 74, which may be accessed using Structured Query Language (SQL). Data in the one or more databases may be stored, retrieved, and modified using the RDBMS software. In some examples, data layer 72 may be implemented using an Object Database Management System (ODBMS), Online Analytical Processing (OLAP) database or other suitable data management system.

Electrical equipment data 74A of data repositories 74 may include data corresponding to a plurality of articles of electrical equipment, such as cable accessories 34. In some examples, electrical equipment data 74A may include device or equipment data, manufacturing data, installation data, consumer data, power distribution data, among others. For example, electrical equipment data 74A may include, for each cable accessory of cable accessories 34, data identifying a date of manufacture, a date of installation, a location (e.g., GPS coordinates, street address, etc.), entity that installed the cable accessory, a unique identifier (e.g., serial number), a type of cable accessory, etc. For example, prior to joining electrical cables 32A and 32B of FIG. 1 with cable accessory 34A, an installer may scan (e.g., with one of computing devices 16, such as a mobile phone) a barcode on cable accessory 34A that includes device data representing a unique identifier, date of manufacture, and so forth, and may upload the device data to EEMS 6. In some instances, the mobile device may append data such as the current date as the date of installation and GPS coordinates to the device data, and may send the device data to EEMS 6, such that EEMS 6 may store the device data for cable accessory 34A in electrical equipment data 74A.

As shown in FIG. 2, EEMS 6 also includes an application layer 66 that represents a collection of services 68 for implementing much of the underlying operations of EEMS 6. Application layer 66 receives data included in requests received from client devices 63 and further processes the data according to one or more of services 68 invoked by the requests. Application layer 66 may be implemented as one or more discrete software services executing on one or more application servers, e.g., physical or virtual machines. That is, the application servers provide runtime environments for execution of services 68. In some examples, the functionality interface layer 64 as described above and the functionality of application layer 66 may be implemented at the same server.

Application layer 66 may include one or more separate software services 68 (e.g., processes) that communicate with one another (e.g., via a logical service bus 70), as one example. Service bus 70 generally represents a logical interconnections or set of interfaces that allows different services to send messages to other services, such as by a publish/subscription communication model. For instance, each of services 68 may subscribe to specific types of messages based on criteria set for the respective service. When a service publishes a message of a particular type on service bus 70, other services that subscribe to messages of that type will receive the message. In this way, each of services 68 may communicate data to one another. As another example, services 68 may communicate in point-to-point fashion using sockets or other communication mechanism.

As shown in FIG. 2, each of services 68 is implemented in a modular form within EEMS 6. Although shown as separate modules for each service, in some examples the functionality of two or more services may be combined into a single module or component. Each of services 68 may be implemented in software, hardware, or a combination of hardware and software. Moreover, services 68 may be implemented as standalone devices, separate virtual machines or containers, processes, threads or software instructions generally for execution on one or more physical processors. In some examples, one or more of services 68 may each provide one or more interfaces that are exposed through interface layer 64. Accordingly, client applications of computing devices 60 may call one or more interfaces of one or more of services 68 to perform techniques of this disclosure.

In accordance with techniques of the disclosure, services 68 may include an event processing platform including an event endpoint frontend 68A, event selector 68B, and event processor 68C. Event endpoint frontend 68A operates as a front-end interface for receiving and sending communications to monitoring devices 33 (e.g., directly or via communication hub 26, and/or gateways 28). In other words, event endpoint frontend 68A operates to as a front line interface to monitoring devices 33 deployed within environments 8 of FIG. 1. In some instances, event endpoint frontend 68A may be implemented as a plurality of tasks or jobs spawned to receive individual inbound communications of event streams 69 from the monitoring devices 33 (e.g. integrated within cable accessories 34) carrying data sensed and captured by sensors of the monitoring devices 33. When receiving event streams 69, for example, event endpoint frontend 68A may spawn tasks to quickly enqueue an inbound communication, referred to as an event, and close the communication session, thereby providing high-speed processing and scalability. Each incoming communication may, for example, carry recently captured data representing sensed conditions, motions, temperatures, actions or other data, generally referred to as events. Communications exchanged between the event endpoint frontend 68A and the cable accessories 34 may be real-time or pseudo real-time depending on communication delays and continuity.

Event selector 68B operates on the stream of events 69 received from monitoring devices 33, communication hubs 26, and/or gateways 28 via frontend 68A and determines, based on rules or classifications, priorities associated with the incoming events. Based on the priorities, event selector 68B enqueues the events for subsequent processing by event processor 68C or high priority (HP) event processor 68D. Additional computational resources and objects may be dedicated to HP event processor 68D so as to ensure responsiveness to critical events, such as actual failure or predicted imminent failure of a cable accessory 34. Responsive to processing high priority events, HP event processor 68D may immediately invoke notification service 68E to generate alerts, instructions, warnings or other similar messages to be output to monitoring devices 33 or users 18 of computing devices 60. Events not classified as high priority are consumed and processed by event processor 68C.

In general, event processor 68C or high priority (HP) event processor 68D operate on the incoming streams of events to update event data 74B within data repositories 74. In general, event data 74B includes data indicative of sensor data obtained from monitoring devices 33 (e.g., integrated with cable accessories 34), device data for electrical equipment 20 of FIG. 1, analysis data, or a combination therein. For example, in some instances, event data 74B may include entire streams of samples of data obtained from sensors of monitoring devices 33. In other instances, event data 74B may include a subset of such data, e.g., associated with a particular time period. As another example, event data 74B may include analysis data indicating results of analysis of sensor data performed by one or more of monitoring devices 33, communication hub 26, and/or gateway 28. Examples of event data stored within event data 74B include data indicative of sensor data generated by one or more sensors, such as data indicative of the partial discharge data generated by partial discharge sensors of FIGS. 7-15. The data indicative of the sensor data may include all or a portion of the partial discharge data generated by partial discharge sensors of FIGS. 7-15, a summary of the partial discharge data, analysis data (e.g., data indicating conclusions or results of analyses performed on the partial discharge data), or a combination therein. Event data may include device data for cable accessories that include partial discharge sensors of FIGS. 7-15. Device data may include identification data, device type data, event timestamps, location data, installation data, manufacturing data, consumer data, power distribution data, among others.

Event processors 68C, 68D may create, read, update, and delete event data stored in event data 74B. Event data may be stored in a respective database record as a structure that includes name/value pairs of data, such as data tables specified in row/column format. For instance, a name of a column may be "Accessory ID" and a value may be a unique identification number (e.g., unique identifier) corresponding to a particular article of electrical equipment 20 of FIG. 1. An event record may include data such as, but not limited to: equipment identification, data acquisition timestamp(s), and data indicative of one or more sensed parameters.

Event selector 68B may direct the incoming stream of events to stream analytics service 68F, which is configured to perform in depth processing of the incoming stream of events to perform real-time analytics. Stream analytics service 68F may, for example, be configured to process and compare multiple streams of event data 74B with historical data and models 74C in real-time as event data 74B is received. In this way, stream analytics service 68F may be configured to detect anomalies, transform incoming event data values, or trigger alerts upon predicting a possible failure event (e.g., failure of an article of electrical equipment 20). Historical data and models 74C may include, for example, one or more trained models configured to predict whether a failure vent will occur, an expected remaining lifespan for one or more articles of electrical equipment 20, and/or prioritize maintenance (e.g., repair or replacement) of articles of electrical equipment. In addition, stream analytics service 68F may generate output for communicating to cable accessories 34 (e.g., via notification service 68E) or computing devices 60 (e.g., via notification service 68G or record management and reporting service 68G).

In this way, analytics service 68F processes inbound streams of events, potentially hundreds or thousands of streams of events, from monitoring devices 33 within environments 8 to apply historical data and models 74C to compute assertions, such as identified anomalies or predicted occurrences of imminent failure events based on conditions sensed by the sensors of the monitoring devices 33. Stream analytics service 68F may publish the assertions to notification service 68F and/or record management by service bus 70 for output to any of clients 63.

In this way, analytics service 68F may be configured as an active electrical equipment management system that predicts failure events (e.g., potentially imminent failures or failures likely to occur within a threshold amount of time) and provides real-time alerting and reporting. In addition, analytics service 68F may be a decision support system that provides techniques for processing inbound streams of event data to generate assertions in the form of statistics, conclusions, and/or recommendations on electrical equipment 20 for utilities, workers, and other remote users. For instance, analytics service 68F may apply historical data and models 74C to determine a probability of failure of one or more articles of electrical equipment 20 (e.g., cable accessories 34), prioritize repair and/or replacement of the article of electrical equipment, etc. Hence, analytics service 68F may maintain or otherwise use one or more models that provide risk metrics to predict failure events.

In some examples, analytics service 68F may generate user interfaces based on processing data stored by EEMS 6 to provide actionable data to any of clients 63. For example, analytics service 68F may generate dashboards, alert notifications, reports and the like for output at any of clients 63. Such data may provide various insights regarding baseline ("normal") operation across environments 8 or electrical equipment 20 (e.g., cable accessories 34), identifications of any anomalous characteristics of electrical equipment 20 that may potentially cause a failure of at least a portion of the power grid within an environment 8, and the like.

According to aspects of this disclosure, as noted above, EEMS 6 may apply analytics to predict the likelihood of a failure event. Although other technologies can be used, in one example implementation, analytics service 68F utilizes machine learning when operating on event streams so as to perform real-time analytics. That is, analytics service 68F may include executable code generated by application of machine learning to training data of event streams and known failure events to detect patterns. The executable code may take the form of software instructions or rule sets and is generally referred to as a model that can subsequently be applied to event streams 69 for detecting similar patterns and predicting upcoming events. For example, analytics service 68F may determine a status or health (e.g., predicted remaining lifespan) of the respective article of equipment 20 (e.g., cable accessory 34A) or predict whether/when the respective article of electrical equipment 20 will experience a failure event. That is, EEMS 6 may determine the likelihood or probability of a failure event based on application historical data and models 74C to event data received from electrical equipment 20. For example, EEMS 6 may apply historical data and models 74C to event data from monitoring devices 33 in order to compute assertions, such as anomalies or predicted occurrences of imminent failure events based on sensor data, environmental conditions, and/or other event data corresponding to electrical equipment 20 monitored by monitoring devices 33.

EEMS 6 may apply analytics to identify relationships or correlations between sensed data from sensors of monitoring devices 33 monitoring electrical equipment 20, environmental conditions of environments in which electrical equipment 20 is located, a geographic region in which electrical equipment 20 is located, a type of electrical equipment 20, a manufacturer and/or installer of electrical equipment, among other factors. EEMS 6 may determine, based on the data acquired across populations of electrical equipment 20, conditions, possibly within a certain environment or geographic region, lead to, or are predicted to lead to, unusually high occurrences of failure events. EEMS 6 may generate alert data based on the analysis of the event data and transmit the alert data to computing devices 16 and/or monitoring device 33. Hence, according to aspects of this disclosure, EEMS 6 may determine event data of monitoring devices 33, generate status indications, determine performance analytics, and/or perform prospective/preemptive actions based on a likelihood of a failure event (e.g., scheduling maintenance or replacement).

Analytics service 68F may, in some example, generate separate models for different environments, geographic areas, types of electrical equipment, or combinations thereof. Analytics service 68F may update the models based on event data received from monitoring devices 33. For example, analytics service 68F may update the models for a particular geographic area, a particular type of electrical equipment, a particular environment, or combinations thereof based on event data received from monitoring devices 33. Alternatively, or in addition, analytics service 68F may communicate all or portions of the generated code and/or the machine learning models to monitoring devices 33, communication hubs 26, and/or gateways 28 for execution thereon so as to provide local alerting in near-real time.

Example machine learning techniques that may be employed to generate models 74C can include various learning styles, such as supervised learning, unsupervised learning, and semi-supervised learning. Example types of algorithms include Bayesian algorithms, Clustering algorithms, decision-tree algorithms, regularization algorithms, regression algorithms, instance-based algorithms, artificial neural network algorithms, deep learning algorithms, dimensionality reduction algorithms and the like. Various examples of specific algorithms include Bayesian Linear Regression, Boosted Decision Tree Regression, and Neural Network Regression, Back Propagation Neural Networks, the Apriori algorithm, K-Means Clustering, k-Nearest Neighbour (kNN), Learning Vector Quantization (LUQ), Self-Organizing Map (SOM), Locally Weighted Learning (LWL), Ridge Regression, Least Absolute Shrinkage and Selection Operator (LASSO), Elastic Net, and Least-Angle Regression (LARS), Principal Component Analysis (PCA) and Principal Component Regression (PCR).

EEMS 6 may initially train models 74C based on a training set of event data and, in some examples, on data for corresponding failure events. As further example description, EEMS 6 may select a training set comprising a set of training instances, each training instance comprising an association between event data and a failure event. EEMS 6 may, for each training instance in the training set, modify, based on particular event data and a particular failure event of the training instance, one or more of models 74C to change a likelihood predicted by the models for the particular failure event in response to subsequent event data applied to the models 74C. In some examples, the training instances may be based on real-time or periodic data generated while EEMS 6 managing data for one or more articles of electrical equipment and/or work environments. As such, one or more training instances of the set of training instances may be generated from use of one or more articles of electrical equipment 20 after EEMS 6 performs operations relating to the detection or prediction of a failure event for an article of electrical equipment 20.

By training a model based on the training set, analytics service 68F may apply the model to the event data and generate higher probabilities or scores for failure events that correspond to training feature sets that are more similar to the particular feature set. In the same way, analytics service 68F may apply the model the event data and generate lower probabilities or scores for failure events that correspond to training feature sets that are less similar to the particular feature set. Accordingly, analytics service 68F may train one or more models 74C, receive event data from one or more monitoring devices 33 monitoring respective articles of electrical equipment 20, and output one or more probabilities or scores that indicate likelihoods of failure events based on the received event data vector.

In some examples, analytics service 68F may train one or models 74C based on sensor data generated by sensors of monitoring devices 33. For example, analytics service 68F may determine that temperature is predictive of impending failure based on training data. For instance, arcing, partial discharge, connector resistance increase, tracking, and other processes may cause an increase in temperature the leads to a failure event. As another example, analytics service 68F may determine based on the training data that acoustic emissions (e.g., arcing, partial discharge, and gas release) are related to failure events. As another example, analytics service 68F may determine that electromagnetic emissions (e.g., produced by partial discharge and arcing) and/or the current and/or voltage on the line can also provide an indication of failure events. As another example, analytics service 68F may determine, based on the training data, that temperature alone is not indicative of failure except when the damage progresses to near-complete failure (e.g., since high temperature can be due to high current). Rather, analytics service 68F determines based on the training data that the life-expectancy and failure of electrical equipment 20 is based at least in part line current of cables 32 and temperature of cable accessories 34. In some examples, analytics service 68F may determine a relationship between the line current of cables 32 and the temperature of cable accessories 34 based on direct current measurements (e.g., through a power harvesting coil, the inductive communication coil, or a separate inductive coil of cable accessories 34). As another example, analytics service 68F may, based on the training data, that a difference between the temperature of a cable (e.g., cable 32A) and temperature of a corresponding cable accessory to which the cable is directly coupled (e.g., accessory 34A) is indicative of damage to cable accessory 34A, the life-span of cable accessory 34A, and/or whether or when cable accessory 34A is predicted to experience a failure event.

In some examples, analytics service 68F trains the one or more models 74C based on failure events for articles of electrical equipment 20 and/or work environment having similar characteristics (e.g., of a same type). In some examples the "same type" may refer to identical but separate instances of articles of electrical equipment. In other examples the "same type" may not refer to identical instances of electrical equipment. For instance, although not identical, a same type may refer to articles of electrical equipment in a same class or category of electrical equipment, same model of electrical equipment, or same set of one or more shared functional or physical characteristics, to name only a few examples. Similarly, a same type of environment may refer to identical but separate instances of work environment types. In other examples, although not identical, a same type may refer to an environment in a same class or category of environments, such as "below ground electrical cables", "underwater electrical cables", a particular US state, climate, among others.

In some examples, analytics service 68F may predict a failure event based at least in part on application of models 74C to event data 69, such as sensor data generated by monitoring devices 33 monitoring articles of electrical equipment 20. For example, analytics service 68F may apply one or more models 74C to sensor data indicative of temperature, acoustic emissions, electromagnetic emissions, current, voltage, or any combination therein to determine a health status (e.g., predicted remaining lifespan) of electrical equipment 20 and/or predict failure events of electrical equipment 20. In some examples, analytics service 68F may train models 74C based on data from multiple sensors and may apply one or models 74C to sensor data from multiple different sensors to more accurately predict the health status of a given article of electrical equipment and whether or when the article of electrical equipment 20 will fail.

Analytics service 68F may apply one or more models 74C to sensor data and other event data to determine a health status of an article of electrical equipment 20 and/or whether or when the article of electrical equipment will fail. In some examples, analytics service 68F may apply one or more models 74C to sensor data and device data to predict health status and/or failure events. For example, analytics service 68F may predict whether cable accessory 34A will fail based on sensor data and a type of cable accessory 34A. For instance, analytics service 68F may determine that cable accessories of a first type (e.g., joints performed via a "heat shrink") have different failure patterns than cable accessories of a second type (e.g., joint performed via a "cold shrink"). As another example, analytics service 68F may determine that cable accessories 34 installed by one installer or installed in one geographic location have different failure patterns that cable accessories 34 installed by a different installer or geographic location.

According to aspects of this disclosure, EEMS 6 may schedule maintenance (e.g., repair or replacement) operations of electrical equipment 20 based on event data. For example, analytics service 68F may predict a remaining lifespan for cable accessory 34A, determine the predicted remaining lifespan for cable accessory 34A is less than a threshold lifespan, and schedule a replacement operation for cable accessory 34A based on such data. As another example, analytics service 68F may rank maintenance operations for a plurality of articles of electrical equipment, for example, based on the predicted remaining lifespan, confidence of the prediction, importance of the various articles of electrical equipment (e.g., quantity of customers served by each article), among others. In some examples, analytics service 68F may automatically order replacement electrical equipment 20 based on one or more models 74C.

Additionally or alternatively, according to aspects of this disclosure, event data from monitoring devices 33 may be used to determine alerts and/or actively control operation of electrical equipment 20. For example, EEMS 6 may re-configure or re-route electrical power to transmit power over another electrical line (e.g., 24B of FIG. 1) in response to predicting imminent failure of electrical equipment along a particular line (e.g., 24A of FIG. 1). As another example, analytics service 68F may output a notification (e.g., to computing devices 16) in response to determining a health status of electrical equipment 20 or predicting a failure event. For example, analytics service 68F may output a notification to one or more computing devices 16 via notification service 68E.

Again, EEMS 6 may determine the above-described performance characteristics and/or generate the alert data based on application of the event data to one or more models 74C. However, while the determinations are described with respect to EEMS 6, as described in greater detail herein, one or more other computing devices, such as cable accessories 34, communication hubs 26, and/or gateways 28 may be configured to perform all or a subset of such functionality.

Record management and reporting service 68G processes and responds to messages and queries received from computing devices 60 via interface layer 64. For example, record management and reporting service 68G may receive requests from client computing devices for event data related to individual articles electrical equipment 20, groups of articles of electrical equipment (e.g., types of articles), geographic regions of environments 8 or environments 8 as a whole. In response, record management and reporting service 68G accesses event data based on the request. Upon retrieving the event data, record management and reporting service 68G constructs an output response to the client application that initially requested the data. In some examples, the data may be included in a document, such as an HTML document, or the data may be encoded in a JSON format or presented by a dashboard application executing on the requesting client computing device. For instance, as further described in this disclosure, example user interfaces that include the event data are depicted in the figures.

As additional examples, record management and reporting service 68G may receive requests to find, analyze, and correlate event data (e.g., event data for one or more monitoring devices 33 monitoring respective articles of electrical equipment 20). For instance, record management and reporting service 68G may receive a query request from a client application for event data 74B over a historical time frame, such as a user can view event data over a period of time and/or a computing device can analyze the event data over the period of time.

In example implementations, services 68 may also include security service 68H that authenticate and authorize users and requests with EEMS 6. Specifically, security service 68H may receive authentication requests from client applications and/or other services 68 to access data in data layer 72 and/or perform processing in application layer 66. An authentication request may include credentials, such as a username and password. Security service 68H may query security data 74E to determine whether the username and password combination is valid. Security data 74E may include security data in the form of authorization credentials, policies, and any other data for controlling access to EEMS 6. As described above, security data 74E may include authorization credentials, such as combinations of valid usernames and passwords for authorized users of EEMS 6. Other credentials may include device identifiers or device profiles that are allowed to access EEMS 6.

Security service 68H may provide audit and logging functionality for operations performed at EEMS 6. For instance, security service 68H may log operations performed by services 68 and/or data accessed by services 68 in data layer 72. Security service 68H may store audit data such as logged operations, accessed data, and rule processing results in audit data 74D. In some examples, security service 68H may generate events in response to one or more rules being satisfied. Security service 68H may store data indicating the events in audit data 74D.

In general, while certain techniques or functions are described herein as being performed by certain components, e.g., EEMS 6 or monitoring devices 33, it should be understood that the techniques of this disclosure are not limited in this way. That is, certain techniques described herein may be performed by one or more of the components of the described systems. For example, in some instances, monitoring devices 33 may have a relatively limited sensor set and/or processing power. In such instances, gateway 28 and/or EEMS 6 may be responsible for most or all of the processing of event data, determining the likelihood of a failure event, and the like. In other examples, monitoring devices 33, communication hubs 26, and/or gateways 28 may have additional sensors, additional processing power, and/or additional memory, allowing such devices to perform additional techniques. Determinations regarding which components are responsible for performing techniques may be based, for example, on processing costs, financial costs, power consumption, or the like.

Figure 3:
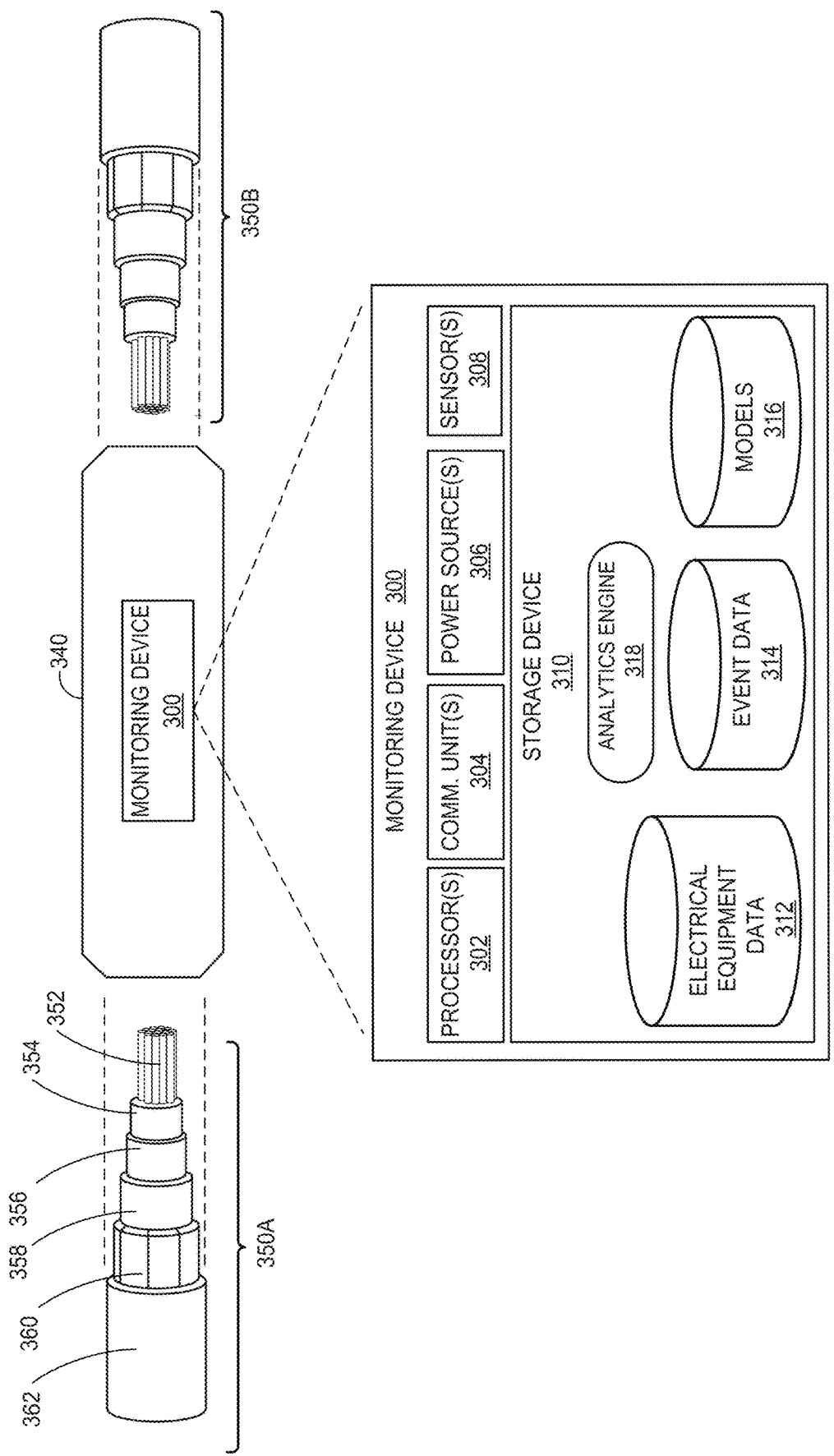
FIG. 3 is a conceptual diagram of an example cable accessory configured to electrically and physically couple two electrical cables and, in accordance with various techniques of this disclosure.

FIG. 3 is a conceptual diagram of an electrical cable accessory 340 configured to electrically and physically couple two electrical cables 350A and 350B (collectively, electrical cables 350), in accordance with various techniques of this disclosure. Cable accessory 340 may electrically and physically couple electrical cable 350A and electrical cable 350B. Cable accessory 340 may be an example of cable accessories 34 of FIG. 1 and electrical cables 350A, 350B may be examples of electrical cables 350 of FIG. 1.

In the example of FIG. 3, electrical cable 350A includes a plurality of concentric (e.g., cylindrical) layers, such as central conductor 352, conductor screen 354, insulation 356, insulation screen 358, shield 360 (also referred to as sheath 360), and jacket 362. However, in some examples, electrical cables 350 may include more or fewer layers. Electrical cable 350B may include a similar plurality of layers. It should be understood that the layers of cables 350 are not necessarily drawn to scale. Electrical cables 350 may be configured for AC and/or DC power transmission.

Electrical cables 350 may transmit voltages of 11 kV, 33 kV, 66 kV, 360 kV, as a few example voltages. In some instances, electrical cables 350 transmit electrical power between a power source and substation may transmit voltages of 360 kV or more, which may be considered a "transmission level voltage". In some examples, electrical cables 350 transmit voltages between 33 kV and 360 kV, such as 66 kV or 33 kV, which may be considered "sub-transmission-level voltages," and may provide electrical power from a power source to an end-user or customer (e.g., customers utilizing a relatively large amount of power). As another example, electrical cables 350 that transmit electrical power between a distribution substation and a distribution transformer may transmit voltages less than 33 kV, which may be considered "distribution-level voltages." Electrical cables 350 may also transmit electrical power between a distribution substation or distribution transformer (e.g., a pad-mount transformer or pole-mount transformer) and end-users or consumers (e.g., homes and businesses) and may transmit voltages between 360 volts and 240 volts, at such voltages electrical cables 350 may be called "secondary distribution lines."

Central conductor 352 includes a conductive material, such as copper or aluminum. In some examples, central conductor 352 includes a single solid conductor or a plurality of stranded conductors. A diameter or thickness of the central conductor 352 is based on the current that electrical cables 350 is designed to transmit or conduct. In other words, the cross-sectional area of central conductor 352 is based on the current that electrical cables 350 are designed to transmit. For example, central conductor 352 may be configured to transmit currents of 1,000 amperes or more.

Conductor screen 354 may include a semi-conductive polymer, such as carbon black loaded polymer. The semi-conductive polymer may have a bulk resistivity in a range from approximately 5 to approximately 100 ohm-cm. Conductor screen 354 may be physically and electrically coupled to central conductor 352. In the example of FIG. 3, conductor screen 354 is disposed between central conductor 352 and insulation 356. Conductor screen 354 may provide a continuous conductive surface around the exterior of central conductor 352, which may reduce or eliminate sparking that might otherwise be created by central conductor 352.

In some examples, insulation 356 includes polyethylene, such as a cross-linked polyethylene (which may be abbreviated as PEX, XPE, or XLPE) or an ethylene propylene rubber (which may be abbreviated as EPR). A diameter or thickness of the insulation 356 is based on the voltage that electrical cables 350 is designed to transmit or conduct.

Insulation screen 358 may include a semi-conductive polymer similar to conductor screen 354. In the example of FIG. 3, insulation screen 358 is disposed between insulation 356 and shield 360. Insulation screen 358 may be coupled to insulation 356. In some examples, insulation screen 358 is electrically coupled to shield 360.

Shield 360 may include a conductive material, such as a metal foil or film or wires. In some examples, shield 360 may be referred to as a "earth ground conductor."

As illustrated in FIG. 3, jacket 362, also referred to as an "oversheath," is an outer layer of electrical cables 350. Jacket 362 may be a plastic or rubber polymer, such as polyvinyl chloride (PVC), polyethylene (PE), or ethylene propylene diene monomer (EPDM).

Electrical cables 350 may include additional layers, such as a swellable or water blocking material placed within the conductor strands (e.g., a strand fill) or between various layers within electrical cables 350.

According to aspects of this disclosure, cable accessory 340 includes a monitoring device 300 configured to monitor the health of cable accessory 340, cable, and/or electrical equipment (e.g., equipment near accessory 340). Monitoring device 300 may be an example of monitoring devices 33 of FIG. 1. In some examples, monitoring device 300 includes at least one processor 302, a communication unit 304, a power source 306, one or more sensors 308, and a storage device 310. FIG. 3 illustrates one example of a cable accessory 340. Many other examples of cable accessory 340 may be used in other instances and may include a subset of the components included in example cable accessory 340 or may include additional components not shown example cable accessory 340 in FIG. 3.

Cable accessory 340 includes one or more power sources 306 to provide power to components shown in cable accessory 340. In some examples, power sources 306 include a primary power source to provide electrical power and a secondary, backup power source to provide electrical power if the primary power source is unavailable (e.g., fails or is otherwise not providing power). In some examples, power source 306 includes a battery, such as a Lithium Ion battery. As another example, power source 306 may include a power harvesting device or circuit configured to derive power from an external source. Power source 306 may include a power harvesting circuit configured to harvest power from electrical cables 350. For example, electrical cables 302 generate a magnetic field when current flows through electrical cables 302. Power source 306 may include a circuit that generates a current based on the magnetic field, such that the current generated by power source 306 may provide electrical power to monitoring device 300. In some examples, power source 306 may include a piezoelectric power harvesting device, thermoelectric power harvesting device, photovoltaic harvesting device, or any other power harvesting device.

One or more processors 302 may implement functionality and/or execute instructions within cable accessory 340. For example, processors 302 may receive and execute instructions stored by storage device 310. These instructions executed by processors 302 may cause cable accessory 340 to store and/or modify information, within storage devices 310 during program execution. Processors 302 may execute instructions of components, analytics engine 318, to perform one or more operations in accordance with techniques of this disclosure. That is, analytics engine 318 may be operable by processor 302 to perform various functions described herein.

One or more communication units 304 of cable accessory 340 may communicate with external devices by transmitting and/or receiving data. For example, cable accessory 340 may use communication units 304 to transmit and/or receive radio signals on a radio network such as a cellular radio network. Examples of communication units 304 include a network interface card (e.g. such as an Ethernet card), an optical transceiver, a radio frequency transceiver, a GPS receiver, or any other type of device that can send and/or receive information. Other examples of communication units 304 may include Bluetooth®, GPS, cellular (e.g., 3G, 4G), LPWAN, and Wi-Fi® radios. As another example, the communications unit 304 may communicate with external devices by transmitting and/or receiving data via wired communication.

Communication units 304 may be configured to send and receive data via electrical cables 350 using power line communication (PLC) techniques. Communications unit 304 may enable power line communications over narrow-band frequencies (e.g., approximately 500 kHz or lower) or broadband frequencies (e.g., approximately 1 MHz or higher). In contrast to utilizing inductive coupling (which may be costly, heavy, and challenging to install), communication unit 304 may include a capacitive coupling circuit to inject data into, and extract data from, electrical cables 350.

Monitoring device 300 includes one or more sensors 308 configured to generate sensor data that is indicative of one or more conditions of cable accessory 340. Examples of sensors 308 include temperature sensors (e.g., internal and/or external to the cable accessory), partial discharge sensors, voltage and/or current sensors, among others. Sensors 308 may be attached on, inside, or near the cable accessory 340.

In some examples, sensors 308 include one or more temperature sensors, such as an internal temperature sensor to monitor the temperature inside cable accessory 340 and/or an external temperature monitor to monitor the temperature outside or on the surface of cable accessory 34. Sensors 308 may include a partial discharge sensor to detect partial discharges within cable accessory 340. As another examples, sensors 308 may include a voltage and/or current sensor configured to measure the phase and/or magnitude of the voltage or current in cable accessory 340.

One or more storage devices 310 may store information for processing by processors 302. In some examples, storage device 310 is a temporary memory, meaning that a primary purpose of storage device 310 is not long-term storage. Storage device 310 may be configured for short-term storage of information as volatile memory and therefore not retain stored contents if deactivated. Examples of volatile memories include random access memories (RAM), dynamic random access memories (DRAM), static random access memories (SRAM), and other forms of volatile memories known in the art.

Storage device 310 may, in some examples, also include one or more computer-readable storage media. Storage device 310 may be configured to store larger amounts of information than volatile memory. Storage device 310 may further be configured for long-term storage of information as non-volatile memory space and retain information after activate/off cycles. Examples of non-volatile memories include, flash memories, or forms of electrically programmable memories (EPROM) or electrically erasable and programmable (EEPROM) memories. Storage device 830 may store program instructions and/or data associated with components such as analytics engine 318.

In the example of FIG. 3, storage devices 310 include electrical equipment data repository 312, event data repository 314, models repository 316, and analytics engine 318. Data repositories 312, 314, and 316 may include relational databases, multi-dimensional databases, maps, and hash tables, or any data structure that stores data. In some examples, electrical equipment data repository 312 may be similar to, and may include data similar to, electrical equipment data repository 74A of FIG. 2. Likewise, event data repository 314 may be similar to, and may include data similar to, event data 74B as described in FIG. 2.

According to aspects of this disclosure, analytics engine 318 may be operable by one or more processors 302 to perform one or more actions based on the sensor data generated by sensors 308. Analytics engine 318 may be similar to and may include all or a subset of the functionality of, stream analytics engine 68F of FIG. 2.

In some examples, analytics engine 318 may determine a health of cable accessory 340 based at least in part on the sensor data generated by one or more of sensors 308. For example, analytics engine 318 may apply one or more rules (e.g., stored within models repository 316) to the sensor data generated by one or more of sensors 308 to determine the health of cable accessory 340. The rules may be preprogrammed or learned, for example, via machine learning. According to some examples, models data store 316 includes rules trained based at least in part on event data collected from a plurality of cable accessories 34 and known failure events. In such examples, analytics engine 318 may train the one or more models in models repository 316 based on event data within event data repository 314. As another example, monitoring device 300 may receive data representing one or more models from EESR 6 of FIGS. 1 and 2 and may store the models in models repository 316.

Analytics engine 318 may determine the health of cable accessory 340 by predicting, based at least in part on the rules and the sensor data, whether cable accessory 340 will experience a failure event within a predetermined amount of time. For instance, analytics engine 318 may predict whether cable accessory 340 will fail within a predetermined amount of time by applying one or more models of models repository 316 to the sensor data. As one example, analytics engine 318 may apply models of models repository 316 to sensor data stored in event data repository 314. For example, analytics engine 318 may receive temperature data from a temperature sensor indicating a temperature within cable accessory 340 and apply models of models repository 316 to the temperature data. Analytics engine 318 may determine, based on the temperature data and models of models repository 316, that the temperature is within a normal temperature range, such that analytics engine 318 may determine that the health of cable accessory 340 is nominal, or normal. As another example, analytics engine 318 may apply models of models repository 316 to temperature data from a temperature sensor 308 and current data from a current sensor 308. For example, temperature alone may not be indicative of failure of cable accessories 34 because the temperature may increase as current increases. However, temperature and current may be indicative of potential cable accessory failures, for example, if the measured temperature is relatively high even when electrical cables 350 are carrying relatively little current. Thus, in some examples, analytics engine 308 may apply models of models repository 316 to temperature data and current data to determine the health of cable accessory 340.

In some examples, analytics engine 318 applies models of models repository 316 to event data repository 314 and other data, such as data within electrical equipment data repository 312. For example, analytics engine 318 may apply one or more models of models repository 316 to temperature data for cable accessory 340 that is stored within event data repository 314 and data stored within electrical equipment data repository 312 that indicates a type of cable accessory 340 to predict whether cable accessory 340 will experience a failure event (e.g., fail to conduct electrical power) within a predetermined amount of time.

Analytics engine 318 may perform various actions based on the health of cable accessory 340. For example, analytics engine 318 may output a notification (e.g., to EEMS 6) that includes data representing the health of cable accessory 340. For instance, the notification may indicate cable accessory 340 is operating normally. As another example, analytics engine 318 may output a notification indicating that cable accessory 340 is predicted to fail within a predetermined amount of time or indicating a time by which the cable accessory 340 is predicted to fail.

Figure 4:
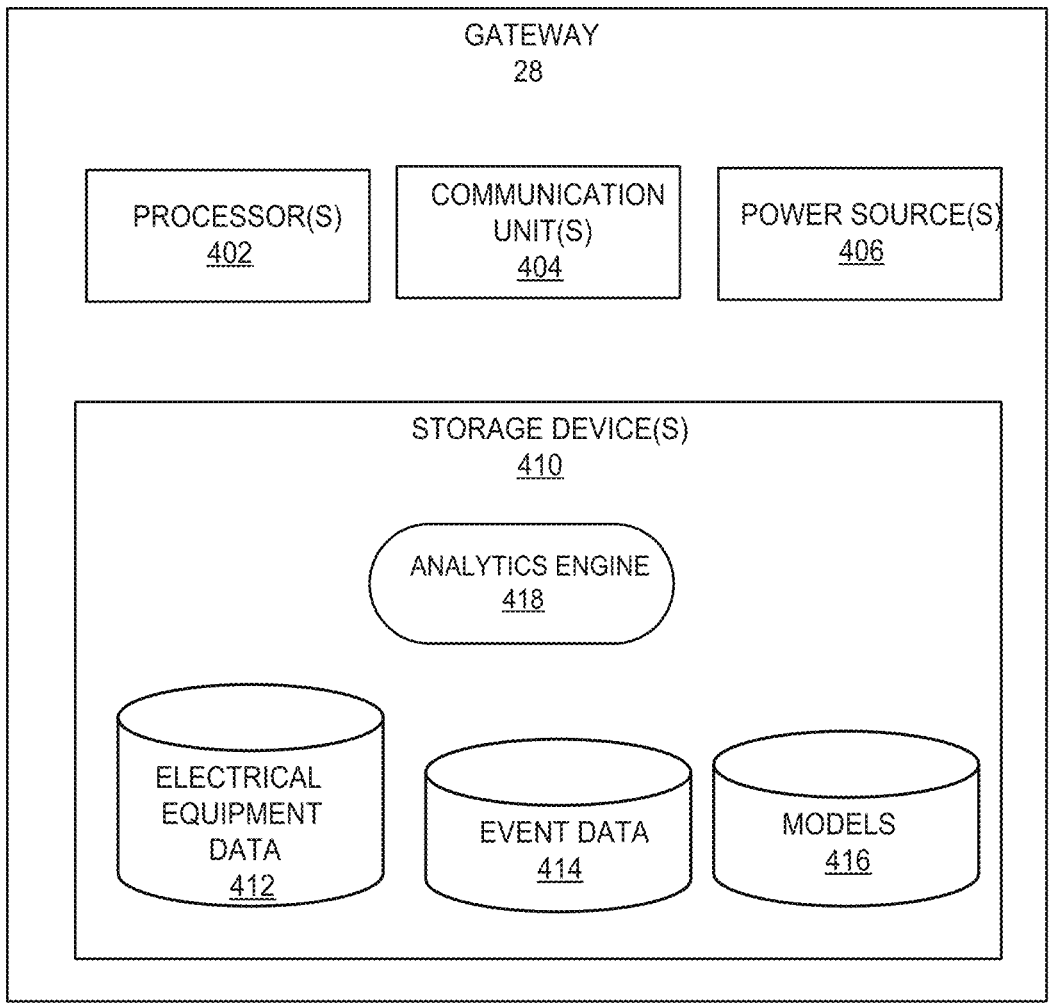
FIG. 4 is a block diagram illustrating an example gateway that is configured to communicate with a cable accessory and EEMS, in accordance with various techniques of this disclosure.

FIG. 4 is a block diagram illustrating an example gateway 28 that is configured to communicate with a cable accessory 34A and EEMS 6, in accordance with various techniques of this disclosure. FIG. 4 illustrates only one particular example of gateway 28. Many other examples of gateway 28 may be used in other instances and may include a subset of the components illustrated in FIG. 4 and/or may include additional components not shown in FIG. 4.

As shown in FIG. 4, gateway 28 includes one or more processors 402, one or more communication units 404, one or more power sources 406, and one or more storage devices 410. Processors 402, communication units 404, power sources 406, and storage components 410 may be similar to and include functionality similar to processors 302, communication units 304, power sources 306, and storage components 310 of FIG. 3. Thus, a description of processors 402, communication units 404, power sources 406, and storage components 410 is omitted for brevity.

Gateway 28 may receive event data from a plurality of cable accessories 34 of one or more lines 24. The event data received by gateway 28 may include data indicative of sensor data generated by sensors of the respective monitoring devices (e.g., monitoring cable accessories), such as all or part of the sensor data, a summary of the sensor data, and/or analysis results based on the sensor data. Gateway 28 may store all or a subset of the event data in event data repository 414. In some examples, gateway 28 may receive notification from one or more cable accessories indicating a health status of the respective cable accessories 34.

Gateway 28 may act as an intermediary between monitoring devices 33 and EEMS 6. For example, gateway 28 may receive notifications from monitoring devices 33 and may send the notification to EEMS 6. As another example, gateway 28 may receive data from EEMS 6. For instance, gateway 28 may receive firmware updates from EEMS 6, and may send the firmware updates from EEMS 6 to monitoring devices 33. In some instances, gateway 28 may receive (e.g., from EEMS 6, monitoring devices 33, or both) equipment data for a plurality of cable accessories 34, installation data, manufacturing data, etc., and may store the equipment data in electrical equipment data repository 412.

In some examples, analytics engine 418 determines a health of respective one or more articles of electrical equipment 20 (e.g., cable accessories 34) based at least in part on the event data within event data repository 414. Analytics engine 418 may apply one or more rules to the event data to determine the health of respective cable accessories of cable accessories 34. The rules may be preprogrammed or learned. The rules may be stored within models repository 416. In some examples, analytics engine 418 may train one or more machine learning models based on event data within event data repository 414 and known failure events, and may store the trained models with models repository 416. As another example, gateway 28 may receive the rules from monitoring devices 33 or EEMS 6.

Analytics engine 418 may apply the rules to the event data to determine a health of one or more articles of electrical equipment 20, such as cable accessories 34. For example, analytics engine 418 may determine the health of cable accessory 34A by predicting whether cable accessory 34A will fail within a predetermined amount of time or predicting a remaining lifespan of cable accessory 34A.

Gateway 28 may output data to EEMS 6. In some examples, gateway 28 sends all or a portion of the event data from monitoring devices 33 to EEMS 6. As another example, gateway 28 may send notifications (e.g., generated by monitoring devices 33 and/or gateway 28) to EEMS 6. For instance, gateway 28 may output a notification indicating the remaining lifespan of a particular article of electrical equipment (e.g., cable accessory 34A) is less than a threshold amount of time or indicating the particular article of electrical equipment is predicted to fail.

Figure 5:
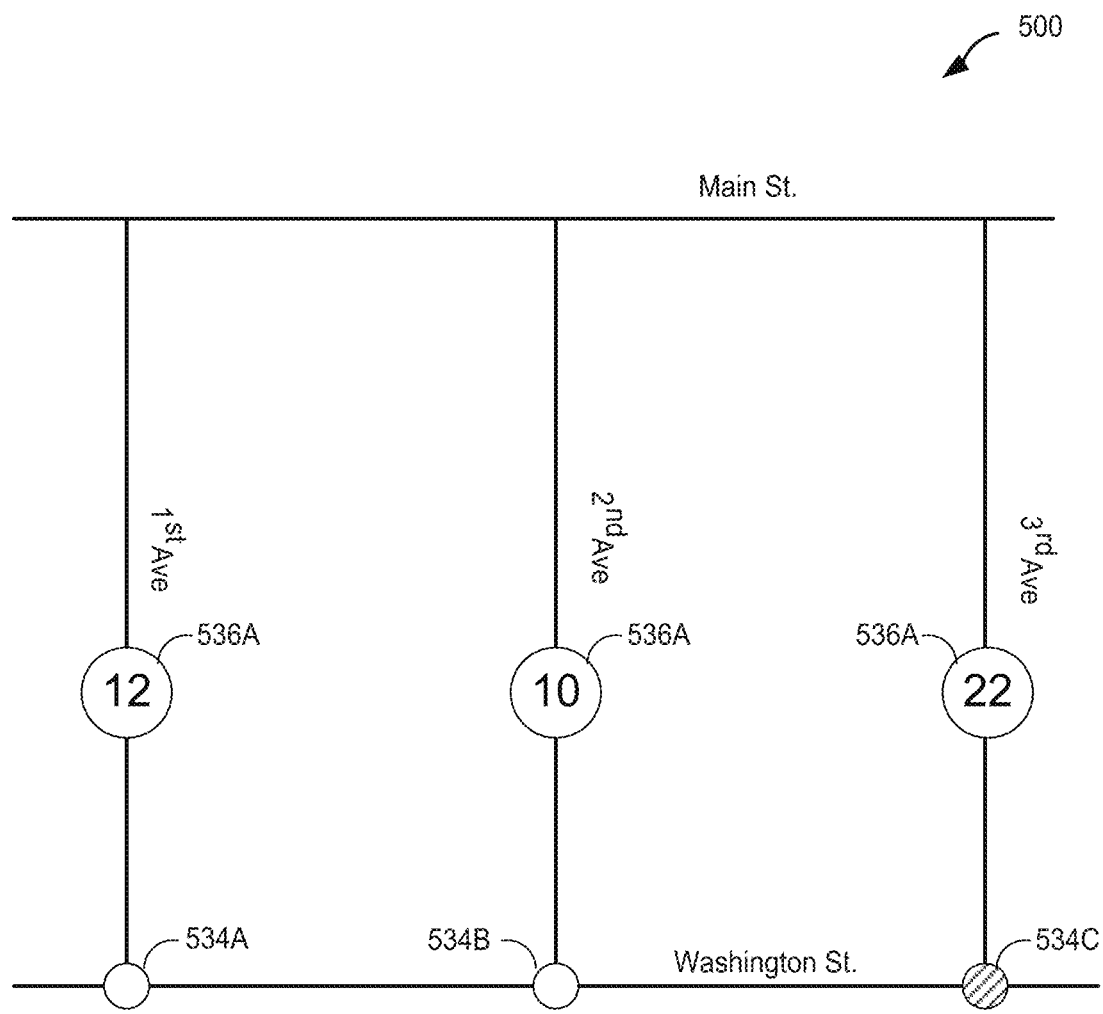
FIG. 5 is an example graphical user interface of the electrical equipment management system, in accordance with techniques of this disclosure.

FIG. 5 is an example graphical user interface on computing devices 16 of the electrical equipment management system 2 in FIG. 1, in accordance with techniques of this disclosure. FIG. 5 is described with reference to electrical equipment management system 6 as described in FIGS. 1 and 2.

EEMS 6 may output a graphical user interface 500 representing an environment, such as environment 8B, that includes a plurality of articles of electrical equipment. In the example of FIG. 5, the articles of electrical equipment illustrated by graphical user interface 500 are described as cable accessories, however graphical user interface 500 may represent different types of electrical equipment. In the example of FIG. 5, graphical user interface 500 include a graphical element (e.g., an icon, symbol, text, or other graphical element) for each respective cable accessory of a plurality of cable accessories within the environment. For example, graphical user interface 500 includes graphical icons 534A-534C, which each represent a respective cable accessory of cable accessories 34 of FIG. 1.

Graphical user interface 500 may output data indicating the health of respective cable accessories. For example, graphical user interface 500 may include a legend 502 with different graphical elements representing different levels of health. In the example of FIG. 5, graphical elements 534A and 534B indicate that the health of the cable accessories represented by the respective graphical elements 534A, 534B is "normal." A normal health may indicate that the respective cable accessories are not predicted to fail within a threshold amount of time or are operating within typical operating parameters (e.g., within an expected temperature range, are experiencing a typical quantity of partial discharge events, etc.). As shown in the example of FIG. 5, graphical element 534C indicates the health of the cable accessory (e.g., cable accessory 34C of FIG. 1) corresponding to graphical element 534C is not normal. In some examples, graphical element 534C may indicate cable accessory 34C is predicted to fail within a threshold amount of time.

In some examples, graphical user interface 500 may include additional data, such as a map indicating the location of one or more cable accessories. For example, graphical user interface 500 may include graphical elements 536A-536C indicating a number of customers (e.g., homes) served by the cable accessory.

Graphical user interface 500 may enabling users 18 of computing devices 16 to select a graphical element to receive additional information for the graphical element. For example, one or more computing devices 18 may output graphical user interface 500 and may receive a user input selecting graphical element 534C. Responsive to receiving data indicating the user selected graphical element 534C, EEMS 6 may output to computing devices 18 additional information for the corresponding cable accessory, such as data indicating the date of installation, location, type of cable accessory, quantity of customers served by the cable accessory, as a few examples. Further, EEMS 6 enable user 16 of computing device 18 to schedule maintenance or replacement of cable accessory 34C, order parts, re-route electrical power or otherwise adjust an operation of the grid, among others.

Figure 6:
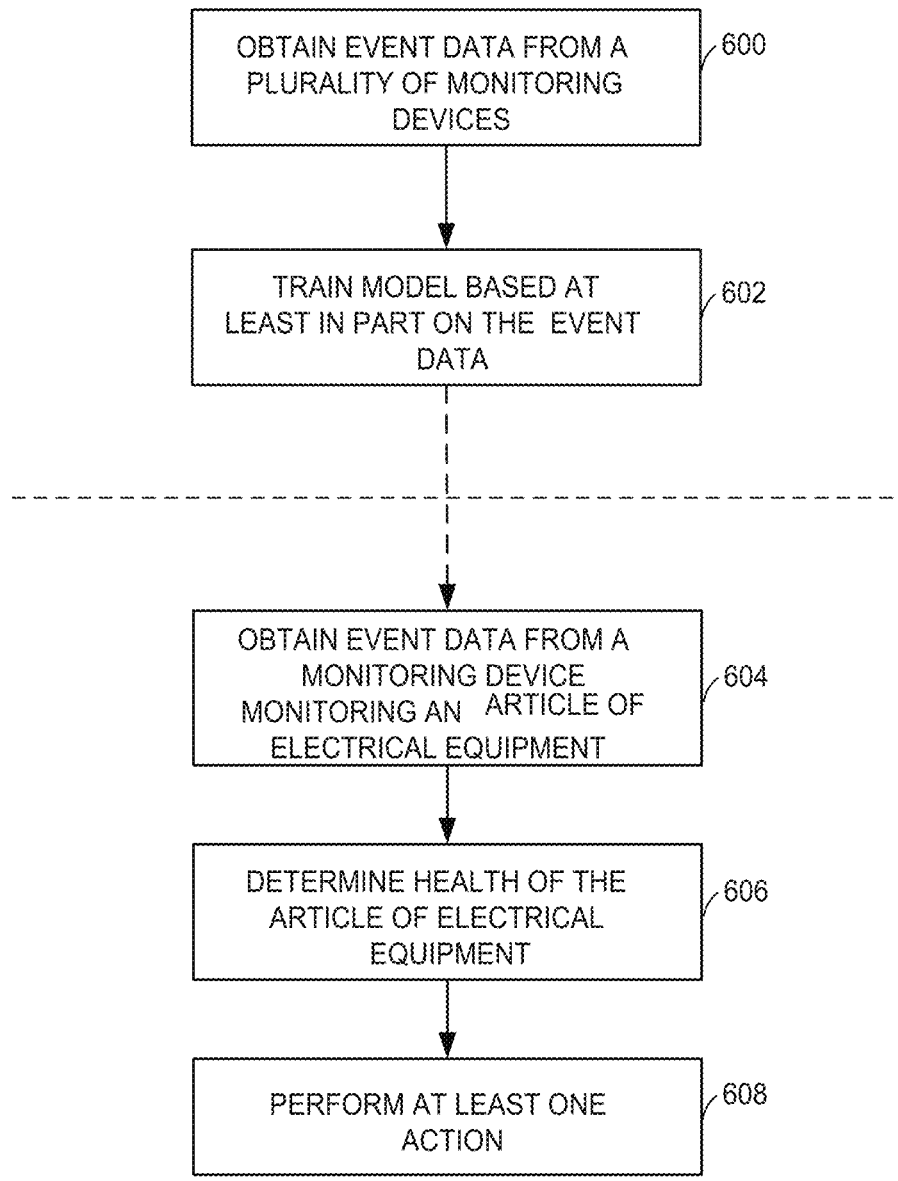
FIG. 6 is a flow chart illustrating example operations performed by one or more computing devices that are configured to monitor electrical utility equipment, in accordance with various techniques of this disclosure.

FIG. 6 is a flow chart illustrating example operations performed by one or more computing devices that are configured to monitor electrical utility equipment, in accordance with various techniques of this disclosure. FIG. 6 is described with reference to the system described in FIGS. 1 and 2.

One or more computing devices, such as computing devices of EEMS 6 and/or processors of gateways 28, hubs 26 or monitoring devices 33, may obtain a first set of event data, referred to as training event data, from a plurality of cable accessories 34 (600). For example, the training event data may be obtained for training one or more learning models prior to deploying models for use within EEMS 6 and/or other devices, such as gateways 28, hubs 26 or monitoring devices 33. The training data may, for example, comprise known (i.e., previously identified, also referred as "labelled") failure events and associated sensed data. As another example, monitoring device 33A monitoring cable accessory 34A may receive event data from sensors of respective monitoring devices 33 monitoring cable accessories 34 within environment 8B for real-time training and improvement of the models. In some instances, the sensors of the respective monitoring devices 33 include temperature sensors, voltage sensors, partial discharge sensors, among others. According to some examples, each of monitoring devices 33 may output the training event data to gateway 28, EEMS 6, or both. The training event data may include data indicative of the sensor data (e.g., all or a subset of the sensor data, analysis results based on the sensor data, a summary of sensor data, etc.), equipment data, manufacturing data, installation data, consumer data, power distribution data, or a combination therein.

Responsive to receiving the training event data, one or more computing devices may train a model based at least in part on the event data from cable accessories 34 (602). For example, monitoring devices 33, gateway 28, and/or EEMS 6 may utilize machine learning techniques to train a model that receives training event data as input and outputs a predicted health of one or more articles of electrical equipment 20, such as electrical cables 350, cable accessories 34, or power delivery nodes 22. The one or more computing devices may train the model or models using supervised, unsupervised, or semi-supervised learning. According to some examples, the one or more computing devices may train one or more models based on known failure events. For example, EEMS 6 may apply a plurality of training event data corresponding to known failure events to generate one or more models used to predict a future failure event of a particular cable accessory when EEMS 6 subsequently receives event data for the particular cable accessory. In some examples, EEMS 6 may output one or more models to one or more cable accessories 34 or gateways 28. As another example, monitoring devices 33 and/or gateways 28 may train the models, and may output the models to other monitoring devices, gateways 28, or EEMS 6.

After training the one or more models, in some examples, one or more computing devices may receive a second set of event data, referred to as operational event data, from a particular monitoring device, such as monitoring device 33A monitoring cable accessory 34A (604). For example, monitoring device 33A may receive operational event data, including sensor data from sensors of monitoring device 33A. As another example, monitoring device 33A may output the operational event data to another monitoring device, gateway 28 and/or EEMS 6. Examples of event data include data indicative of sensor data generated by one or more sensors, such as data indicative of the partial discharge data generated by partial discharge sensors of FIGS. 7-15. The data indicative of the sensor data may include all or a portion of the sensor data (e.g., partial discharge data), a summary of the sensor data, analysis data (e.g., data indicating conclusions or results of analyses performed on the sensor data), or a combination therein. Event data may include device data for article of electrical equipment, including partial discharge sensors of FIGS. 7-15. Device data may include identification data, device type data, event timestamps, location data, installation data, manufacturing data, consumer data, power distribution data, among others.

One or more computing devices determine a health of cable accessory 34A based at least in part on the operational event data (606). In some examples, monitoring device 33A, 33B, or 33C, gateway 28, EEMS 6, or a combination therein may apply one or more models to the operational event data from monitoring device 33A to determine a health of cable accessory 34A. For example, monitoring device 33A may determine the health of cable accessory 34A locally or EEMS 6 may determine the health status of cable accessory 34.

Responsive to determining the health of cable accessory 34A, one or more computing devices perform at least one action (608). In some examples, monitoring device 33A performs an action by outputting a notification to EEMS 6 indicating the health of cable accessory 34A. For example, the notification may include data indicating that cable accessory 34A is predicted to fail within a predetermined amount of time. Similarly, gateway 28 and/or EEMS 6 may output a notification indicating the health of cable accessory 34A. As another example, EEMS 6 may perform an action by outputting, to one of computing devices 18, data corresponding to a graphical user interface that indicates a health of cable accessory 34A, such that one of computing devices 18 may display the graphical user interface. As yet another example, EEMS 6 schedule maintenance or replacement of cable accessory 34A.

Figure 7A:
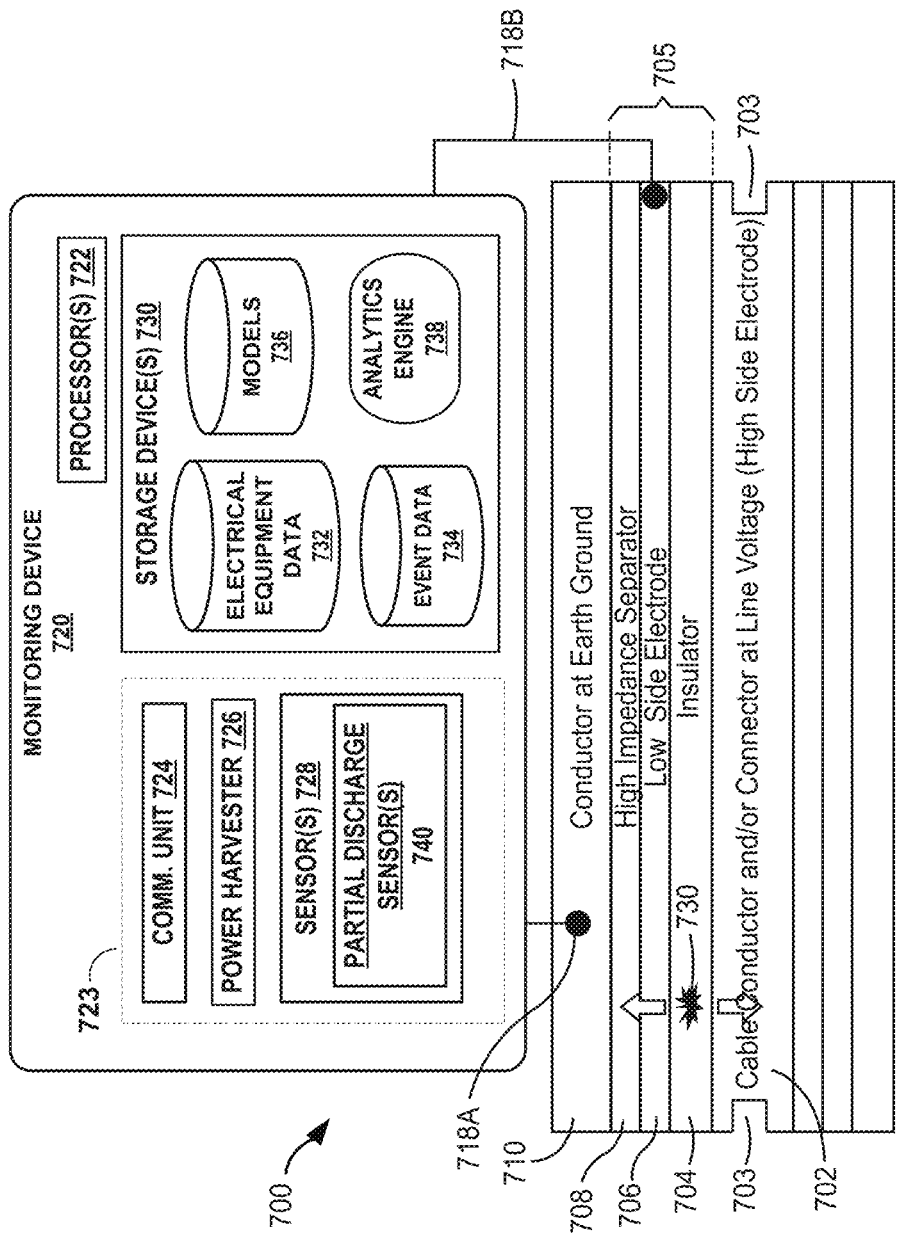
FIGS. 7A-7D are conceptual diagrams illustrating example cable accessories, in accordance with one or more aspects of this disclosure.
Figure 7B:
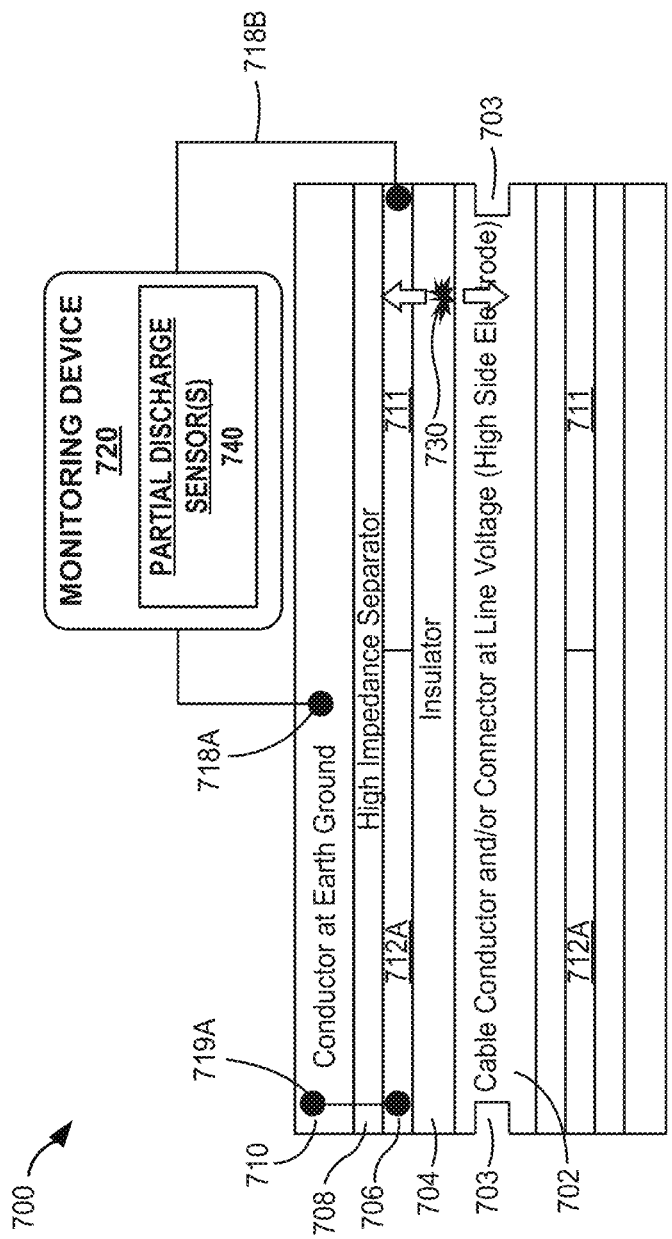

FIGS. 7A-7D are conceptual diagrams illustrating example cable accessories, in accordance with one or more aspects of this disclosure. FIGS. 7A-7D illustrates a plane view through a center of cable accessory 700 that includes a monitoring device 720. Cable accessory 700 may be an example of cable accessories 34 of FIG. 1. In the example of FIGS. 7A-7B, cable accessory 700 includes a monitoring device 720 and a plurality of generally concentric layers, such as connector 702, insulator 704, low side electrode 706, separator 708, ground conductor 710. In some examples, insulator 704, low side electrode 706, and separator 708, may collectively be referred to as a splice body 705, and may generally be coaxial with one another. It should be understood that the layers of cable accessory 700 are not necessarily drawn to scale. Cable accessory 700 may include fewer layers or additional layers not shown here.

Connector 702, which may also be referred to as a high side electrode, may include a cylindrical body having a surface at a first end of the cylindrical body and a surface at a second end of the cylindrical body, the second end opposite the first end. The cylindrical body may include an outer surface connecting the first end and the second end of the cylindrical body. Each end of the cylindrical body may be configured to receive a respective electrical cable (e.g., electrical cable 32 of FIG. 1). For example, the first end and the second end of connector 702 may each include an aperture 703 configured to receive an electrical cable (e.g., central conductor 352 of electrical cables 350 of FIG. 3, or central conductor 352 and conductor screen 354 of electrical cables 350 of FIG. 3). Apertures 703 may extend the entire length of connector 702, such that connector 702 includes a single aperture 703 or hollow region traversing from the surface at the first end of connector 702 to the surface of the second end of connector 702. As such, an installer coupling two electrical cables together may insert a first electrical cable into an aperture 703 at a first end of connector 702 and a second electrical cable into an aperture 703 at a second end of connector 702 to electrically couple the electrical cables.

In some examples, connector 702 includes a conductive material, such steel or aluminum. A diameter or thickness of the connector 702 may be based on the current that cable accessory 700 is designed to transmit or conduct and/or the gauge of electrical cables 350 that cable accessory 700 is configured to couple or connect. Connector 702 may couple two or more electrical cables 350 to conduct electrical power between a power utility and one or more consumers. In such examples, connector 702 may conduct electrical power at a line voltage, which may be called a mains voltage. In other words, the voltage transmitted by connector 702 may equal to the voltage transmitted by the power utility or a fraction of the voltage transmitted by the power utility (e.g., as stepped up or down by one or more power deliver nodes located between the power utility and cable accessory 700).

Insulator 704 may include a cylindrical tube made of an insulating material, such as an elastomeric rubber (e.g., ethylene propylene diene monomer (EPDM)). In some examples, a diameter or thickness of the insulator 704 is based on the voltage that cable accessory 700 and/or electrical cables 350 are designed to transmit or conduct.

Low side electrode 706 includes, in some examples, a semi-conductive material, such as a carbon filled polymer that matches the polymer used in the main cable insulation (e.g., a crosslinked polyethylene or ethylene propylene rubber (EPR) material). In some example, low side electrode 706 may be a conductive film deposited on an outer surface of insulator 704. Low side electrode 706 may include an electrically floating surface. In other words, in some examples, low side electrode 706 may be electrically isolated from connector 702 and ground conductor 710. Stated another way, low side electrode 706 may be at a different potential than connector 702 and ground conductor 710. For example, AC voltage in connector 702 generates an electric field which will create an AC voltage in low side electrode 706.

Figure 7C:
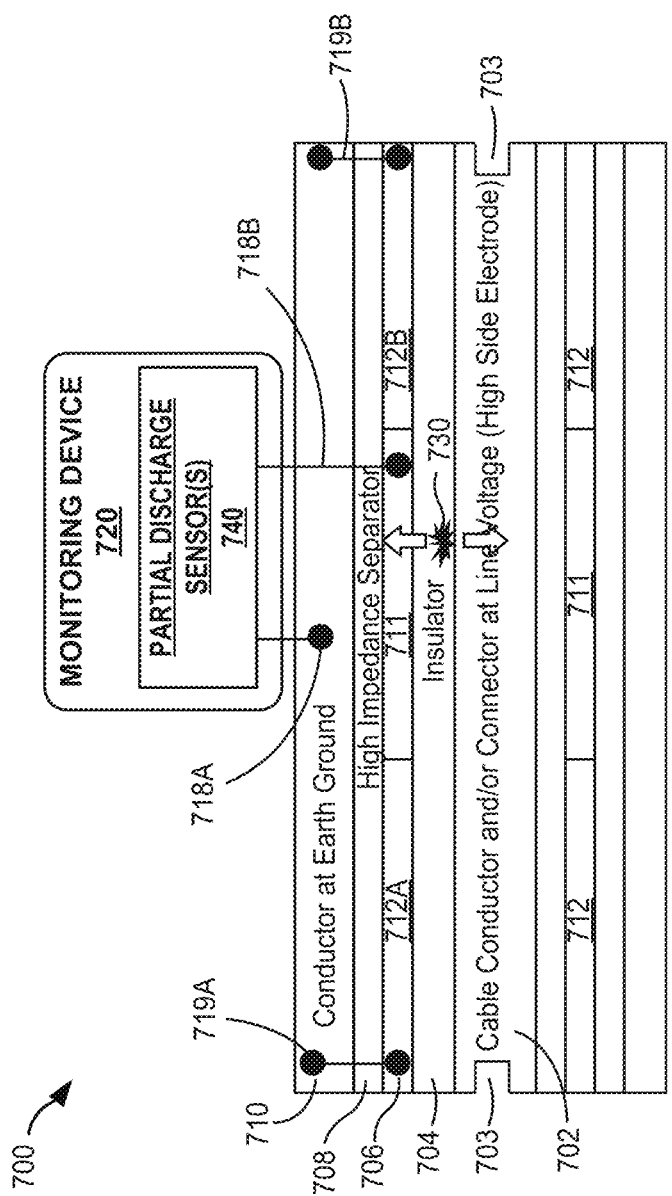
Figure 7D:
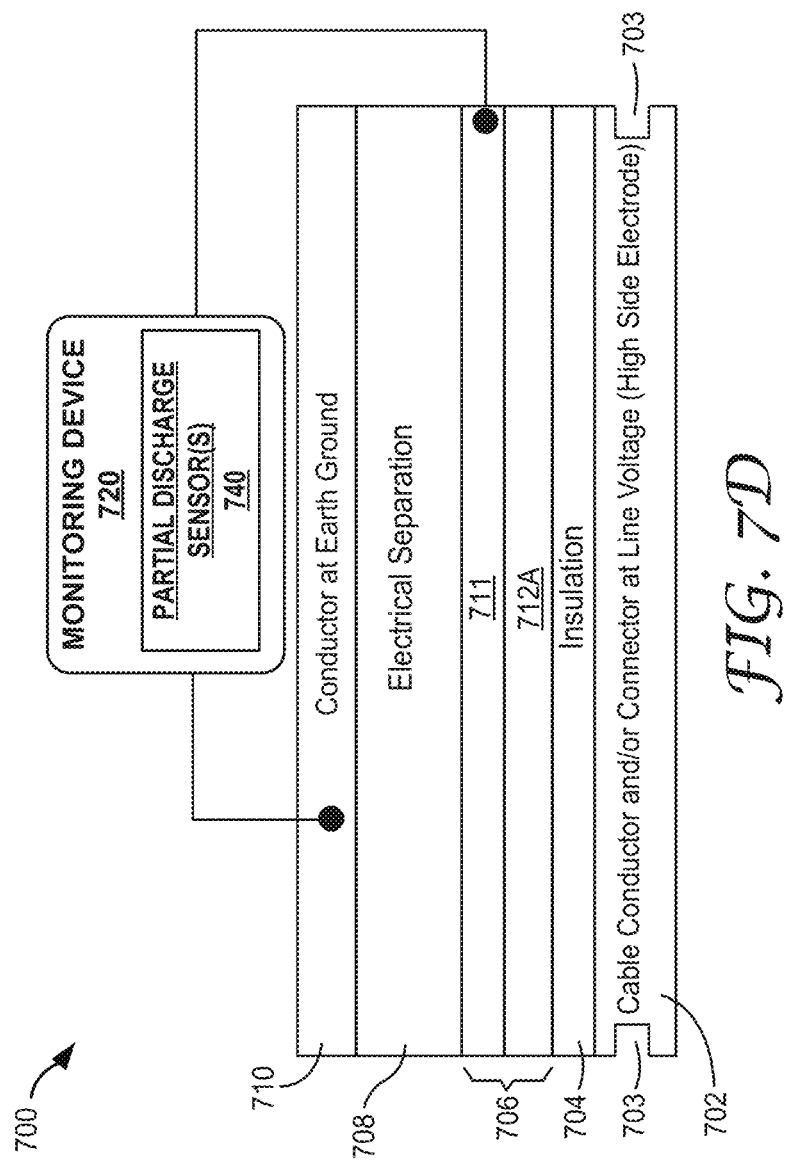

In the example of FIG. 7A, low side electrode 706 includes a single region that include a semi-conductive material. As illustrated in FIGS. 7B, 7C, and 7D, low side electrode 706 may include different regions, such as low resistance region 711 and high resistance region 712A. In the example of FIG. 7B, low side electrode 706 includes at least one low resistance region 711 and a plurality of high resistance regions 712A, 712B. Low resistance region 711 includes a semi-conductive or conductive material, such as a metal (e.g., copper, aluminum) contact, spring, sheet, foil, or mesh. High resistance regions 712 may include materials such as a crosslinked polyethylene or EPR material. For example, high resistance regions 712 may include a semi-conductive polymer (e.g., conductive particle loaded polymer), intrinsically conductive polymer, or very thin conductive layer (e.g., metal, graphite, or other thin conductor). Semi-conductive polymers may include conductive particles, such as carbon black, in a polymer matric such as silicone, EPDM, polyethylene, EVA copolymer, among others. As illustrated in FIG. 7A-7B, the high resistance regions 712 may be electrically coupled to ground layer 710 via electrical connections 719. For example, high resistance region 712A may be electrically coupled to ground layer 710 via electrical connection 719A and high resistance region 712B may be electrically coupled to ground layer 710 via electrical connection 719B. However, because high resistance regions 712 have a relatively high resistance compared to other regions of low side electrode 706, current generated by partial discharge event 730 may flow through monitoring device 720 to ground layer 710. In some examples, electrical connection 719A may be a physical connection of high resistance region 712A with ground layer 710.

Ground conductor 710, which may also be referred to as conductor at earth ground 710. Ground conductor 710 may include a conductive material, such as copper or aluminum. In some examples, ground conductor 710 may include a wire mesh disposed on the exterior of cable accessory 700. During installation of cable accessory 700 (e.g., while coupling two electrical cables together), ground conductor 710 may be electrically coupled to shield 360 of FIG. 3.

In accordance with techniques of this disclosure, cable accessory 700 includes a separator 708, also referred to as high impedance separator 708, disposed between low side electrode 706 and ground conductor 710. Separator 708 may include an insulating material or relatively high resistance material that is not a perfect insulator. Separator 708 may electrically isolate low side electrode 706 and ground conductor 710. As described in more detail below, separating low side electrode 706 and ground conductor 706 may enable monitoring device 720 to determine an health of cable accessory 700 (e.g., via sensors monitoring the different layers to detect partial discharge events or monitor different temperatures, voltages, and/or currents in low side electrode 706 and ground conductor 710), harvest power from electrical cables 350, communicate with other computing devices (e.g., EEMS 6) via power line communication, or a combination therein. For example, by separating low side electrode 706 and ground conductor 710 via separator 708, current may flow from low side electrode 706 through monitoring device 720 to ground conductor 710, in contrast to electrical cables and cable accessories where low side electrode 706 and ground conductor 710 are directly coupled and short circuit any devices coupled to the low side electrode 706.

Cable accessory 700 includes monitoring device 720. Monitoring device 720 may be an example of monitoring device 300 of FIG. 3. Monitoring device 720 is electrically coupled to low side electrode 706 and ground conductor 710. In some examples, monitoring device 720 is physically disposed between low side electrode 706 and ground conductor 710. However, in some examples, monitoring device 720 may be located in other locations, for example, on an exterior of cable accessory 700. Monitoring device 720 may be electrically coupled to ground conductor 710 via electrical connection 718A and to low side electrode 706 or a low resistance region 711 of low side electrode 706 via electrical connection 718B.

As illustrated in FIG. 7A, in some examples, monitoring device 720 may include one or more processors 722 and one or more storage devices 730. In the example of FIG. 7, storage devices 730 include electrical equipment data repository 732, event data repository 734, models repository 736, and analytics engine 738. Data repositories 312, 314, and 316 may include relational databases, multi-dimensional databases, maps, and hash tables, or any data structure that stores data. In some examples, electrical equipment data repository 732, event data repository 734, models repository 736, and analytics engine 738 may be similar to electrical equipment data repository 312, event data repository 314, models repository 316, and analytics engine 318 of monitoring device 300 of FIG. 3. Processors 722 may receive and execute instructions stored by storage device 730. These instructions executed by processors 722 may cause cable accessory 700 to store and/or modify information, within storage devices 730 during program execution. Processors 722 may execute instructions of components, analytics engine 738, to perform one or more operations in accordance with techniques of this disclosure. That is, analytics engine 738 may be operable by one or more processors 722 to perform various functions described herein.

As illustrated in FIG. 7A, monitoring device 720 includes one or more devices or circuits 723 which may be selectively coupled (e.g., electrically coupled) to low side electrode 7. Devices 723 may include one or more communications units 724, power harvester device 726, one or more sensors 728, or a combination therein. In the example of FIGS. 7B and 7C, communication units 723, power harvester 726, processors 722, and storage devices 730 are omitted for clarity but may be included as illustrated in FIG. 7A. Sensors 728 may include temperature sensors (e.g., internal and/or external to the cable accessory), partial discharge sensors, voltage and/or current sensors, among others. The sensors 728 may be attached on, inside, or near the cable accessory 700. Power harvester device 726 may harvest power from a transmission line to power one or more devices 723 of cable accessory 700, such as communications unit 724 or processors 722. In some examples, power harvester 726 may capacitively harvest power from the transmission line (e.g., transmission line 24A of FIG. 1) to provide electrical current to monitoring device 720. Communication units 724 may, in some examples, may send and receive data over transmission lines 24 of FIG. 1 using power line communication techniques.

In some examples, multiple devices 723 may utilize low side electrode 706. For example, devices 723 may utilize low side electrode 726 by dividing the time each device 723 is coupled to low side electrode 706, by sampling at different frequencies simultaneously, or a combination therein. Table 1 illustrates example frequencies that may be utilized for various functions of devices 723.

TABLE 1

| Function | Frequency Range |
| --- | --- |
| Power Harvesting | 50/60 Hz |
| Voltage Phase and Magnitude Measurement | 50/60 Hz |
| Power Line Communication | 10-500 kHz |
| Partial Discharge Detection | 1 kHz to 1 GHz |

In some examples, one or more of devices 723 may be continuously coupled to low side electrode 706. In other words, in some examples, at least one of devices 723 utilizes low side electrode 706 such that low side electrode 706 may have a 100% duty cycle. However, in some examples, a lower duty cycle can also be employed (e.g., in time sharing, at any given time, it may be that none of devices 723 are operating or utilizing low side electrode 706).

By utilizing a low side electrode 706, cable accessory 700 may include a monitoring device 720 that includes a plurality of devices (e.g., partial discharge sensor 740 and communications unit 724) to share the low side electrode 706, which may reduce the complexity and cost of cable accessory 700. In this way, monitoring device 720 may be relatively easy to install and may provide a relatively efficient, low cost, and simple means for monitoring cable accessory 700 and communicating with EEMS 6.

According to techniques of this disclosure, sensors 728 include one or more partial discharge sensors 740. In general, partial discharge sensors 740 are configured to detect partial discharge events in electrical cables and cable accessories, such as electrical cables 32 and cable accessories 34 of FIG. 1. As described above, a partial discharge event refers to an event that only partially bridges the gap between electrodes or conductors, such as a gas discharge in a void. In some scenarios, a partial discharge event, such as partial discharge event 730 of FIG. 7, is initiated at an air-containing void within a material or at interfaces between the various structures. Because air has a relative low dielectric constant, the air in the void concentrates the electric field, such that a discharge can result when the electric field exceeds the breakdown strength of the air.

Partial discharge events may cause degradation leading to failure of the insulation of an electric cable (e.g., insulation layer 356 of electrical cable 350 of FIG. 3, in insulator 704 of cable accessory 700, or interface breakdown (which may be referred to as internal tracking) at the interface between the insulation layer 356 of electrical cable 350 and insulator 704 of cable accessory 700. For example, dielectric material may degrade over the course of repeated partial discharge events, which may eventually cause a failure event in the electrical cable and/or cable accessory. In other words, electrical cables and cable accessories may experience failure events due to accumulated damage imparted by many small partial discharge events. For instance, repeated partial discharge events may cause cumulative dielectric degradation that progresses through the generally adopted mechanism of local conductivity increase of the dielectric surfaces, surface roughness increase, formation of pits, initiation and extension of electrical trees, and finally ultimate breakdown of remaining dielectric (e.g., the electric field exceeds the dielectric breakdown of the remaining material in the electrical cable or cable accessory).

In some scenarios, the duration of partial discharge event 730 may be very short, for example, one nanosecond. Partial discharge event 730 may output a current pulse over a wide frequency range and the current pulse may transfer charge from less than 1 pC to several nC in magnitude. Partial discharge event 730 may cause current to flow from low side electrode 706 through one or more partial discharge sensors 740 of monitoring device 720 to ground conductor 710.

Partial discharge sensors 740 detect current as current generated by partial discharge event 730 flows from low side electrode 706 to ground conductor 710. For example, partial discharge sensors 740 may be electrically coupled to ground conductor 710 via electrical connection 718A and to low side electrode 706 via electrical connection 718B. Responsive to detecting the current, partial discharge sensors 740 may output partial discharge data indicative of the partial discharge event 730. For example, the partial discharge data may include data indicating that a partial discharge event was detected, a phase of the partial discharge current, a magnitude of the partial discharge current, or a combination therein.

Responsive to receiving the partial discharge data generated by one or more partial discharge sensors 740, analytics engine 738 may store event data, including the partial discharge data, to event data repository 734. In some examples, the event data includes data corresponding to the partial discharge event, such as a date and/or time of the partial discharge event, an identifier corresponding to the partial discharge sensor of partial discharge sensors 740 generating the partial discharge data, etc. For example, analytics engine 738 may receive partial discharge data from a plurality of discharge sensors 740 and may store event data for each partial discharge sensor of partial discharge sensors 740 to memory.

Analytics engine 738 may determine, based at least in part on the partial discharge data, a health of cable accessory 700. Analytics engine 738 may determine the health of cable accessory 700 by applying one or more rules. The rules may be preprogrammed or learned, for example, via machine learning.

In some examples, one or more models 736 may be trained based at least in part on the event data, including partial discharge event data. For example, analytics engine 738 may train models 736 based on known failure events, types of cable accessories, quantity of partial discharge events, time between individual or bursts of partial discharge events, and so forth. For example, analytics engine 738 may determine that time between individual partial discharge events is not indicative of the health of cable accessories, but may determine that time between bursts of partial discharge events and the type of cable accessory is indicative of the health of the cable accessories.

In some examples, analytics engine 738 determine the health of cable accessory 700 based at least in part on a quantity of partial discharge events. For example, analytics engine 738 may determine the quantity of discharge events over a period of time (e.g., since installation of cable accessory 700; over a minute, hour, day, week, or month; etc.). In some scenarios, analytics engine 738 determine the quantity of discharge events by querying event data repository 734. Analytics engine 738 may apply the one or more rules to the quantity of discharge events to determine the health of cable accessory 700. For instance, analytics engine 738 may assign a health score to cable accessory 700 based on application of the rules to the quantity of partial discharge events. For instance, analytics engine 738 may assign a health score (e.g., on a scale of 0-100) that indicates a likelihood of failure to cable accessory 700 based on the quantity of discharge events (e.g., a higher score indicating poorer health or a higher likelihood of failure). As another example, analytics engine 738 may determine a health of cable accessory based on the magnitude and/or frequency of one or more partial discharge events, an amount of time between partial discharge events (e.g., an interval between bursts of discharge events), phase relationship to the primary carrier voltage, among others. For example, analytics engine 738 may apply one or more of models 736 to the event data 734, such as type of cable accessory, installation date, quantity of discharge events, time between bursts of partial discharge events, among others, to determine the health of cable accessory 700.

Analytics engine 738 may determine the health of cable accessory 700 by predicting whether cable accessory 700 will experience a failure event within a predetermined amount of time. In some examples, analytics engine 738 may determine a health score corresponding to cable accessory 700 and predict whether cable accessory 700 will fail within the predetermined amount of time based on the health score. As another example, analytics engine 738 may predict whether cable accessory 700 will fail within the predetermined amount of time based on one or more of models 736. For example, analytics engine 738 may apply a model of models 736 to at least some of the event data 734 and output data indicating whether or when cable accessory 700 is predicted to fail. Stated another way, the inputs to the one or more or models 736 may include at least some of the event data corresponding to partial discharge events detected by partial discharge sensors 740 of cable accessory 700 and/or partial discharge events detected by other cable accessories.

In some examples, analytics engine 738 may determine a location of a partial discharge event based on partial discharge data from a plurality of partial discharge sensors 740. Analytics engine 738 may receive partial discharge data from a plurality of partial discharge sensors 740 of a single cable accessory 700 or from a plurality of discharge sensors 740 of different cable accessories. For example, current generated by partial discharge event 730 may travel across a power transmission line through multiple cable accessories, such that a plurality of cable accessories 700 may detect the partial discharge 730 via respective partial discharge sensors and output event data that includes timestamp data and the partial discharge data generated by the respective partial discharge sensors. Analytics engine 318 may determine, based at least in part on the timestamps in the event data, an origin or location of the partial discharge event. In some examples, analytics engine 318 may determine a geographic location of the partial discharge event by determining which cable accessory of a plurality of cable accessories the partial discharge event occurred closest to. For example, analytics engine 738 may determine the geographic location of partial discharge event 730 is proximate the geographic location of cable accessory 700 in response to determining that the timestamp data indicates cable accessory 700 detected partial discharge event 730 first.

As another example, analytics engine 738 may determine whether partial discharge event 730 occurred within cable accessory 700, proximate an interface between cable accessory 700 and another device (e.g., proximate the connection between cable accessory 700 and an electrical cable, or proximate the connection between cable accessory 700 and a termination device), or external to cable accessory 700. Cable accessory 700 may include a plurality of partial discharge detectors 740 and may determine a location of partial discharge event 730 based on respective timestamp data generated by the respective partial discharge sensors 740 of a single cable accessory 700, in a similar manner as described above for partial discharge sensors of different cable accessories.

Analytics engine 738 may determine a health of cable accessory 700 based at least in part on the location of partial discharge event 730. For example, analytics engine 730 may ignore partial discharge event 730 in response to determining that event 730 occurred external to cable accessory 700. In other words, analytics engine 738 may determine external partial discharge events are noise that are unlikely to contribute to failure of cable accessory 700 or a portion of the electrical cable. As another example, analytics model 738 may determine a relationship between the locations of partial discharge events and a failure mode. Failure modes may include thermal runaway, dielectric degradation of cable insulation, dielectric degradation of insulation in cable accessory 700, interface breakdown (also referred to as "internal tracking") at a connection between cable accessory 700 and other device, such as an electrical cable or termination device, among others. For example, analytics model 738 may (e.g., while training models 736) determine a relationship between failure modes (e.g., how cable accessories fail) and the quantity and location of partial discharge events. For instance, analytics model 738 may determine a failure mode (e.g., interface breakdown) is associated with a particular threshold quantity of discharge events proximate the interface and a different failure mode (e.g., dielectric breakdown of the cable accessory) is associated with a different threshold quantity of discharge events within the cable accessory.

Further, analytics engine 738 may predict a health or condition of cable accessory 700 based on the quantity and location of partial discharge events. For example, analytics engine 738 may predict whether cable accessory 700 will fail within a predetermined amount of time or determine a probability of failure event for one or more respective failure modes by applying one or more models 736 to the partial discharge data indicating the quantity and location of partial discharge events for cable accessory 700. As another example, analytics engine may apply one or more models 736 to the partial discharge data (e.g., quantity and location of discharge events) to predict a remaining lifespan of cable accessory 700.

Analytics engine 738 may determine a health of cable accessory 700 based on sensor data generated by sensors (e.g., sensors of monitoring device 720 and/or other devices) other than partial discharge sensors. In some examples, monitoring device 720 includes one or more voltage sensors and analytics engine 738 determine a health of cable accessory 700 based on voltage data generated by the voltage sensors. Voltage spikes, also referred to as voltage transients, may cause a cable accessory or electrical cable to fail prematurely. Analytics engine 738 may determine whether the voltage data indicates a voltage spike has occurred (e.g., voltages about the normal level of applied voltages, for example, due to switching spikes or electrical storms) and may determine a health of cable accessory 700 based on determining whether a voltage spike has occurred. For instance, analytics engine 738 may determine a health of cable accessory 700 based on a number of voltage spikes. For instance, analytics engine 738 may determine that the health of cable accessory 700 decreases linearly or exponentially as the quantity of voltage spikes increases.

As another example, analytics engine 738 may determine a health of cable accessory 700 based on temperature, location of the cable accessory 700, presence of moisture etc. In some examples, cable accessory 700 may be buried in soil in a location with hot and dry weather. In such examples, dry soil can have different thermal properties, for instance, cool dry soil may conduct heat away from cable accessory 700 or hot dry soil may insulate and keep heat close to the cable accessory 700. Thus, according to some examples, analytics engine 738 may determine the risk of thermal failure based on the temperature and/or moisture. For example, cable accessory 700 may include a temperature sensor, humidity sensor, and/or water presence sensor and may determine the health of cable accessory 700 based on data generated by such sensors. For instance, analytics engine 738 may determine the risk of thermal failure is higher in response to determining the soil is less conductive, has a lower heat capacity, or is at a higher temperature at certain times of the year. According to some examples, analytics engine may determine the health of cable accessory 700 based on weather history and/or forecasts in addition to, or as an alternative to, data generated by temperature and humidity/water sensors.

According to some examples, analytics engine 738 determines a health of cable accessory 700 based on partial discharge data and other data. For example, analytics engine 738 may determine the health of cable accessory 700 based on partial discharge data and voltage data. For instance, analytics engine 738 may determine the health of cable accessory 700 has decreased in response to detecting a voltage spike and a partial discharge event within a threshold amount of time of one another. In other words, in some examples, when the time between a voltage spike and partial discharge event is less than or equal to a threshold amount of time, this may increase the risk of failure in the insulation of cable accessory 700, such that analytics engine 738 may determine the health of cable accessory 700 has decreased.

In some examples, the magnitude of the partial discharge signal (in units of picocoulombs or other) at a defect may be dependent on the applied voltage (e.g., voltage in the central conductor or connector) as well as defect dimensions. Analytics engine 738 may categorize the defect severity based on the applied voltage when a partial discharge event is detected.

Analytics engine 738 may determine a health of cable accessory 700 based on voltage on the power line and hence the voltage at connector 702. In some examples, the voltage may affect the structures formed and the rate of progress of the damage. For example, an "electrical tree" in insulation of the cable accessory 700 or electrical cable may have a more characteristic "bush-like" structure at higher voltage and a "tree-like" structure at lower voltage, and the type of electrical tree may propagate differently. In other words, different voltages may cause the insulation to breakdown in different ways, such that analytics engine 738 may determine the health of cable accessory 700 and/or electrical cables based on voltage data generated by one or more voltage sensors of monitoring device 720.

According to some examples, analytics engine 738 may determine a health of electrical equipment other than cable accessory 700. For instance, analytics engine 738 may determine a partial discharge event occurred external to cable accessory 700. Analytics engine 738 may receive event data from other monitoring devices indicating a partial discharge event occurred external to the other monitoring devices and analytics engine 738 may determine the other monitoring devices detected the same partial discharge event (e.g., based on the time of the partial discharge event). In such examples, analytics engine 738 may determine that an electrical cable between cable accessory 700 and another cable accessory experienced a partial discharge event, and may determine the health of that electrical cable based on the partial discharge data from multiple monitoring devices.

Analytics engine 738 may perform one or more actions in response to determining a health of cable accessory 700 or other article of electrical equipment. According to one example, analytics engine 738 may perform an action by outputting a notification (e.g., to EEMS 6 of FIG. 1) that includes data corresponding to partial discharge events occurring within cable accessory 700, at an interface between cable accessory 700 and another device (e.g., electrical cable or termination device), external to cable accessory 700, or a combination therein. In some examples, analytics engine 738 outputs a notification indicative of the health of cable accessory 700. For example, the data indicative of the health of cable accessory includes all or a portion of the event data generated by partial discharge sensors 740, a summary of the data, analysis results based on the partial discharge data, or a combination therein. The analysis results may include a health score, data indicating whether cable accessory 700 is predicted to fail within the predetermined amount of time, data indicating a predicted remaining lifespan of cable accessory 700, etc.

According to some examples, analytics engine 738 may perform an action by outputting an alert. For example, the alert may indicate cable accessory 700 should be inspected, repaired, or replaced. In some examples, analytics engine 738 may schedule an inspection, repair (also referred to as maintenance), or replacement of cable accessory 700.

In this way, cable accessory 700 may include partial discharge sensors to detect partial discharge events. Cable accessories of this disclosure may be relatively compact, consume less power, and be relatively low cost relative to other cable accessories. A computing device, for example, a monitoring device included in the cable accessory or a different computing device distinct from the monitoring device (e.g., a cloud computing system), may determine a health of the cable accessory based at least in part on the partial discharge events. By determining the health of the cable accessory or portion of electrical cable, the computing device may predict failure events of cable accessories before failure occurs and output notifications indicating that the cable accessory is predicted to fail. Further, the computing device may schedule repair or replacement of the cable accessories. In this way, the computing device may prevent or reduce failure events, which may increase safety.

In general, while certain techniques or functions are described herein as being performed by monitoring device 720, it should be understood that the techniques of this disclosure are not limited in this way. That is, certain techniques described herein may be performed by one or more of the components of the described systems. For example, in some instances, monitoring device 720 may have a relatively limited processing power. In such instances, gateway 28 and/or EEMS 6 may be responsible for most or all of the processing of event data, determining the likelihood of a failure event, and the like. For example, monitoring device 720 may monitor one or more conditions of electrical power cables and/or cable accessories and may output event data indicative of partial discharge events (e.g., partial discharge data, summaries of partial discharge data, etc.) to another device. For instance, monitoring device 720 may output event data (e.g., raw partial discharge data, analysis results such as location of a partial discharge event) to EEMS 6 of FIGS. 1-2. EEMS 6 or another computing device may determine a health of the electrical power cable and/or cable accessory based at least in part on the event data. In such examples, EEMS may determine a health of the electrical power cable and/or cable accessory using any of the techniques described with reference to analytics engine 738 of monitoring device 720. Similarly, analytics engine 738 may include functionality of monitoring device 300 of FIG. 3.

While described in the context of cable accessory 700, monitoring device 720 may be coupled anywhere along an electrical power line to detect partial discharge events. In other words, monitoring device 720 may monitor conditions of electrical cables and are not necessarily coupled to or included in cable accessories such as cable splices or terminations. In this way, monitoring devices may determine a health of an electrical cable or other articles of electrical equipment.

Figure 8:
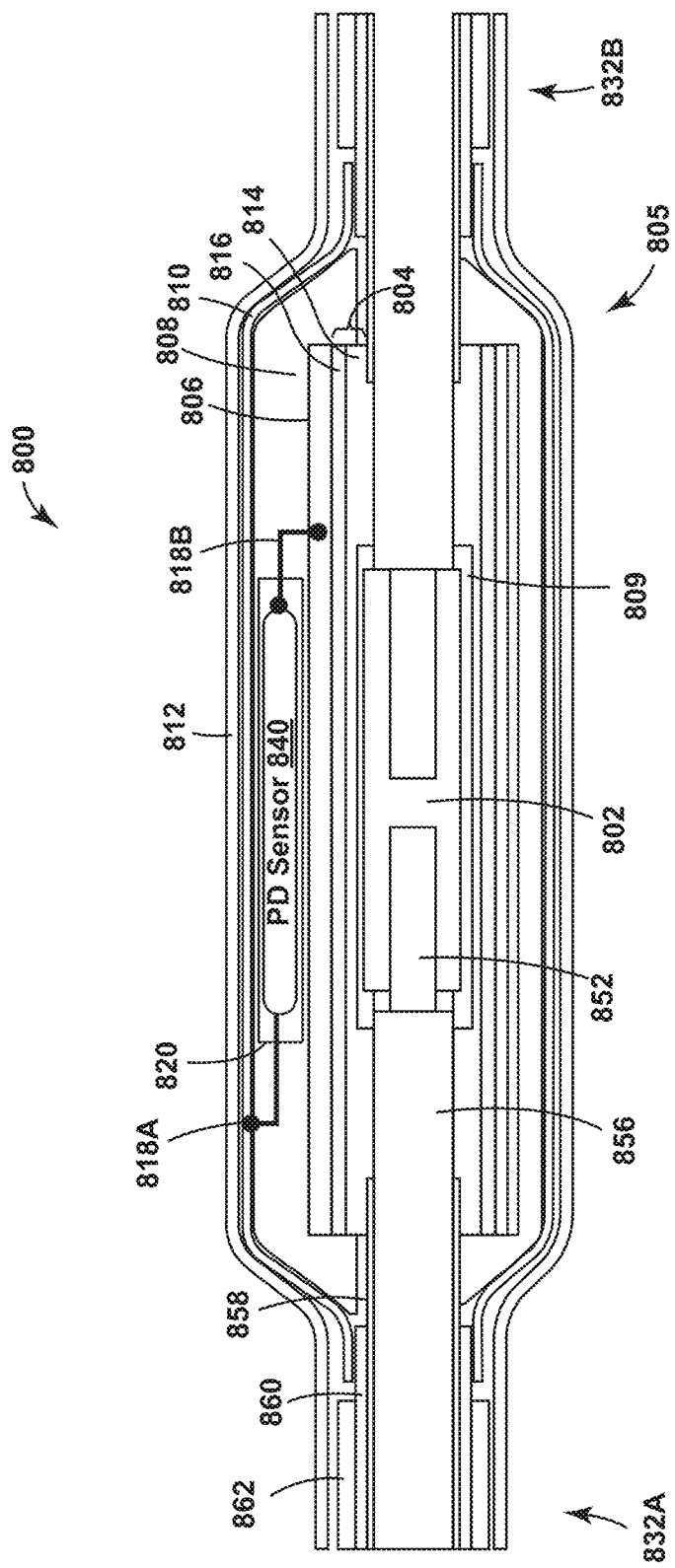
FIG. 8 is a conceptual diagram illustrating an example cable accessory electrically and physically coupling two electrical cables, in accordance with one or more aspects of this disclosure.

FIG. 8 is a conceptual diagram illustrating an example cable accessory 800 electrically and physically coupling electrical cable 832A to electrical cable 832B. Cable accessory 800 may be an example of cable accessory 700 of FIGS. 7A-7C. Electrical cables 832A-832B (collectively, electrical cables 832) may be examples of electrical cables 350 described with reference to FIG. 3. It should be understood that the layers of electrical cables 832 and cable accessory 800 are not necessarily drawn to scale.

In the example of FIG. 8, electrical cables 832 include a plurality of concentric layers, such as cable central conductor 852, cable insulation 856, cable insulation screen 858, cable shield 860 (also referred to as sheath 860), and cable jacket 862. However, in some examples, electrical cables 832 may include more or fewer layers. Electrical cable 832B may include a similar plurality of layers. Cable central conductor 852, cable insulation 856, cable insulation screen 858, cable shield 860, and cable jacket 862 may correspond to central conductor 352, insulation 356, insulation screen 358, shield 360, and jacket 362 of FIG. 3, respectively, such that a description of the respective layers is omitted here for brevity.

As illustrated in FIG. 8, cable accessory 800 includes, in some examples, a monitoring device 820 and a plurality of generally concentric layers, such as connector 802, insulator 804, low side electrode 806, separator 808, ground conductor 810, and jacket 812. Cable accessory 800 may include additional or fewer layers. Connector 802, insulator 804, low side electrode 806, separator 808, ground conductor 810 may correspond to connector 702, insulator 704, low side electrode 706, separator 708, ground conductor 710 of FIGS. 7, respectively, such that a description of the respective layers is omitted for brevity. Jacket 812 may be a plastic or rubber polymer, such as polyvinyl chloride or polyethylene.

Insulator 804 may include a plurality of sub-layers, such as "high-K" insulator 814 and splice insulator 816. High-K insulator 814 may include a material with a relatively high dielectric constant compared to the material of splice insulator 816. In some examples, cable accessory 800 includes a splice electrode 809 concentrically covering connector 802. For example, splice electrode 809 may include an electrically conductive material disposed between connector 802 and insulator 804.

Cable accessory 800 may include an extruded cable splice body 805 (e.g., a "push-on" splice body). In some instances, splice body 805 is an integrated unit that includes splice electrode 809, insulator 804, low side electrode 806, and separator 808. In other words, according to some examples, splice electrode 809, insulator 804, low side electrode 806, and separator 808 may form a single, cohesive structure or device, which may be attached or installed with other layers to form a cable accessory 800. Splice body 805 may include an integrated monitoring device 820.

Upon installation, cable accessory 800 electrically and physically couples electrical cables 832A and 832B. In the example of FIG. 8, connector 802 electrically couples the central conductor 852 of electrical cables 832A and 832B. As shown in FIG. 8, ground conductor 810 electrically couples cable shield 860 of electrical cable 832A with the cable shield 860 of electrical cable 832B. Low side electrode 806 may be electrically isolated from connector 802 and ground conductor 810. In other words, during operation, central conductors 852 and connector 802 may be at a high potential (e.g., thousands or hundreds of thousands of volts), the potential of cable shield 860 and ground conductor 810 may be at a ground potential, and electrode 806 may float between the ground potential and the high voltage potential.

In operation, monitoring device 820 may include the functionality of monitoring device 720 of FIG. 7. In some examples, monitoring device 820 includes one or more processors, one or more storage devices, one or more sensors, one or more communication units, one or more power harvesting devices, or a combination therein. Monitoring device 820 is electrically coupled to ground conductor 810 and low side electrode 806 via electrical connections 818A, 818B, respectively (collectively, electrical connections 818).

In the example of FIG. 8, monitoring device 820 includes at least one partial discharge sensor 840. Partial discharge sensors 840 may be examples of partial discharge sensors 740 of FIG. 7. One or more partial discharge sensors 840 may be electrically coupled to ground conductor 810 and low side electrode 806 via electrical connections 818A, 818B, respectively. Partial discharge sensors 840 may be configured to detect partial discharge events and output partial discharge data indicative of the partial discharge event. For example, the partial discharge data may include data indicating that a partial discharge event was detected, a phase of the partial discharge current, a magnitude of the partial discharge current, or a combination therein.

Monitoring device 820 may determine the health of cable accessory 800 based at least in part on the partial discharge data. In some examples, monitoring device 820 determines the health of cable accessory 800 based on event data (e.g. including the partial discharge data), device data, manufacturing data, installation data, or a combination therein. Monitoring device 820 may determine the health of cable accessory 800 by applying one or more models to the event data, for example, to predict whether the cable accessory 800 will fail within a predetermined amount of time. Responsive to determining the health of cable accessory 800, monitoring device 820 may output data indicative of the health of cable accessory 800, such as all or a portion of the partial discharge data, a summary of the partial discharge data, analysis results based on the partial discharge data, or a combination therein. In some examples, monitoring device 820 outputs the data to EEMS 6 of FIGS. 1-2 using wired communication techniques (e.g., power line communication) and/or wireless communication techniques (e.g., LTE, Bluetooth®, WiFi®). According to some examples, monitoring device 820 may output event data (e.g., including the partial discharge data) without determining a health of cable accessory 800. For instance, monitoring device 820 may output event data to gateway 28 and/or EEMS 6 and EEMS 6 and/or gateway 28 may determine the health of cable accessory 800 based on the event data.

Figure 9:
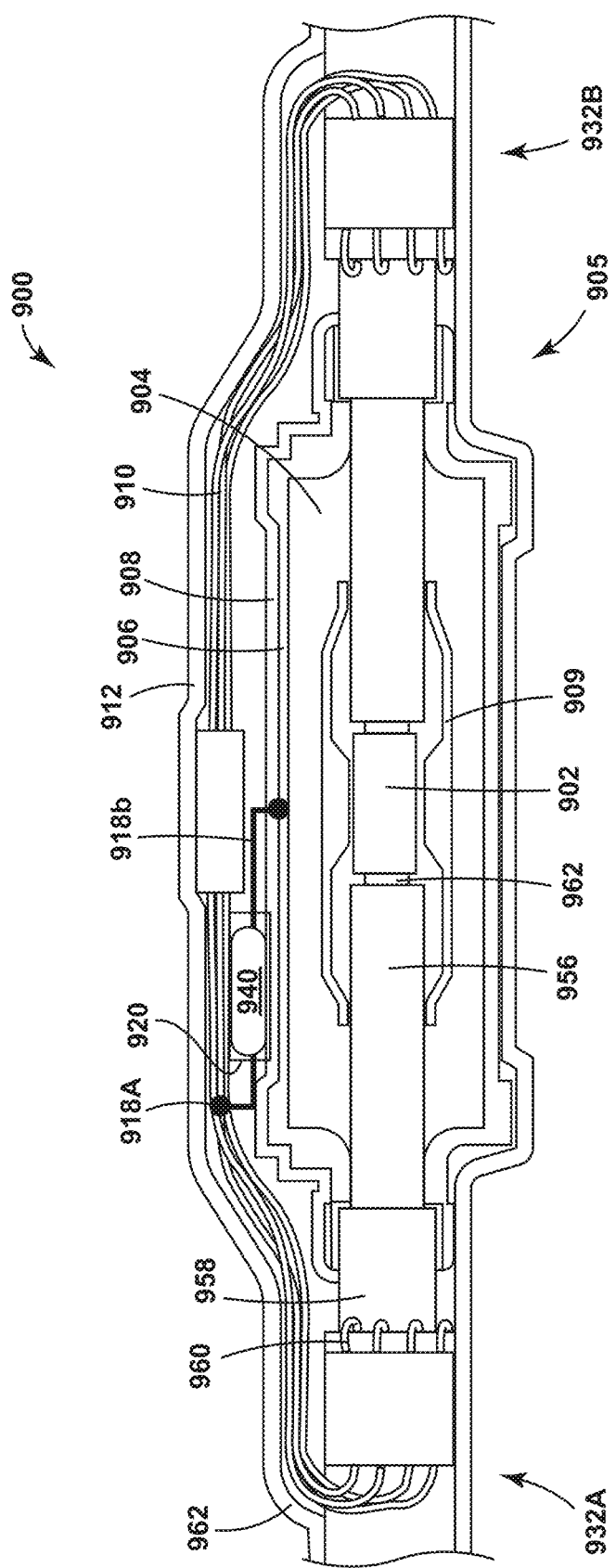
FIG. 9 is a conceptual diagram illustrating an example cable accessory electrically and physically coupling two electrical cables, in accordance with one or more aspects of this disclosure.

FIG. 9 is a conceptual diagram illustrating an example cable accessory 900 electrically and physically coupling electrical cable 932A to electrical cable 932B. Cable accessory 900 may be an example of cable accessory 700 of FIGS. 7A-7C. Electrical cables 932A-932B (collectively, electrical cables 932) may be examples of electrical cables 350 described with reference to FIG. 3. It should be understood that the layers of electrical cables 932 and cable accessory 900 are not necessarily drawn to scale.

In the example of FIG. 9, electrical cables 932 include a plurality of concentric layers, such as cable central conductor 952, cable insulation 956, cable insulation screen 958, cable shield 960 (also referred to as sheath 960), and cable jacket 962. However, in some examples, electrical cables 932 may include more or fewer layers. Electrical cable 932B may include a similar plurality of layers. Cable central conductor 952, cable insulation 956, cable insulation screen 958, cable shield 960 and cable jacket 962 may correspond to central conductor 352, insulation 356, insulation screen 358, shield 360, and jacket 362 of FIG. 3, respectively, such that a description of the respective layers is omitted here for brevity.

As illustrated in FIG. 9, cable accessory 900 includes, in some examples, a monitoring device 920 and a plurality of layers (e.g., generally concentric or generally coaxial layers), such as connector 902, insulator 904, low side electrode 906, separator 908, ground conductor 910, and jacket 912. Cable accessory 900 may include additional or fewer layers. Connector 902, insulator 904, low side electrode 906, separator 908, ground conductor 910 may correspond to connector 702, insulator 704, low side electrode 706, separator 708, ground conductor 710 of FIGS. 7, respectively, such that a description of the respective layers is omitted for brevity. Jacket 912 may be a plastic or rubber polymer, such as polyvinyl chloride or polyethylene.

Cable accessory 900 may include a molded cable splice body 905. In some instances, splice body 905 is an integrated unit that includes splice electrode 909, insulator 904, low side electrode 906, and separator 908 in an integrated unit. In other words, according to some examples, splice electrode 909, insulator 904, low side electrode 906, and separator 908 may form a single, cohesive structure or device, which may be attached or installed with other layers to form a cable accessory 900. Splice body 905 may include an integrated monitoring device 920.

In some examples, cable accessory 900 includes a splice electrode 909 concentrically covering connector 902. For example, splice electrode 909 may include an electrically conductive material disposed between connector 902 and insulator 904.

Upon installation, cable accessory 900 electrically and physically couples electrical cables 932A and 932B. In the example of FIG. 9, connector 902 electrically couples the central conductor 952 of electrical cables 932A and 932B. As shown in FIG. 9, ground conductor 910 electrically couples cable shield 960 of electrical cable 932A with the shield 960 of electrical cable 932B. Low side electrode 906 may be electrically isolated from connector 902 and ground conductor 910. In other words, during operation, central conductors 952 and connector 902 may be at a high potential (e.g., thousands or hundreds of thousands of volts), the potential of cable shield 960 and ground conductor 910 may be at a ground potential, and electrode 906 may float between the ground potential and the high voltage potential.

In operation, monitoring device 920 may include the functionality of monitoring device 720 of FIG. 7. In some examples, monitoring device 920 includes one or more processors, one or more storage devices, one or more sensors, one or more communication units, one or more power harvesting devices, or a combination therein. Monitoring device 920 is electrically coupled to ground conductor 910 and low side electrode 906 via electrical connections 918A, 918B, respectively (collectively, electrical connections 918).

In the example of FIG. 9, monitoring device 920 includes at least one partial discharge sensor 940. Partial discharge sensors 940 may be examples of partial discharge sensors 740 of FIG. 7. One or more partial discharge sensors 940 may be electrically coupled to ground conductor 910 and low side electrode 906 via electrical connections 918A, 918B, respectively. Partial discharge sensors 940 may be configured to detect partial discharge events and output partial discharge data indicative of the partial discharge event. For example, the partial discharge data may include data indicating that a partial discharge event was detected, a phase of the partial discharge current, a magnitude of the partial discharge current, or a combination therein.

Monitoring device 920 may determine the health of cable accessory 900 based at least in part on the partial discharge data. In some examples, monitoring device 920 determines the health of cable accessory 900 based on event data (e.g. including the partial discharge data), device data, manufacturing data, installation data, or a combination therein. Monitoring device 920 may determine the health of cable accessory 900 by applying one or more models to the event data, for example, to predict whether the cable accessory 900 will fail within a predetermined amount of time. Responsive to determining the health of cable accessory 900, monitoring device 920 may output data indicative of the health of cable accessory 900, such as all or a portion of the partial discharge data, a summary of the partial discharge data, analysis results based on the partial discharge data, or a combination therein. In some examples, monitoring device 920 outputs the data to EEMS 6 of FIGS. 1-2 using wired communication techniques (e.g., power line communication) and/or wireless communication techniques (e.g., LTE, Bluetooth®, WiFi®). According to some examples, monitoring device 920 may output event data (e.g., including the partial discharge data) without determining a health of cable accessory 900. For instance, monitoring device 920 may output event data to gateway 28 and/or EEMS 6 and EEMS 6 and/or gateway 28 may determine the health of cable accessory 900 based on the event data.

Figure 10C:
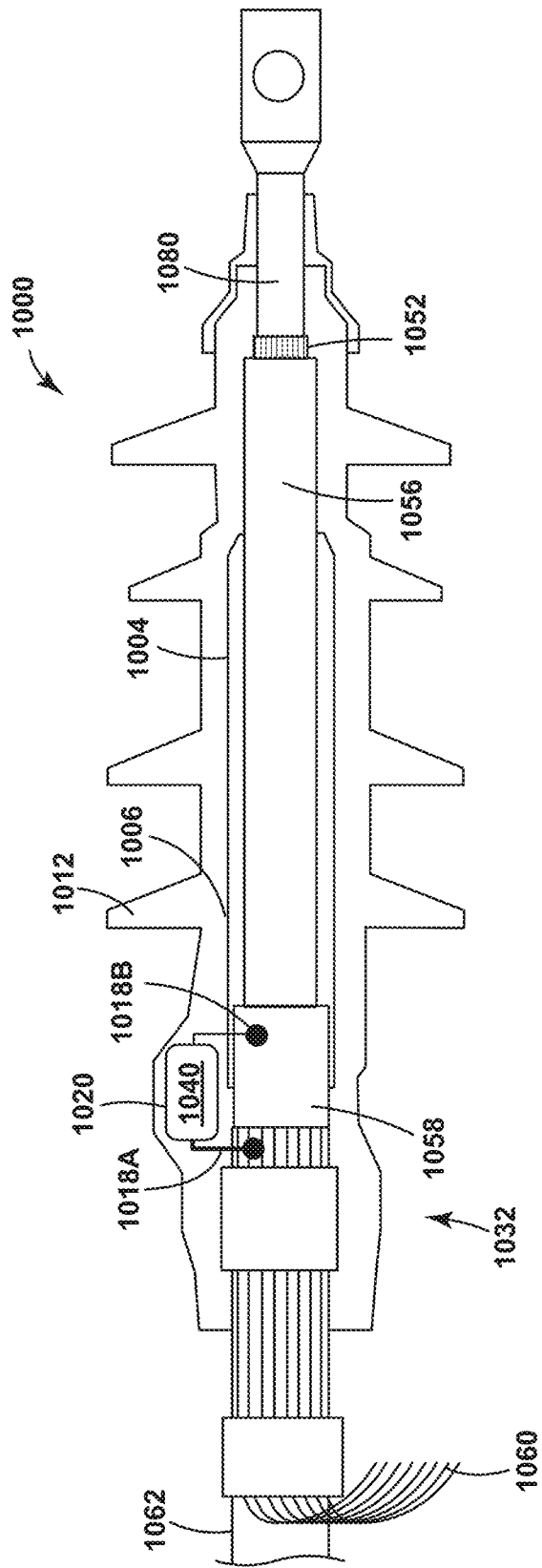

FIGS. 10A-10C are conceptual diagrams illustrating an example cable accessory 1000 coupling an electrical cable 1032 to a cable termination lug 1080, in accordance with one or more aspects of this disclosure. Cable accessory 1000 may be an example of cable accessory 34F of FIG. 1, such as a cable termination body. Electrical cable 1032 may be examples of electrical cables 350 described with reference to FIG. 3. It should be understood that electrical cable 1032 and cable accessory 1000 are not necessarily drawn to scale. Cable termination lug 1080 may include a conductive material, such as copper or aluminum.

In the example of FIGS. 10A-10C, electrical cable 1032 include a plurality of concentric layers, such as cable central conductor 1052, cable insulation 1056, cable insulation screen 1058, cable shield 1060 (also referred to as sheath 1060), and cable jacket 1062. However, in some examples, electrical cable 1032 may include more or fewer layers. Cable central conductor 1052, cable insulation 1056, cable insulation screen 1058, cable shield 1060, and cable jacket 1062 may correspond to central conductor 352, insulation 356, insulation screen 358, shield 360, and jacket 362 of FIG. 3, respectively, such that a description of the respective layers is omitted here for brevity.

In the example of FIGS. 10A-10C, cable accessory 1000 includes monitoring device 1020, which may correspond to the monitoring device 720 of FIG. 7 and may include similar components (e.g., processors, storage devices, communication units, sensors, and power sources) and functionality.

In the example of FIGS. 10A-10C, cable accessory 1000 includes a plurality of layers, such as insulator 1004 and jacket 1012. Cable accessory 1000 may include additional or fewer layers. Insulator 1004 may include an insulating material, such as an elastomeric rubber (e.g., ethylene propylene diene monomer (EPDM)). Jacket 1012 may be a plastic or rubber polymer, such as polyvinyl chloride or polyethylene.

In the example of FIG. 10A, cable accessory 1000 includes low side electrode 1006, which may be an example of low side electrode 706 of FIG. 7. In such examples, low side electrode 1006 may be electrically isolated from cable central connector 1052 and cable shield 1060 of electrical cable 1032. Stated another way, low side electrode 1006 may be at a different potential than either cable central connector 1052 (which is at a relatively high line voltage) and cable shield 1060 (at ground). One or more partial discharge sensors 1040 of monitoring device 1020 is electrically coupled to ground conductor 1060 and low side electrode 1006 via electrical connections 1018A, 1018B, respectively (collectively, electrical connections 1018).

In the example of FIG. 10B, electrical cable 1032 includes low side electrode 1068 (e.g., additionally or alternatively to low side electrode 1006 of cable accessory 1000) and separator 1068. Low side electrode 1068 may be similar to low side electrode 706 of FIG. 7. Separator 1066 may electrically isolate low side electrode 1006 from cable insulation screen 1058 and cable shield 1060 of electrical cable 1032. One or more partial discharge sensors 1040 of monitoring device 1020 are electrically coupled to ground conductor 1060 and low side electrode 1068 via electrical connections 1018A, 1018B, respectively.

In the example of FIG. 10C, cable insulation screen 1058 includes a material with a relatively high resistivity (e.g., compared to the cable insulation screen of some electrical cables). In such examples, cable insulation screen 1058 may form a low side electrode. One or more partial discharge sensors 1040 of monitoring device 1020 may be electrically coupled to cable insulation screen 1058. By using a material with a relatively high resistivity for cable insulation screen and electrically coupling partial discharge sensors 1040 to cable insulation screen 1058, current generated by partial discharge events may flow through partial discharge sensors 1040 to ground conductor 1060.

In operation, monitoring device 1020 may include the functionality of monitoring device 720 of FIG. 7. In some examples, monitoring device 1020 includes one or more processors, one or more sensors, one or more communication units, one or more power harvesting devices, or a combination therein. For example, monitoring device 1020 includes one or more partial discharge sensors 1040 configured to generate sensor data indicative of partial discharge events.

Monitoring device 1020 may determine the health of cable accessory 1000 based at least in part on the partial discharge data. In some examples, monitoring device 1020 determines the health of cable accessory 1000 based on the partial discharge data and other data, such as other event data, device data, manufacturing data, installation data, or a combination therein. Monitoring device 1020 may determine the health of cable accessory 1000 by applying one or more models to the event data, for example, to predict whether the cable accessory 1000 will fail within a predetermined amount of time. Responsive to determining the health of cable accessory 1000, monitoring device 1020 may output data indicative of the health of cable accessory 1000, such as all or a portion of the sensor data, a summary of the sensor data, analysis results based on the sensor data, or a combination therein. In some examples, monitoring device 1020 outputs the data to EEMS 6 of FIGS. 1-2 using wired communication techniques (e.g., power line communication) and/or wireless communication techniques (e.g., LTE, Bluetooth®, WiFi®). According to some examples, monitoring device 1020 may output event data without determining a health of cable accessory 1000. For instance, monitoring device 1020 may output event data to gateway 28 and/or EEMS 6 and EEMS 6 and/or gateway 28 may determine the health of cable accessory 1000 based on the event data.

Figure 11A:
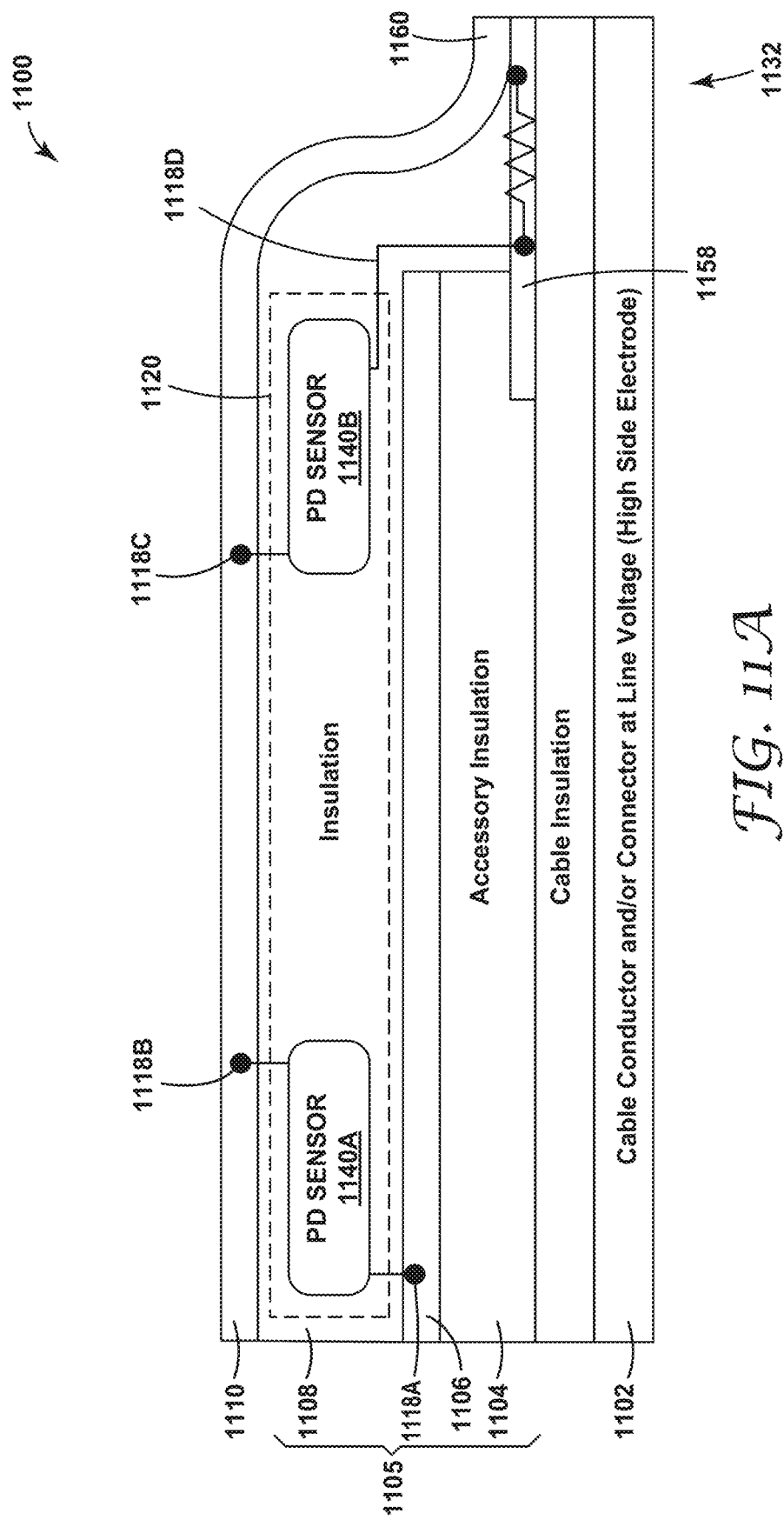
FIGS. 11A-11B are conceptual diagrams illustrating an example cable accessory coupled to an example electrical cable, in accordance with one or more aspects of this disclosure.
Figure 11B:
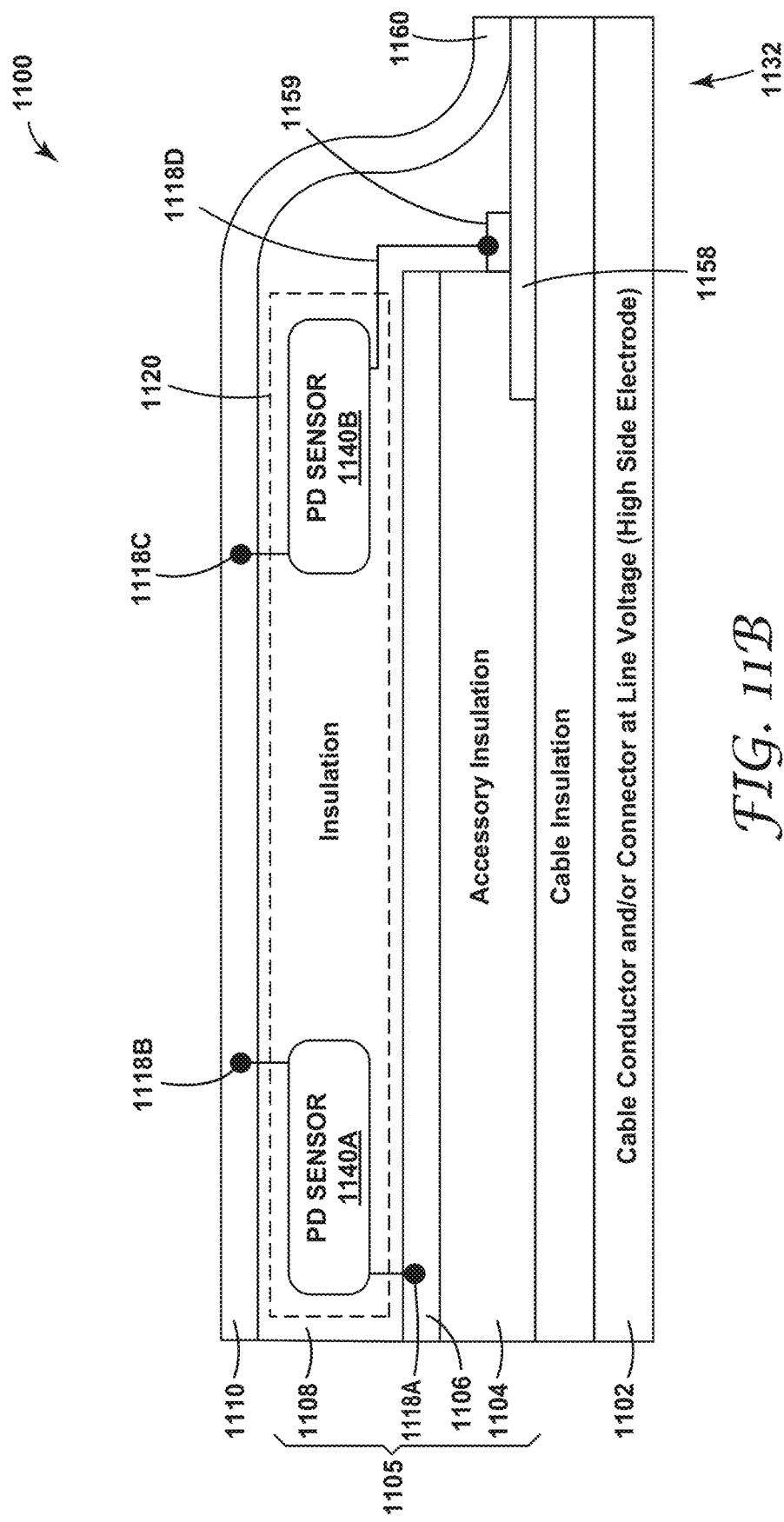

FIGS. 11A-11B are conceptual diagrams illustrating an example cable accessory 1100 coupled to an example electrical cable 1132, in accordance with one or more aspects of this disclosure. Electrical cable 1132 may be an example of electrical cables 932 described with reference to FIG. 9. Electrical cable 1132 may include a central conductor, cable insulation, cable insulation shield 1158, and cable shield 1160. Electrical cable 1132 may include additional or fewer layers. It should be understood that the layers of electrical cables 1132 are not necessarily drawn to scale.

Cable accessory 1100 includes a monitoring device 1120. As illustrated in FIGS. 11A-11B, monitoring device 1120 includes a plurality of partial discharge sensors 1140A, 1140B (collectively, partial discharge sensors 1140). Monitoring device 1120 may include one or more additional sensors, one or more power harvesting devices, one or more communication units, one or more processors (e.g., including data repositories and analytics engine), and one or more storage devices as illustrated by monitoring device 720 of FIG. 7, however, such components are omitted from FIGS. 11A-11B for clarity.

In the example of FIGS. 11A-11B, cable accessory 1100 includes connector 1102, insulator 1104, low side electrode 1106, separator 1108, ground conductor 1110. In some examples, insulator 1104, low side electrode 1106, and separator 1108, may collectively be referred to as a splice body 1105, and may generally be coaxial with one another.

It should be understood that the layers of cable accessory 1100 are not necessarily drawn to scale. Cable accessory 1100 may include fewer layers or additional layers not shown here.

Partial discharge sensors 1140 may be examples of partial discharge sensors 740 of FIG. 7. Partial discharge sensor 1140A may be electrically coupled to ground layer 1110 via electrical connection 1118A and low side electrode 1106 via electrical connection 1118B. By separating low side electrode 1106 and ground conductor 1110 with insulator 1108, and by electrically coupling partial discharge sensor 1140A to low side electrode 1106 and ground conductor 1110, current generated by partial discharge events may flow from low side electrode 1106 through partial discharge sensor 1140A to ground conductor 1110. In this way, current generated by partial discharge events may flow through partial discharge sensor 1140A and enable partial discharge sensor 1140 to detect partial discharge events.

In the example of FIG. 11A, partial discharge sensor 1140B may be electrically coupled to ground layer 1110 via electrical connection 1118C and insulation screen 1158 of electrical cable 1132 via electrical connection 1118D. Insulation screen 1158 may have a relatively high resistance (e.g., compared to cable shield 1160), such that insulation screen 1158 may be considered a low side electrode. By electrically coupling partial discharge sensor 1140B to cable insulation screen 1158 and ground conductor 1110, current generated by partial discharge events may flow from insulation screen 1158 through partial discharge sensor 1140B to ground conductor 1110. In other words, because insulation screen 1158 has a relatively high resistance or impedance, at least some of the current generated by partial discharge events may flow through electrical connections 1118 (e.g., rather than along insulation screen 1158 to cable shield 1160) through partial discharge sensor 1140B to ground conductor 1110.

As illustrated in the example of FIG. 11B, insulation screen 1158 may include a low resistance element 1159. In some examples, the low resistance element 1159 includes a metallic body attached to an exterior of insulation screen 1158. For instance, low resistance element 1159 may extend around the circumference of cable insulation screen 1158. In the example of FIG. 11B, partial discharge sensor 1140B may be electrically coupled to ground layer 1110 via electrical connection 1118C and low resistance element 1159 via electrical connection 1118D. Low resistance element 1159 may provide a low impedance path to encourage or urge current generated by a partial discharge event to flow through electrical connection 118C to partial discharge sensor 11400B and ground layer 1110. Insulation screen 1158 may have a relatively high resistance (e.g., compared to cable shield 1160), such that insulation screen 1158 may be considered a low side electrode.

Partial discharge sensors 1140 may output event data in response to detecting partial discharge events. For example, the event data may include partial discharge data indicative of the partial discharge events. Monitoring device 1120 may store the partial discharge data, analyze the partial discharge data, output the partial discharge data (e.g., to EEMS 6 of FIG. 1), or a combination therein. Monitoring device 1120 may determine a health of cable accessory 1100 based at least in part on the partial discharge data. In some examples, monitoring device 1120 determines the health of cable accessory 1100 by predicting whether cable accessory 1100 will fail within a predetermined amount of time based on the partial discharge data, device data, manufacturing data, installation data, or a combination therein. Monitoring device may output data indicative of the health of cable accessory 1100, such as all or a portion of the partial discharge data, a summary of the partial discharge data, and/or analysis results data. For example, monitoring device 1120 may output data indicating whether cable accessory 1100 is predicted to fail within the predetermined amount of time.

Figure 12:
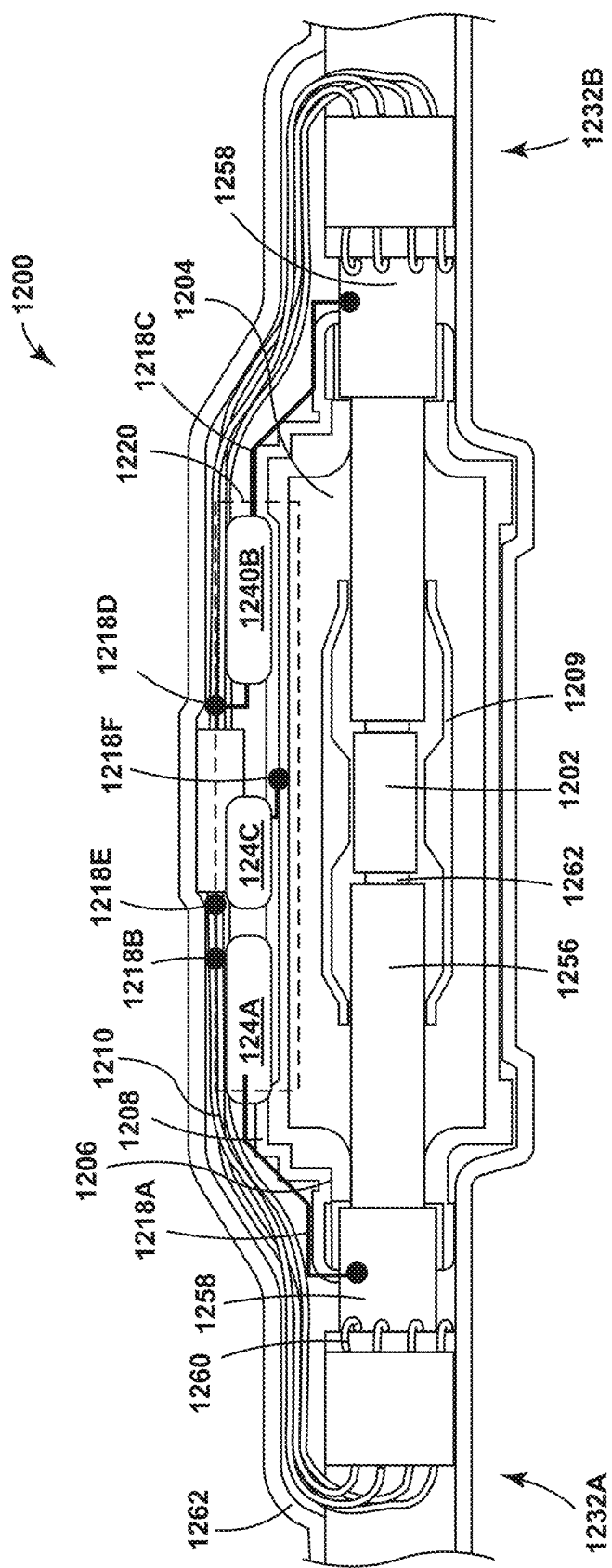
FIG. 12 is a conceptual diagram illustrating an example cable accessory coupling two electrical cables, in accordance with one or more aspects of this disclosure.

FIG. 12 is a conceptual diagram illustrating an example cable accessory 1200 coupling two electrical cables 1232A-1232B, in accordance with one or more aspects of this disclosure. Electrical cable 1232A-1232B (collectively, electrical cables 1232) may be examples of electrical cables 932 described with reference to FIG. 9. It should be understood that the layers of electrical cables 1232 and cable accessory 1200 are not necessarily drawn to scale.

In the example of FIG. 12, electrical cables 1232 include a plurality of concentric layers, such as cable central conductor 1252, cable insulation 1256, cable insulation screen 1258, cable shield 1260 (also referred to as sheath 1260), and cable jacket 1262. However, in some examples, electrical cables 1232 may include more or fewer layers. Electrical cable 1232B may include a similar plurality of layers. Cable central conductor 1252, cable insulation 1256, cable insulation screen 1258, cable shield 1260, and cable jacket 1262 may correspond to cable central conductor 952, cable insulation 956, cable insulation screen 958, cable shield 960, and cable jacket 962 of FIG. 9, respectively, such that a description of the respective layers is omitted here for brevity.

Cable accessory 1200 may an example of cable accessory 900 illustrated in FIG. 9. As illustrated in FIG. 12, cable accessory 1200 includes connector 1202, insulator 1204, low side electrode 1206, separator 1208, ground conductor 1210, and jacket 1212, which may be examples of connector 902, insulator 904, low side electrode 906, separator 908, ground conductor 910, and jacket 912 of cable accessory 900 of FIG. 9, respectively, such that a description of the respective layers is omitted for brevity.

As illustrated in FIG. 12, cable accessory 1200 includes a monitoring device 1220. Monitoring device 1220 includes a plurality of partial discharge sensors 1240A-1240C (collectively, partial discharge sensors 1240). Monitoring device 1220 may include one or more additional sensors, one or more power harvesting devices, one or more communication units, one or more processors (e.g., including data repositories and analytics engine), and one or more storage devices as illustrated by monitoring device 720 of FIG. 7, however, such components are omitted from FIG. 12 for clarity.

Partial discharge sensors 1240 may be similar to, and include similar functionality to, partial discharge sensors 740 of FIG. 7. Partial discharge sensor 1240A may be electrically coupled to insulation screen 1258 of electrical cable 1232A via electrical connection 1218A and ground conductor 1210 via electrical connection 1218B. Similarly, partial discharge sensor 1240B may be electrically coupled to insulation screen 1258 of electrical cable 1232B via electrical connection 1218C and ground conductor 1210 via electrical connection 1218D. Insulation screens 1258 may have a relatively high resistance (e.g., compared to cable shields 1260), such that insulation screens 1258 may be considered a low side electrode. By electrically coupling partial discharge sensor 1240A to cable insulation screen 1258 of electrical cable 1232A and ground conductor 1210, and by electrically coupling partial discharge sensor 1240B to cable insulation screen 1258 of electrical cable 1232B and ground conductor 1210, current generated by partial discharge events may flow from the respective insulation screens 1258 through partial discharge sensor 1240A, 1240B to ground conductor 1210. In other words, because insulation screens 1258 have a relatively high resistance or impedance, at least some of the current generated by partial discharge events may flow through electrical connections 1218 (e.g., rather than along insulation screen 1258 to cable shield 1260) through partial discharge sensors 1240A, 1240B to ground conductor 1210.

Partial discharge sensor 1240C may be electrically coupled to ground conductor 1210 via electrical connection 1218E and low side electrode 1206 via electrical connection 1218F. By separating low side electrode 1206 and ground conductor 1210 with insulator 1208, and by electrically coupling partial discharge sensor 1240C to low side electrode 1206 and ground conductor 1210, current generated by partial discharge events may flow from low side electrode 1206 through partial discharge sensor 1240C to ground conductor 1210. In this way, current generated by partial discharge events may flow through partial discharge sensor 1240C and enable partial discharge sensor 1240C to detect partial discharge events.

Partial discharge sensors 1240 may output event data in response to detecting partial discharge events. For example, the event data may include partial discharge data indicative of the partial discharge events. Monitoring device 1220 may store the partial discharge data, analyze the partial discharge data, output the partial discharge data (e.g., to EEMS 6 of FIG. 1), or a combination therein. Monitoring device 1220 may determine a health of cable accessory 1200 based at least in part on the partial discharge data. In some examples, monitoring device 1220 determines the health of cable accessory 1200 by predicting whether cable accessory 1200 will fail within a predetermined amount of time based on the partial discharge data, device data, manufacturing data, installation data, or a combination therein. Monitoring device may output data indicative of the health of cable accessory 1200, such as all or a portion of the partial discharge data, a summary of the partial discharge data, and/or analysis results data. For example, monitoring device 1220 may output data indicating whether cable accessory 1200 is predicted to fail within the predetermined amount of time.

Figure 13C:
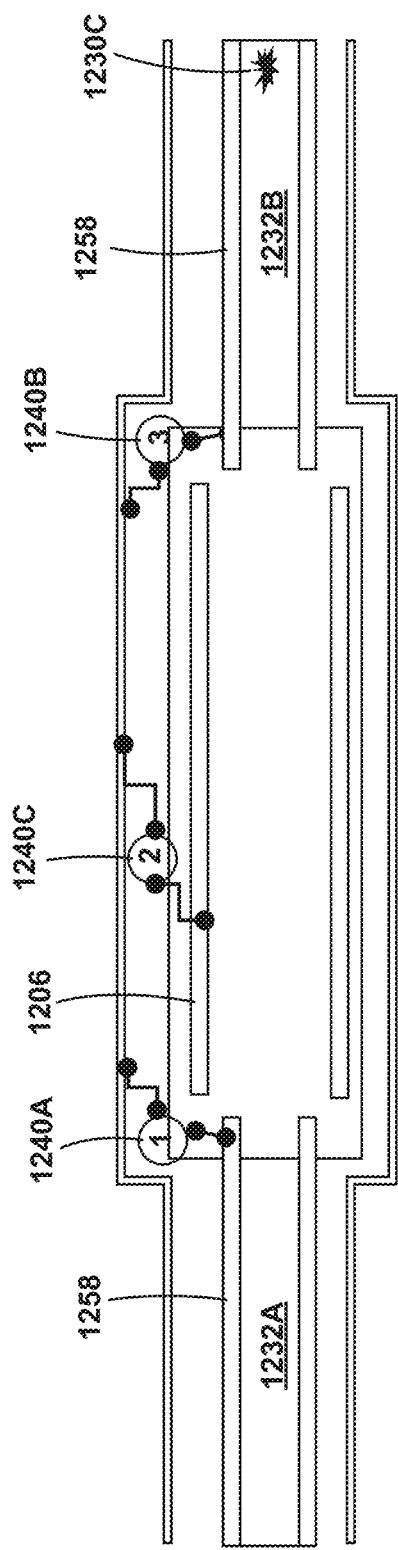

FIGS. 13A-13C are conceptual diagrams illustrating an example cable accessory 1200 coupling a plurality of electrical cables 1232, in accordance with one or more aspects of this disclosure. FIG. 13A illustrates an example of a partial discharge event occurring at a location 1230A at an interface of cable accessory 1200 and electrical cable 1232B. In other words, location 1230A represents a joint or a location where cable accessory 1200 is coupled to electrical cable 1232B. FIG. 13B illustrates an example of a partial discharge event occurring at location 1230B internal to cable accessory 1200. FIG. 13C illustrates an example of a partial discharge event occurring at a location 1230C exterior to cable accessory 1200.

In each of FIGS. 13A-13C, partial discharge sensors 1240A-1240C may detect the partial discharge event and may output partial discharge data indicative of the partial discharge event (e.g., to a processor of monitoring device 1220). In some examples, the partial discharge data may include a timestamp corresponding to when the partial discharge event was detected at the partial discharge sensor, a phase of the partial discharge current, a magnitude of the partial discharge current, etc.

Monitoring device 1220 of cable accessory 1200 may determine a location of a partial discharge event based on the partial discharge data from each of partial discharge sensors 1240. In some examples, monitoring device 1220 determines the location of the partial discharge event based on the magnitude of the current. In the example of FIG. 13A, monitoring device 1220 may determine that the partial discharge event occurred closest to partial discharge sensor 1240B in response to determining that the magnitude of the current detected by partial discharge sensor 1240B was larger than the magnitude of the current detected by partial discharge sensors 1240A and 1240C. As another example, monitoring device 1220 may determine that the partial discharge event occurred at the interface of cable accessory 1220 and electrical cable 1232B in response to determining that the magnitude of the current detected by partial discharge sensor 1240B was larger than the magnitude of the current detected by partial discharge sensor 1240C and that the magnitude of current detected by partial discharge sensor 1240C was greater than the magnitude of current detected by partial discharge sensor 1240A.

As another example, as illustrated in FIG. 13B, monitoring device 1220 may determine that partial discharge event occurred closest to partial discharge sensor 1240B in response to determining that the magnitude of current detected by partial discharge 1240C was larger than the magnitude of current detected by partial discharge sensors 1240A or 1240B.

Partial discharge events that occur external to cable accessory 1200 may generate no net charge transfer within cable accessory 1200 and a relatively small amount of current (relative to partial discharge events occurring within cable accessory 1200) at the interfaces between cable accessory 1200 and electrical cables 1232. In other words, partial discharge sensor 1240C may detect approximately little to no current and partial discharge sensors 1240A, 1240B may detect an approximately equal amounts of current when the partial discharge event occurs external to cable accessory 1200. In the example of FIG. 13C, monitoring device 1220 may determine that partial discharge event occurred external to cable accessory 1200 in response to determining that the magnitude of current detected by partial discharge 1240C is less than (e.g., approximately zero) the magnitude of current detected by partial discharge sensors 1240A or 1240B and that the magnitude of current detected by partial discharge sensors 1240A and 1240B are approximately equal.

Monitoring device 1220 may determine a probability of a particular failure mode of cable accessory 1220 or electrical cables 1232 based on the location of the partial discharge event. For example, monitoring device 1220 may increase the risk of an electrical cable failure mode (e.g., dielectric breakdown in the insulation of electrical cable 1232) in response to determining the partial discharge event occurred exterior to cable accessory 1200. As another example, monitoring device 1120 may increase the risk of an interface breakdown failure mode in response to determining the partial discharge event occurred proximate an interface of cable accessory 1200 and electrical cable 1232B. As yet another example, monitoring device 1120 may increase the risk of a cable accessory failure mode (e.g., dielectric breakdown in the insulation of cable accessory 1200) in response to determining the partial discharge event occurred internal to cable accessory 1200.

In some examples, monitoring device 1120 determines the location of the partial discharge event based on a timestamp corresponding to the partial discharge event. For example, monitoring device 1120 may determine that the partial discharge sensor of sensors 1240 that detected the partial discharge event first is closest to the partial discharge event.

Figure 14A:
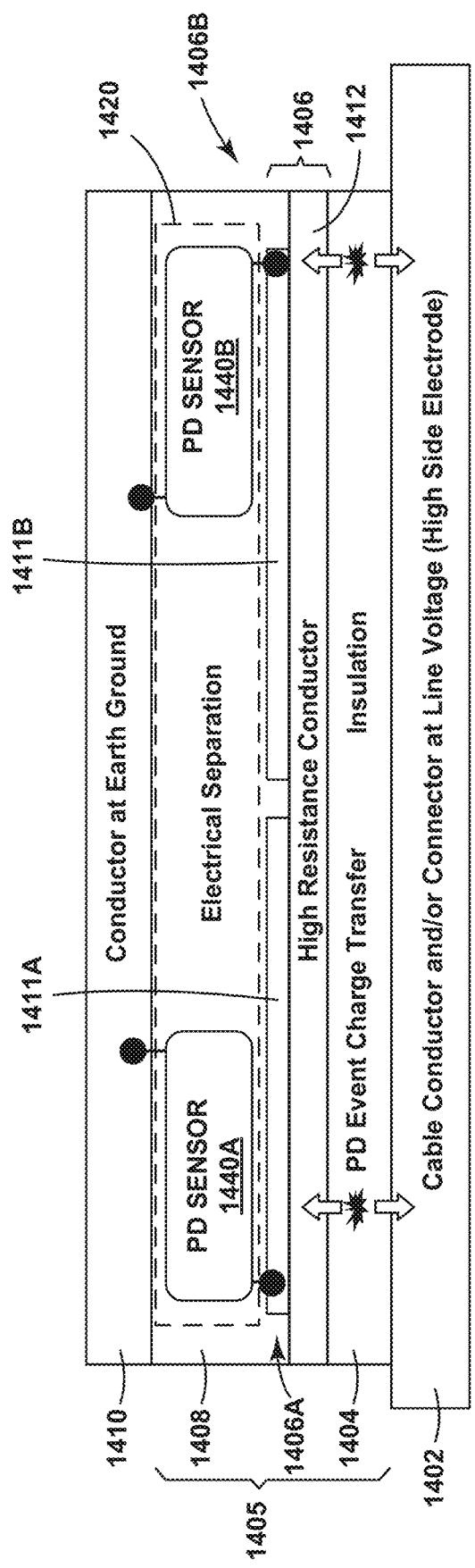
FIGS. 14A-14C are conceptual diagram illustrating an example cable accessory, in accordance with one or more aspects of this disclosure.
Figure 14B:
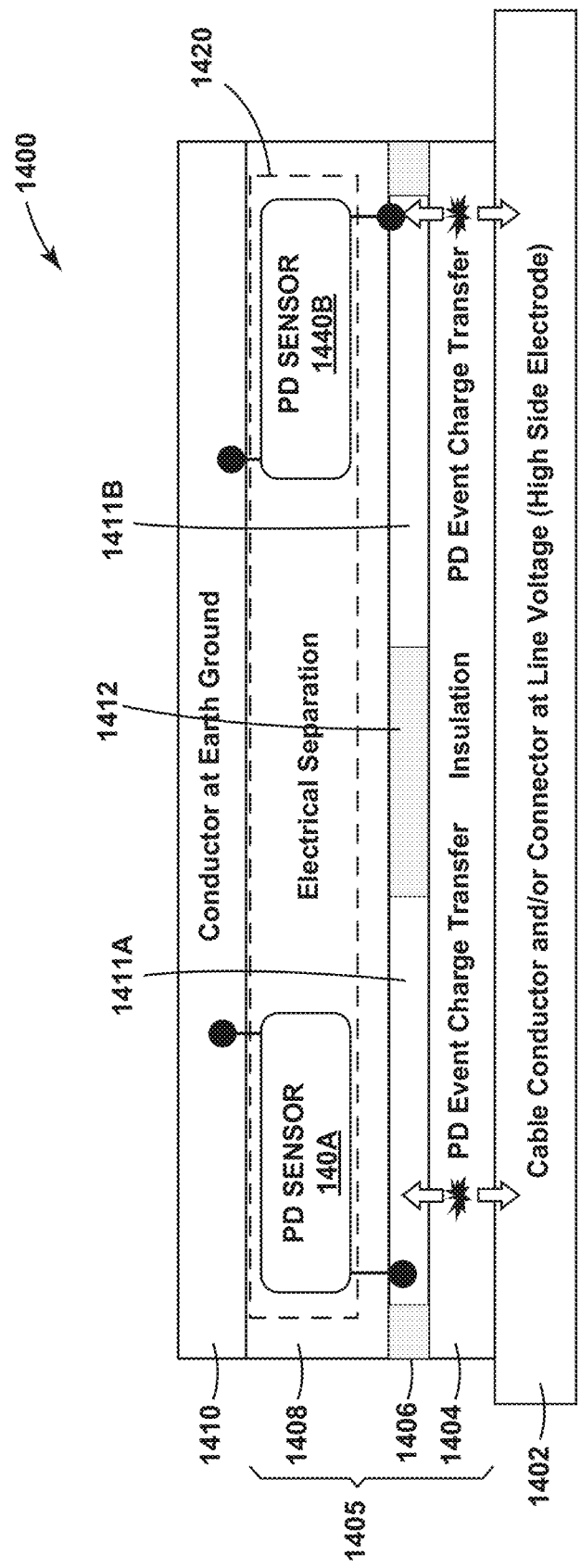
Figure 14C:
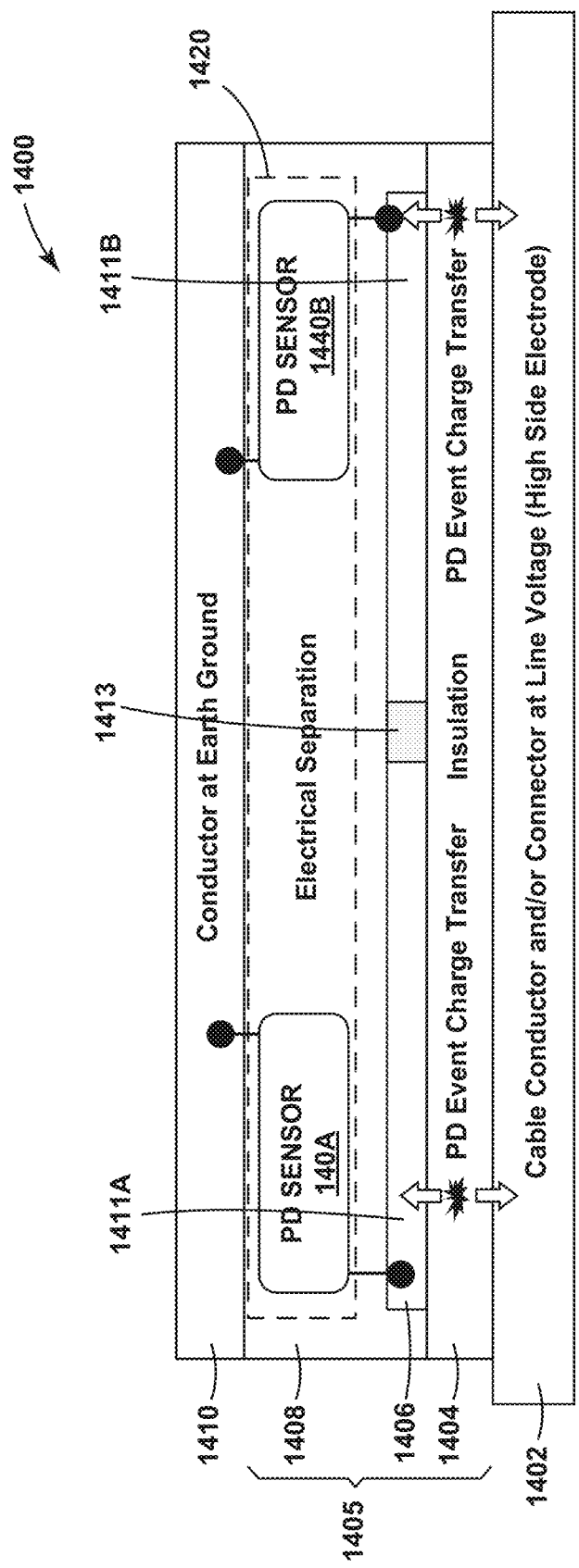

FIGS. 14A-14C are conceptual diagram illustrating an example cable accessory, in accordance with one or more aspects of this disclosure. Cable accessory 1400 may include a plurality of concentric layers. In the example of FIGS. 14, the plurality of concentric layers may include connector 1402, insulator 1404, low side electrode 1406, separator 1408, and ground conductor 1410. Insulator 1404, low side electrode 1406, and separator 1408 may form a splice body. Connector 1402, insulator 1404, low side electrode 1406, separator 1408, and ground conductor 1410 may be examples of connector 702, insulator 704, low side electrode 706, separator 708, and ground conductor 710 of FIG. 7, respectively, such that a description of the respective layers is omitted here for brevity.

Low side electrode 1406 may include a plurality of regions. In the example of FIG. 14A, low side electrode 1406 includes a high resistance region 1412 and a plurality of low resistance regions 1411A and 1411B (collectively, high resistance regions 1411), wherein each of the low resistance regions effectively act as separate low side electrode portions 1406A, 1406B that can be monitored separately. Low resistance regions 1411 includes a semi-conductive or conductive material, such as a metal (e.g., copper or aluminum). High resistance regions 1412 may include materials such as a crosslinked polyethylene or EPR material.

In the example of FIG. 14A, high resistance region 1412 may concentrically surround insulator 1404 and may be disposed between insulator 1404 and low resistance regions 1411. In other words, a radius from a central axis of splice body 1405 to high resistance region 1412 may be smaller than a radius from the central axis of splice body 1405 to low resistance regions 1411. Stated another way, low resistance regions 1411 may be stacked on high resistance regions 1412.

As illustrated in FIG. 14B, the circumference of low resistance regions 1411 and high resistance regions 1412 may be approximately the same. Stated another way, the radius from a central axis of splice body 1405 to high resistance region 1412 may be approximately equal to the radius from the central axis of splice body 1405 to low resistance regions 1411.

In the example of FIG. 14C, low side electrode 1406 includes a plurality of low resistance regions 1411 separated by a high impedance region 1413. High impedance region 1413 may include a dielectric material. The circumference of low resistance regions 1411 and high impedance regions 1413 may be at approximately the same. Stated another way, the radius from a central axis of splice body 1405 to high impedance region 1413 may be approximately equal to the radius from the central axis of splice body 1405 to low resistance regions 1411.

In some scenarios, low resistance regions 1411 are circumferential rings. In another scenario, low resistance regions 1411 are longitudinal stripes. In some examples, low resistance regions 141 enhance lateral conduction in a local area.

Cable accessory 1400 may include a monitoring device 1420 that includes a plurality of partial discharge sensors 1440A-1440B (collectively, partial discharge sensors 1440). Monitoring device 1420 may be an example of monitoring device 720 of FIG. 7 and may include similar functionality, such that a description of monitoring device 1420 is omitted for brevity. Partial discharge sensors 1440 may be examples of partial discharge sensors 740, such that a description of partial discharge sensors 1440 is omitted for brevity.

In the example of FIGS. 14, each of partial discharge sensors 1440 is coupled to a different low resistance region of low resistance regions 1411. Partial discharge sensor 1440A is electrically coupled to ground conductor and one of the low resistance region 1411A while partial discharge sensor 1440B is electrically coupled to ground conductor 1410 and low resistance region 1411B. By utilizing separate low resistance regions 711 in this way, a monitoring device may determining the spatial distribution of the partial discharge events. In some examples, when low resistance regions 1411 are circumferential rings, the monitoring device may determine a longitudinal location of the partial discharge event. The monitoring device may determine the location of partial discharge events around the periphery when low resistance regions 1411 include longitudinal stripes. Low resistance regions 1411 may be any size or shape and may be positioned in numerous different arrangements.

Figure 15:
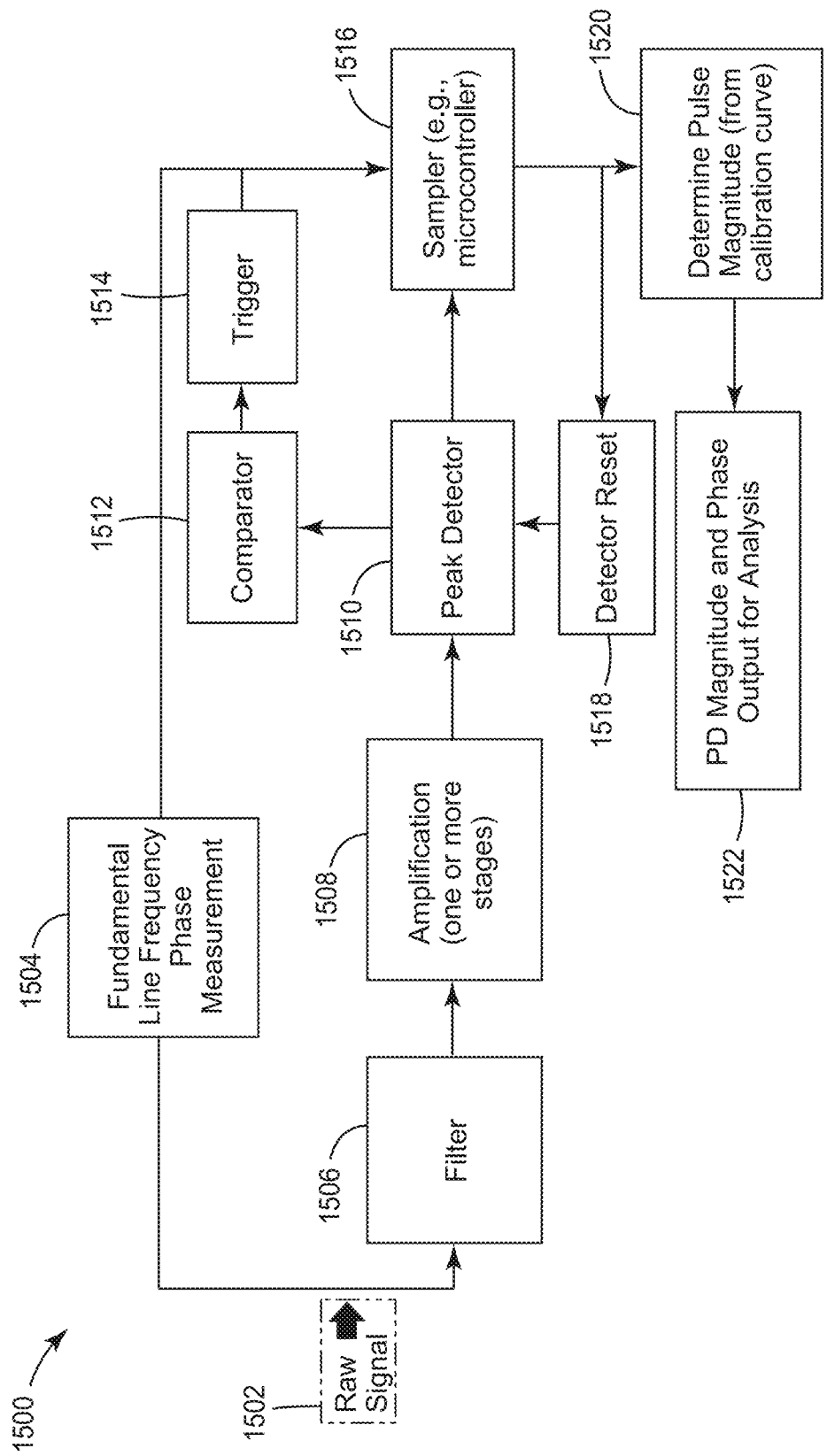
FIG. 15 is a block diagram illustrating an example partial discharge sensor, in accordance with one or more aspects of this disclosure.

FIG. 15 is a block diagram illustrating an example partial discharge sensor 1500, in accordance with one or more aspects of this disclosure. Partial discharge sensor 1500 may be an example of partial discharge sensors 740, 840, 940, 1040, 1140, 1240, or 1440 of FIGS. 7-14. In the example of FIG. 15, partial discharge sensor 1500 includes a voltage measurement circuit 1504, filter 1506, amplifier 1508, peak detector 1510, comparator 1512, trigger 1514, sampling circuit 1516, detector reset 1518, pulse magnitude detector 1520, and partial discharge output 1522. Partial discharge sensor 1500 may include fewer components or additional components not shown here.

Partial discharge sensor 1500 may detect an input signal (e.g., current or voltage) 1502 generated by a partial discharge event. Line measurement circuit 1504 may determine a phase of the fundamental line frequency of electrical power transmitted by a transmission line (e.g., transmission line 30) which the partial discharge sensor 1500 is monitoring. For example, line measurement circuit 1504 may include a zero crossing detector which can e.g. detect the time at which the line voltage crosses from negative to positive values, hereby set to be the point of zero line phase. As another example, circuit 1504 may detect a minimal or maximal point, or the negative going transition.

Filter 1506 may filter input signals 1502 for signals within a predetermined frequency range (e.g., frequencies corresponding to typical partial discharge events). Amplifier 1508 amplifies the signals output by filter 1506.

Peak detector 1510 detects the peak of the filtered signals. For example, peak detector 1510 may hold (e.g., via a capacitor) a signal at a peak value. In other words, as the value of the signal increases, the value of the signal held by peak detector 1510 may increase and when the value of the signal decreases, peak detector 1510 may hold the value of the signal at its peak or local maximum. Comparator 1512 may compare the local peak value of the signal to a threshold value. Trigger 1514 may cause sampler 1516 to sample the filtered input signal when comparator 1512 determines the peak value of the input signal satisfies the threshold value. In other words, comparator 1512 triggers the sampling circuit 1516 via trigger 1514. Trigger 1514 or sampling circuit 1516 may capture the time that has elapsed from the last line zero crossing to the triggered event. This time difference, divided by the fundamental line period (e.g. 20 msec for a 50 Hz line) then constitutes the phase value of the PD event. Responsive to sampling the filtered input signal, detector reset circuit 1518 may reset the value held by peak detector 1510.

Pulse magnitude detector 1520 may determine the magnitude of the sampled signal. In some examples, pulse magnitude detector 1520 may determine the magnitude of the sampled signal based on a calibration curve.

Output device 1522 may output partial discharge data indicative of the magnitude and/or phase of the sampled signal. For instance, output device 1522 may output the partial discharge data to one or more processors, which may, for example, determine a health of the cable accessory that includes partial discharge detector 1500 based at least in part on the partial discharge data generated by partial discharge sensor 1500.

Figure 16:
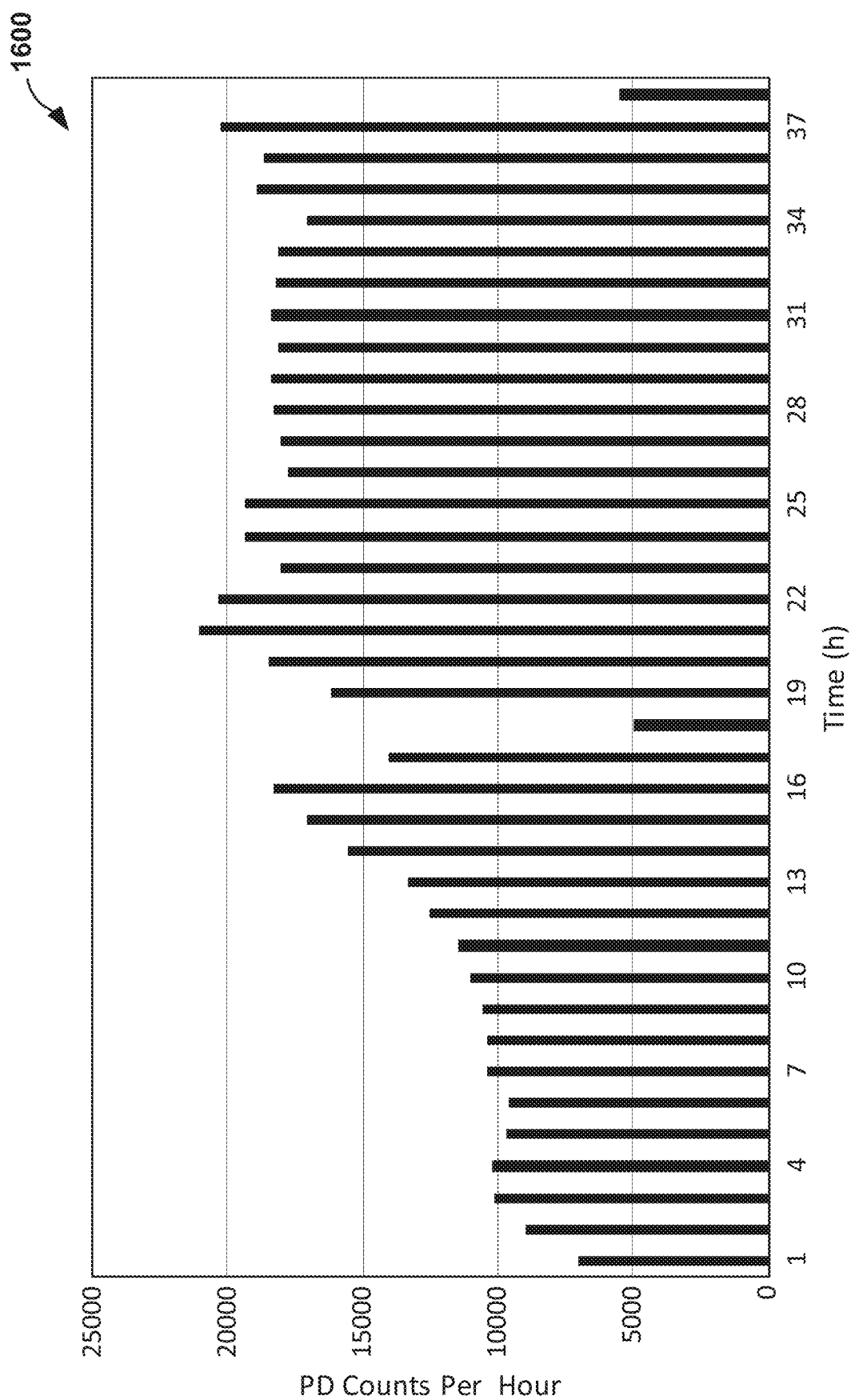
FIG. 16 is a graph illustrating example partial discharge events detected by a monitoring device and associated with a known failure event, in accordance with various techniques of this disclosure.

FIG. 16 is a graph illustrating example partial discharge events detected by a monitoring device and associated with a known failure event, in accordance with various techniques of this disclosure. FIG. 16 is described with reference to EEMS 6 as described in reference to FIGS. 1-2 and monitoring devices 33, 300, and 720 as described in reference to FIGS. 1, 3, and 7, respectively. For example, partial discharge sensors 740 of monitoring device 720 may detect partial discharge events over time. The x-axis of graph 1600 represents time and the y-axis of graph 1600 represents a quantity of partial discharge events per unit of time (e.g., per hour).

In some examples, a computing device (e.g., monitoring device 720 or EEMS 6) may train a model indicative of health of a cable accessory or electrical cable (e.g., historical and data models 74C of FIG. 2 and/or models 736 of FIG. 7A) based on the partial discharge data graphed in graph 1600 and known failure events. While graph 1600 illustrates partial discharge events detected by a single monitoring device for a single failure event, EEMS 6 or monitoring device 720 may receive event data indicating partial discharge events from a plurality of monitoring devices 720 that are each associated with respective failure events, and may train the model based at least in part on the event data from a plurality of monitoring devices. In other words, EEMS 6 and/or monitoring devices 720 (or any other computing device, such as gateway 28 of FIG. 1) may train the model based on known failure events associated with respective monitoring devices and the event data (e.g., including partial discharge data) from the respective monitoring devices.

For example, EEMS 6 or monitoring devices 720 may correlate known failure events to signal magnitude, inception voltage, phase angle of the discharge (e.g., power delivery), frequency content, among others. As another example, EEMS 6 or monitoring device 720 may correlate known failure events based groups or cluster of partial discharge events, time between partial discharge events or clusters of partial discharge events, quantity of discharge events per time, quantity of discharge events per phase angle, min or max inception voltage, or any other variable. In some scenarios, EEMS 6 or monitoring device 720 may determine an actual distribution of events at various respective phase angles, determine a normal distribution for events and phase angles, and correlate known failure events based on deviations of the actual distribution from the normal distribution. Further, EEMS 6 or monitoring device 720 may correlate known failure events to time dependent characteristics of the statistics described above.

Figure 17:
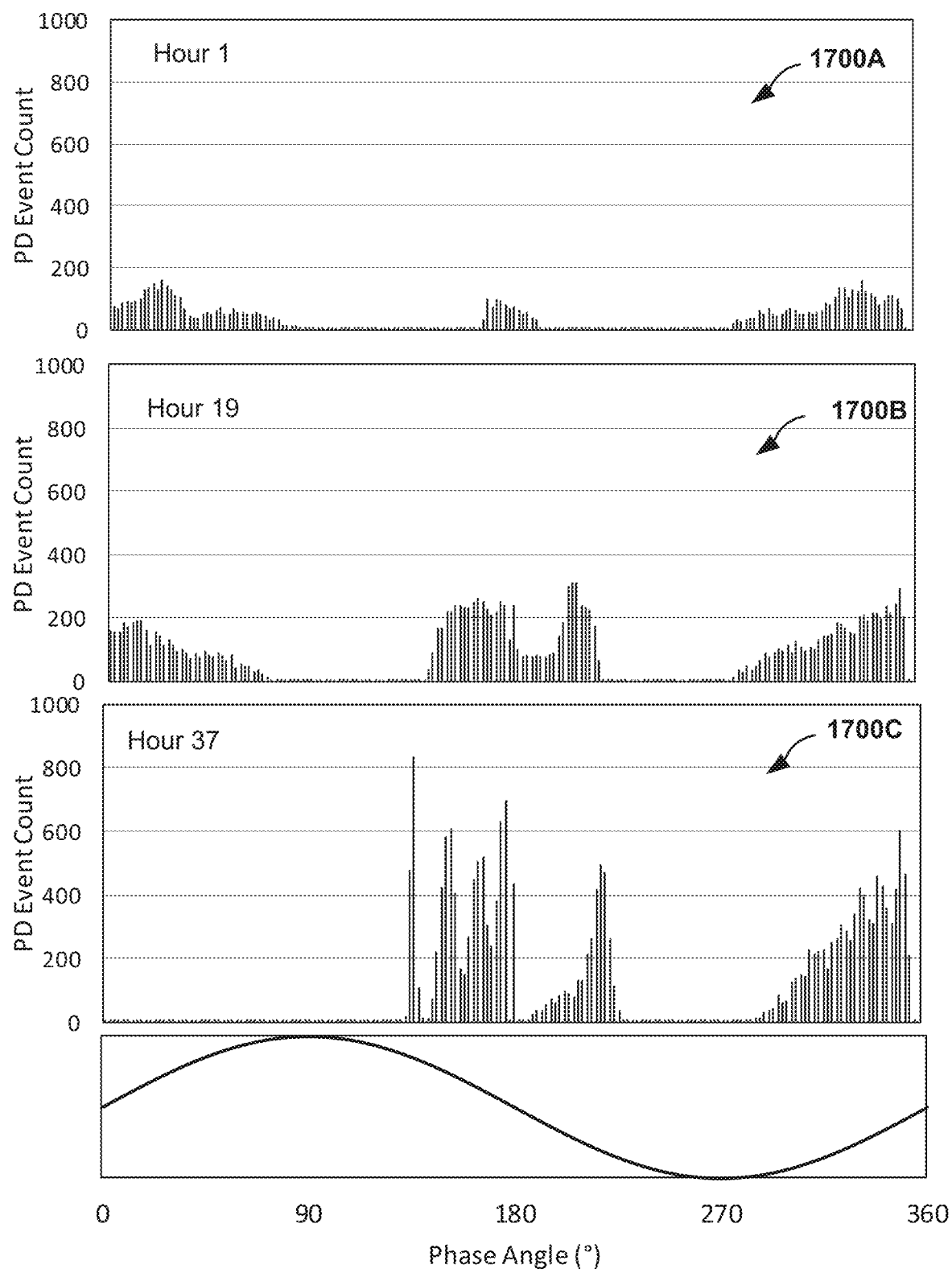
FIG. 17 includes graphs illustrating additional details of the partial discharge events graphed in FIG. 16, in accordance with various techniques of this disclosure.

FIG. 17 includes graphs illustrating additional details of the partial discharge events graphed in FIG. 16, in accordance with various techniques of this disclosure. The x-axis of graphs 1700A-1700C (collectively, graphs 1700) represents phase angle and the y-axis of graphs 1700A-1700C represents a quantity of partial discharge events at different phase angles. Graph 1700A illustrates the partial discharge events per phase angle at hour 1 of the data set shown in FIG. 16, graph 1700B illustrates the partial discharge events per phase angle at hour 19 of the data set shown in FIG. 16, and graph 1700C illustrates the partial discharge events per phase angle at hour 37 of the data set shown in FIG. 16.

As described above with reference to FIG. 16, a computing device (e.g., EEMS 6 and/or monitoring devices 720) may train a model indicative of health of a cable accessory or electrical cable (e.g., historical and data models 74C of FIG. 2 and/or models 736 of FIG. 3) based on the partial discharge data graphed in graphs 1700 and known failure events. For example, the EEMS 6 may correlate known failure events and a quantity of partial discharge events over time and phase angle.

In the present detailed description of the preferred embodiments, reference is made to the accompanying drawings, which illustrate specific embodiments in which the invention may be practiced. The illustrated embodiments are not intended to be exhaustive of all embodiments according to the invention. It is to be understood that other embodiments may be utilized and structural or logical changes may be made without departing from the scope of the present invention. The following detailed description, therefore, is not to be taken in a limiting sense, and the scope of the present invention is defined by the appended claims.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "proximate," "distal," "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above or on top of those other elements.

As used herein, when an element, component, or layer for example is described as forming a "coincident interface" with, or being "on," "connected to," "coupled with," "stacked on" or "in contact with" another element, component, or layer, it can be directly on, directly connected to, directly coupled with, directly stacked on, in direct contact with, or intervening elements, components or layers may be on, connected, coupled or in contact with the particular element, component, or layer, for example. When an element, component, or layer for example is referred to as being "directly on," "directly connected to," "directly coupled with," or "directly in contact with" another element, there are no intervening elements, components or layers for example. The techniques of this disclosure may be implemented in a wide variety of computer devices, such as servers, laptop computers, desktop computers, notebook computers, tablet computers, hand-held computers, smart phones, and the like. Any components, modules or units have been described to emphasize functional aspects and do not necessarily require realization by different hardware units. The techniques described herein may also be implemented in hardware, software, firmware, or any combination thereof. Any features described as modules, units or components may be implemented together in an integrated logic device or separately as discrete but interoperable logic devices. In some cases, various features may be implemented as an integrated circuit device, such as an integrated circuit chip or chipset. Additionally, although a number of distinct modules have been described throughout this description, many of which perform unique functions, all the functions of all of the modules may be combined into a single module, or even split into further additional modules. The modules described herein are only exemplary and have been described as such for better ease of understanding.

If implemented in software, the techniques may be realized at least in part by a computer-readable medium comprising instructions that, when executed in a processor, performs one or more of the methods described above. The computer-readable medium may comprise a tangible computer-readable storage medium and may form part of a computer program product, which may include packaging materials. The computer-readable storage medium may comprise random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The computer-readable storage medium may also comprise a non-volatile storage device, such as a hard-disk, magnetic tape, a compact disk (CD), digital versatile disk (DVD), Blu-ray disk, holographic data storage media, or other non-volatile storage device.

The term "processor," as used herein may refer to any of the foregoing structure or any other structure suitable for implementation of the techniques described herein. In addition, in some aspects, the functionality described herein may be provided within dedicated software modules or hardware modules configured for performing the techniques of this disclosure. Even if implemented in software, the techniques may use hardware such as a processor to execute the software, and a memory to store the software. In any such cases, the computers described herein may define a specific machine that is capable of executing the specific functions described herein. Also, the techniques could be fully implemented in one or more circuits or logic elements, which could also be considered a processor.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor", as used may refer to any of the foregoing structure or any other structure suitable for implementation of the techniques described. In addition, in some aspects, the functionality described may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

It is to be recognized that depending on the example, certain acts or events of any of the methods described herein can be performed in a different sequence, may be added, merged, or left out all together (e.g., not all described acts or events are necessary for the practice of the method). Moreover, in certain examples, acts or events may be performed concurrently, e.g., through multi-threaded processing, interrupt processing, or multiple processors, rather than sequentially.

In some examples, a computer-readable storage medium includes a non-transitory medium. The term "non-transitory" indicates, in some examples, that the storage medium is not embodied in a carrier wave or a propagated signal. In certain examples, a non-transitory storage medium stores data that can, over time, change (e.g., in RAM or cache).

What is claimed is:

1. A system comprising:
   a cable accessory including a partial discharge sensor, the partial discharge sensor configured to generate partial discharge sensor data that is indicative of one or more partial discharge events;
      wherein the cable accessory includes a splice body, the splice body comprising a plurality of concentric layers, the plurality of concentric layers including:
      a first layer configured to concentrically surround a central conductor of the electrical cable and comprising an insulating material;
      a second layer comprising a conducting material; and
      a third layer comprising a resistive material configured to resist electrical flow between the second layer and a ground conductor exterior to the third layer,
      wherein the second layer is disposed between the first layer and the third layer, and
      wherein the partial discharge sensor is electrically coupled to the second layer and is configured to detect partial discharge events occurring in the first layer by detecting current in the second layer;
   at least one processor; and
   a storage device comprising instructions that, when executed by the at least one processor, cause the at least one processor to:
      receive the partial discharge sensor data;
      determine, based at least in part on the partial discharge sensor data, a health of the cable accessory; and
      responsive to determining the health of the cable accessory, perform an operation.

2. The system of claim 1, wherein the second layer comprises a plurality of regions including a first region and a second region, wherein the first region includes a material having a relatively high resistance compared to a material of the second region, and wherein the partial discharge sensors is electrically coupled to the second region of the second layer, wherein the first region includes a dielectric.

3. The system of claim 1, wherein the cable accessory comprises a plurality of partial discharge sensors that include the partial discharge sensor,
   wherein execution of the instructions further cause the at least one processor to determine, based on data indicative of a particular partial discharge event from each of the plurality of partial discharge sensors, a location of the particular partial discharge event, and
   wherein the instructions cause the at least one processor to determine the health of the cable accessory based at least in part on the location of the particular partial discharge event.

4. The cable accessory of claim 3,
   wherein the data indicative of the particular partial discharge event includes a time at which each respective partial discharge sensor of the plurality of partial discharge sensors detected the particular partial discharge event, and
   wherein the instructions cause the at least one processor to determine the location of the particular partial discharge event based at least in part on the time at which each respective partial discharge sensor of the plurality of partial discharge sensors detected the particular partial discharge event.

5. The system of claim 3,
   wherein the data indicative of the particular partial discharge event includes data indicating a magnitude of the partial discharge event detected by each respective partial discharge sensor of the plurality of partial discharge sensors, and
   wherein the instructions cause the at least one processor to determine the location of the particular partial discharge event based at least in part on the magnitude of the partial discharge event detected by each respective partial discharge sensor of the plurality of partial discharge sensors.

6. The system of claim 3,
   wherein the instructions cause the at least one processor to determine the location of the particular partial discharge event by determining whether the particular partial discharge event occurred external to the cable accessory, at an interface of the cable accessory and an electrical cable, or internal to the cable accessory.

7. The system of claim 3,
   wherein the partial discharge sensor is a first partial discharge sensor,
   wherein the plurality of discharge sensors includes a second partial discharge sensor,
   wherein the second partial discharge sensor is configured to couple to an insulation shield of an electrical cable and a ground conductor.

8. The system of claim 1, wherein execution of the instructions causes the at least one processor to perform the operation by causing the at least one processor to output a notification indicating the health of the cable accessory.

9. The system of claim 1, wherein execution of the instructions causes the at least one processor to perform the operation by causing the at least one processor to output, for display, data representing a user interface indicative of the health of the cable accessory.

10. The system of claim 1, wherein execution of the instructions causes the at least one processor to perform the operation by causing the at least one processor to output a command.

11. The system of claim 1, wherein execution of the instructions causes the at least one processor to perform the operation by causing the at least one processor to schedule maintenance or replacement of the cable accessory.

12. The system of claim 1,
   wherein the instructions cause the at least one processor to determine the health of the cable accessory by predicting whether the cable accessory will fail within a predetermined amount of time, and
   wherein the data indicative of the health of the cable accessory includes data indicating whether the cable accessory will fail within the predetermined amount of time.

13. The system of claim 1, wherein the instructions cause the at least one processor to determine the health of the cable accessory by at least causing the at least one processor to apply a model to at least the data indicative of the partial discharge events to determine the heath of the cable accessory.

14. The system of claim 13, wherein the model is trained based at least in part on partial discharge data and historical data of known failure events from a plurality of cable accessories with one or more characteristics that correspond to one or more characteristics of the cable accessory, wherein the one or more characteristics of the cable accessory include one or more characteristics selected from a group consisting of:
   location of the cable accessory,
   manufacturer of the cable accessory,
   installer of the cable accessory, and
   type of the cable accessory.

15. The system of claim 13, wherein execution of the instructions causes the at least one processor to update the model based on the partial discharge sensor data from the cable accessory.

16. The system of claim 1, wherein the cable accessory includes a communications unit configured to output the partial discharge sensor data, wherein the communications unit is configured to output the partial discharge sensor data via the electrical cable using power line communications.

17. The system of claim 1, wherein the cable accessory includes a power harvesting circuit configured to harvest electrical power from the electrical cable.

18. The system of claim 1, wherein the cable accessory includes the storage device and the at least one processor.

19. The system of claim 1, further comprising a communications unit separate from the cable accessory, the communications unit configured to receive partial discharge sensor data from a plurality of articles of electrical equipment that include the cable accessory, wherein the communications unit includes the storage device and the at least one processor.

* * * * *